(12) United States Patent
Onuki et al.

(10) Patent No.: US 12,426,313 B2
(45) Date of Patent: Sep. 23, 2025

(54) SEMICONDUCTOR DEVICE

(71) Applicant: SEMICONDUCTOR ENERGY LABORATORY CO., LTD., Atsugi (JP)

(72) Inventors: Tatsuya Onuki, Kanagawa (JP); Munehiro Kozuma, Kanagawa (JP); Takeshi Aoki, Kanagawa (JP); Takanori Matsuzaki, Kanagawa (JP); Yuki Okamoto, Kanagawa (JP); Masashi Oota, Kanagawa (JP); Shuhei Nagatsuka, Kanagawa (JP); Hitoshi Kunitake, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 709 days.

(21) Appl. No.: 17/788,050

(22) PCT Filed: Dec. 14, 2020

(86) PCT No.: PCT/IB2020/061872
§ 371 (c)(1),
(2) Date: Jun. 22, 2022

(87) PCT Pub. No.: WO2021/130591
PCT Pub. Date: Jul. 1, 2021

(65) Prior Publication Data
US 2023/0040508 A1 Feb. 9, 2023

(30) Foreign Application Priority Data

Dec. 27, 2019 (JP) .................................. 2019-238710
Jan. 16, 2020 (JP) .................................. 2020-005295
Oct. 6, 2020 (JP) .................................. 2020-169003

(51) Int. Cl.
H10D 30/67 (2025.01)
G06N 3/02 (2006.01)

(52) U.S. Cl.
CPC ........... *H10D 30/6756* (2025.01); *G06N 3/02* (2013.01); *H10D 30/673* (2025.01)

(58) Field of Classification Search
None
See application file for complete search history.

(56) References Cited

U.S. PATENT DOCUMENTS 8,649,208 B2    2/2014   Matsuzaki et al.
8,705,292 B2    4/2014   Fujita
(Continued)

FOREIGN PATENT DOCUMENTS

JP    2008-147340 A    6/2008
JP    2019-033233 A    2/2019
(Continued)

OTHER PUBLICATIONS

International Search Report (Application No. PCT/IB2020/061872) Dated Mar. 30, 2021.
(Continued)

*Primary Examiner* — David R Vincent
(74) *Attorney, Agent, or Firm* — Nixon Peabody LLP; Jeffrey L. Costellia

(57) ABSTRACT

To provide a semiconductor device with a novel structure. The semiconductor device includes an accelerator. The accelerator includes a first memory circuit, a second memory circuit, and an arithmetic circuit. The first memory circuit includes a first transistor. The second memory circuit includes a second transistor. Each of the first transistor and the second transistor includes a semiconductor layer including a metal oxide in a channel formation region. The arithmetic circuit includes a third transistor. The third tran- (Continued)

sistor includes a semiconductor layer including silicon in a channel formation region. The first transistor and the second transistor are provided in different layers. The layer including the first transistor is provided over a layer including the third transistor. The layer including the second transistor is provided over the layer including the first transistor. The data retention characteristics of the first memory circuit are different from those of the second memory circuit.

13 Claims, 32 Drawing Sheets

(56) References Cited

U.S. PATENT DOCUMENTS

| | | | |
|---|---|---|---|
| 8,773,173 | B2 | 7/2014 | Watanabe |
| 8,837,203 | B2 | 9/2014 | Shionoiri et al. |
| 8,929,161 | B2 | 1/2015 | Matsuzaki |
| 8,934,299 | B2 | 1/2015 | Ikeda |
| 8,994,430 | B2 | 3/2015 | Shionoiri |
| 9,172,369 | B2 | 10/2015 | Okamoto et al. |
| 9,225,329 | B2 | 12/2015 | Kozuma et al. |
| 9,372,694 | B2 | 6/2016 | Yoneda |
| 9,406,348 | B2 | 8/2016 | Maehashi |
| 9,437,273 | B2 | 9/2016 | Yamazaki et al. |
| 9,507,366 | B2 | 11/2016 | Takahashi et al. |
| 9,786,350 | B2 | 10/2017 | Ohmaru |
| 9,804,645 | B2 | 10/2017 | Koyama et al. |
| 9,837,157 | B2 | 12/2017 | Tamura |
| 9,852,023 | B2 | 12/2017 | Tsutsui |
| 10,236,884 | B2 | 3/2019 | Ishizu et al. |
| 10,490,142 | B2 | 11/2019 | Kobayashi et al. |
| 10,685,614 | B2 | 6/2020 | Mori et al. |
| 10,796,221 | B2 | 10/2020 | Zhang et al. |
| 11,139,298 | B2 | 10/2021 | Harada et al. |
| 11,296,231 | B2 | 4/2022 | Endo et al. |
| 11,302,726 | B2 | 4/2022 | Kobayashi et al. |
| 11,314,484 | B2 | 4/2022 | Kozuma et al. |
| 2008/0135942 | A1 | 6/2008 | Minagawa |
| 2014/0118378 | A1 | 5/2014 | Koyama et al. |
| 2021/0226063 | A1* | 7/2021 | Yamazaki .......... H10D 30/6734 |
| 2022/0343954 | A1 | 10/2022 | Aoki et al. |

FOREIGN PATENT DOCUMENTS

| | | |
|---|---|---|
| JP | 2019-036280 A | 3/2019 |
| JP | 2019-046199 A | 3/2019 |
| JP | 2019-047006 A | 3/2019 |
| JP | 2019-153655 A | 9/2019 |
| KR | 2020-0038941 A | 4/2020 |
| WO | WO-2019/038664 | 2/2019 |
| WO | WO-2019/078924 | 4/2019 |

OTHER PUBLICATIONS

Written Opinion (Application No. PCT/IB2020/061872) Dated Mar. 30, 2021.

* cited by examiner

FIG. 26A
| Amorphous | Crystalline | Crystal |
|---|---|---|
| completely amorphous | •CAAC<br>•nc<br>•CAC | •single crystal<br>•poly crystal |
FIG. 26B
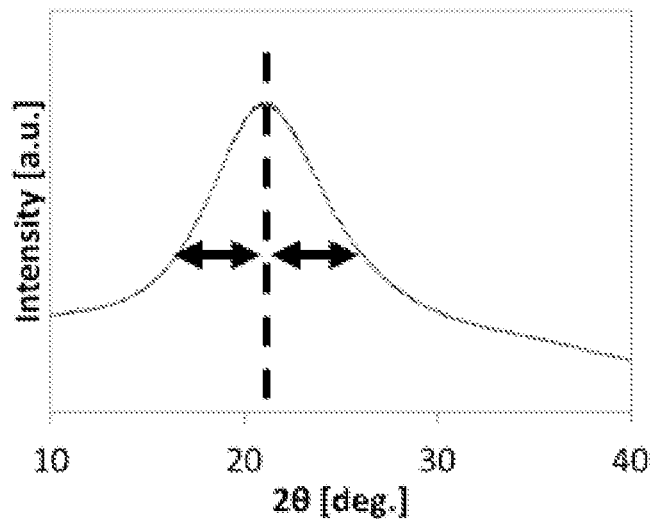
FIG. 26C
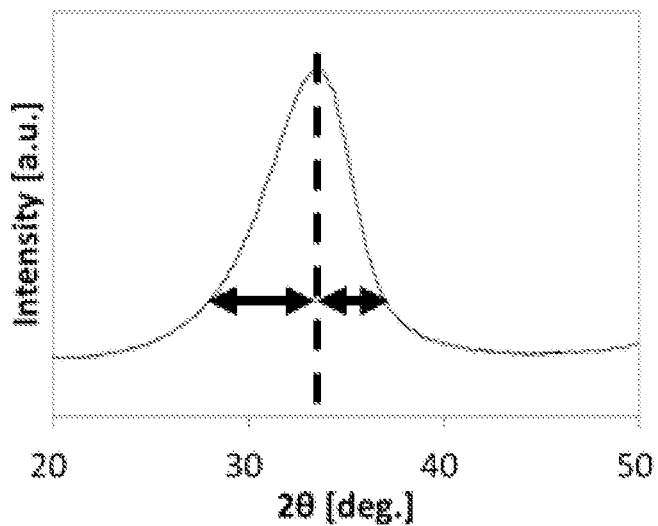

SEMICONDUCTOR DEVICE

TECHNICAL FIELD

In this specification, a semiconductor device and the like are described.

Note that one embodiment of the present invention is not limited to the above technical field. Examples of the technical field of one embodiment of the present invention disclosed in this specification and the like include a semiconductor device, an imaging device, a display device, a light-emitting device, a power storage device, a storage device, a display system, an electronic device, a lighting device, an input device, an input/output device, a driving method thereof, and a manufacturing method thereof.

BACKGROUND ART

Electronic devices each including a semiconductor device including a CPU (Central Processing Unit) or the like have been widely used. In such electronic devices, techniques for improving the performance of the semiconductor devices have been actively developed to process a large volume of data at high speed. As a technique for achieving high performance, what is called an SoC (System on Chip) is given in which an accelerator such as a GPU (Graphics Processing Unit) and a CPU are tightly coupled. In the semiconductor device having higher performance by adopting an SoC, heat generation and an increase in power consumption become problems.

AI (Artificial Intelligence) technology requires a large amount of calculation and a large number of parameters and thus the amount of arithmetic operations is increased. An increase in the amount of arithmetic operations causes heat generation and an increase in power consumption. Thus, architectures for reducing the amount of arithmetic operations have been actively proposed. Typical architectures are Binary Neural Network (BNN) and Ternary Neural Network (TNN), which are effective especially in reducing circuit scale and power consumption (see Patent Document 1, for example). For example, in BNN, data that is originally expressed with 32-bit or 16-bit precision is compressed to binary data of "+1" or "−1", whereby the amount of calculation and the number of parameters can be greatly reduced. BNN is effective in reducing circuit scale and power consumption and thus thought to be compatible with applications that are required to have low power consumption in limited hardware resources such as an embedded chip.

REFERENCE

Patent Document

[Patent Document 1] PCT International Publication No. 2019/078924

SUMMARY OF THE INVENTION

Problems to be Solved by the Invention

In the case where arithmetic processing of AI technology is performed with an accelerator, weight data used for arithmetic operation is transmitted at high speed to the accelerator, such as a DRAM or an SRAM, from a chip formed in a process different from that of the accelerator. To reduce data transfer frequency, the accelerator needs large storage capacity for retaining weight data or intermediate data. When the accelerator has small storage capacity, high-speed data transmission is necessary, and when a chip that stores weight data is distant from the accelerator, parasitic capacitance or resistance in a wiring is large, which might increase power consumption.

An object of one embodiment of the present invention is to reduce power consumption of a semiconductor device including an accelerator. Another object of one embodiment of the present invention is to inhibit heat generation of a semiconductor device including an accelerator. Another object of one embodiment of the present invention is to reduce the size of a semiconductor device including an accelerator. Another object of one embodiment of the present invention is to reduce the number of times of data transfer between a CPU and a semiconductor device functioning as a memory in a semiconductor device including an accelerator. Another object of one embodiment of the present invention is to improve the data transfer speed between a storage memory and a semiconductor device functioning as a cache memory in a semiconductor device including an accelerator. Another object is to provide a semiconductor device with a novel structure.

One embodiment of the present invention does not necessarily achieve all the above objects and only needs to achieve at least one of the objects. The descriptions of the above objects do not preclude the existence of other objects. Objects other than these objects will be apparent from the descriptions of the specification, the claims, the drawings, and the like, and objects other than these objects can be derived from the descriptions of the specification, the claims, the drawings, and the like.

Means for Solving the Problems

One embodiment of the present invention is a semiconductor device including a CPU and an accelerator. The accelerator includes a first memory circuit, a second memory circuit, and an arithmetic circuit. The first memory circuit includes a first transistor. The second memory circuit includes a second transistor. Each of the first transistor and the second transistor includes a semiconductor layer including a metal oxide in a channel formation region. The arithmetic circuit includes a third transistor. The third transistor includes a semiconductor layer including silicon in a channel formation region. The CPU includes a CPU core including a flip-flop provided with a backup circuit. The backup circuit includes a fourth transistor. The fourth transistor includes a semiconductor layer including a metal oxide in a channel formation region. The first transistor and the second transistor are provided in different layers. The layer including the first transistor and the layer including the second transistor are provided over a layer including the third transistor.

In one embodiment of the present invention, the backup circuit preferably has a function of retaining data stored in the flip-flop in a state where supply of a power supply voltage is stopped at the time of power gating of the CPU.

In one embodiment of the present invention, the first memory circuit and the second memory circuit preferably have a function of retaining data input to the arithmetic circuit.

In one embodiment of the present invention, a circuit configuration of the second memory circuit is preferably different from a circuit configuration of the first memory circuit.

One embodiment of the present invention is a semiconductor device including a CPU and an accelerator. The accelerator includes a first memory circuit, a second memory circuit, and an arithmetic circuit. The first memory circuit includes a first transistor. The second memory circuit includes a second transistor. Each of the first transistor and the second transistor includes a semiconductor layer including a metal oxide in a channel formation region. The arithmetic circuit includes a third transistor. The third transistor includes a semiconductor layer including silicon in a channel formation region. The first transistor and the second transistor are provided in different layers. The layer including the first transistor is provided over a layer including the third transistor. The layer including the second transistor is provided over the layer including the first transistor. The data retention characteristics of the first memory circuit are different from the data retention characteristics of the second memory circuit.

In the semiconductor device of one embodiment of the present invention, the first memory circuit preferably has a function of retaining data input to the arithmetic circuit or data output from the arithmetic circuit.

In one embodiment of the present invention, an amplitude voltage for driving the first transistor is preferably lower than an amplitude voltage for driving the second transistor.

In one embodiment of the present invention, the thickness of a gate insulating film of the first transistor is preferably smaller than the thickness of a gate insulating film of the second transistor.

In one embodiment of the present invention, a circuit configuration of the second memory circuit is preferably different from a circuit configuration of the first memory circuit.

In one embodiment of the present invention, the arithmetic circuit preferably performs product-sum operation.

In one embodiment of the present invention, the metal oxide preferably contains In, Ga, and Zn.

Note that other embodiments of the present invention will be shown in the description of the following embodiments and the drawings.

Effect of the Invention

One embodiment of the present invention can reduce power consumption of a semiconductor device including an accelerator. One embodiment of the present invention can inhibit heat generation of a semiconductor device including an accelerator. One embodiment of the present invention can reduce the size of a semiconductor device including an accelerator. One embodiment of the present invention can reduce the number of times of data transfer between a CPU and a semiconductor device functioning as a memory in a semiconductor device including an accelerator. One embodiment of the present invention can improve the data transfer speed between a storage memory and a semiconductor device functioning as a cache memory in a semiconductor device including an accelerator. A semiconductor device with a novel structure can be provided.

The description of a plurality of effects does not disturb the existence of other effects. In addition, one embodiment of the present invention does not necessarily achieve all the effects described as examples. In one embodiment of the present invention, other objects, effects, and novel features are apparent from the description of this specification and the drawings.

BRIEF DESCRIPTION OF THE DRAWINGS

FIG. 26A is a table showing classifications of crystal structures of IGZO. FIG. 26B is a graph showing an XRD spectrum of quartz glass. FIG. 26C is a graph showing an XRD spectrum of crystalline IGZO.

MODE FOR CARRYING OUT THE INVENTION

Figure 1A:
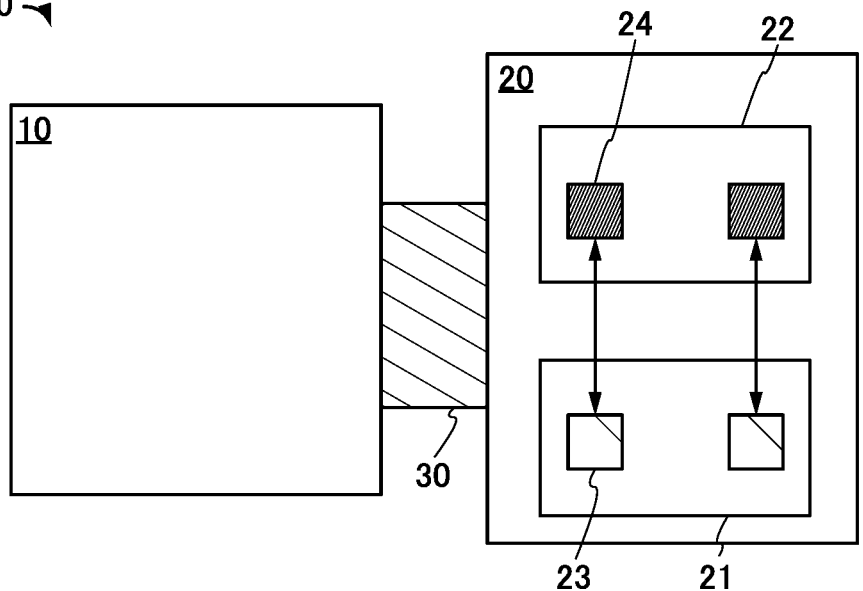
FIG. 1A and FIG. 1B are diagrams illustrating a structure example of a semiconductor device.

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the terms do not limit the number of components. Furthermore, the ordinal numbers do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

The same components, components having similar functions, components made of the same material, components formed at the same time, and the like in the drawings are denoted by the same reference numerals, and repeated description thereof is skipped in some cases.

In this specification, for example, a power supply potential VDD may be abbreviated to a potential VDD, VDD, or the like. The same applies to other components (e.g., a signal, a voltage, a circuit, an element, an electrode, and a wiring).

In the case where a plurality of components are denoted by the same reference numerals, and, particularly when they need to be distinguished from each other, an identification sign such as "_1", "_2", "[n]", or "[m,n]" is sometimes added to the reference numerals. For example, a second wiring GL is referred to as a wiring GL[2].

Embodiment 1

Structures, operations, and the like of semiconductor devices of embodiments of the present invention will be described.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be sometimes said that a display device (e.g., a liquid crystal display device and a light-emitting display device), a projection device, a lighting device, an electro-optical device, a power storage device, a storage device, a semiconductor circuit, an imaging device, an electronic appliance, and the like include a semiconductor device.

Figure 1B:
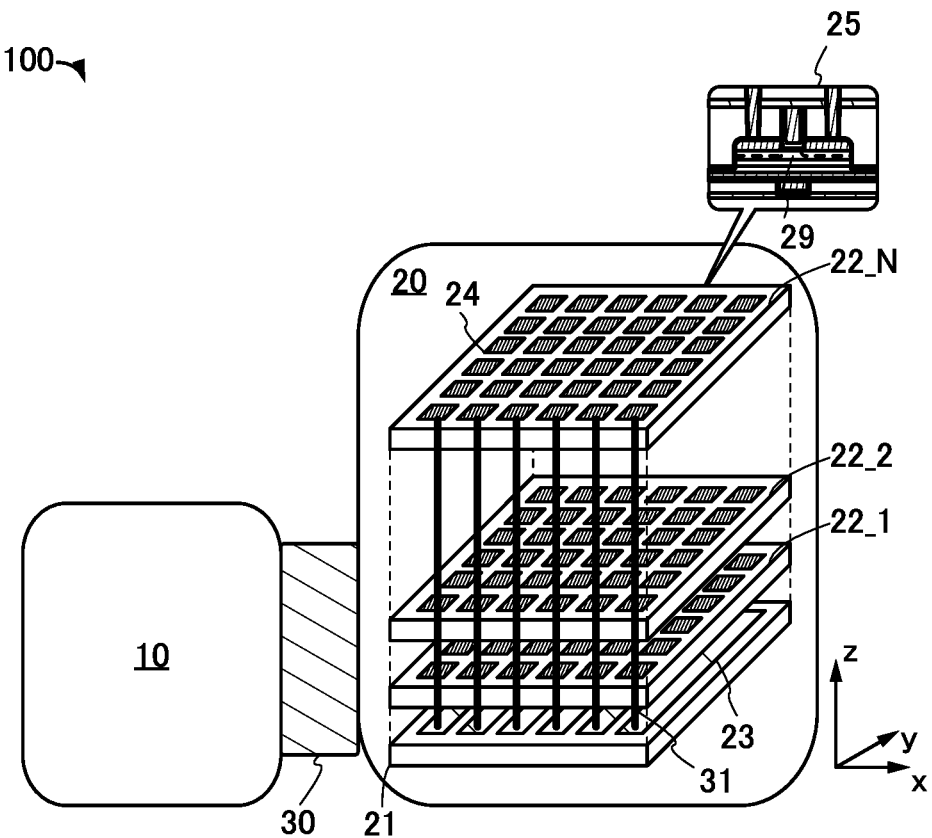

FIG. 1A and FIG. 1B are diagrams illustrating a semiconductor device 100 of one embodiment of the present invention. The semiconductor device 100 includes a CPU 10, an accelerator 20, and a bus 30. The accelerator 20 includes an arithmetic processing unit 21 and a memory unit 22. The arithmetic processing unit 21 includes an arithmetic circuit 23. The memory unit 22 includes a memory circuit 24. The memory unit 22 is referred to as a device memory or a shared memory in some cases. The memory circuit 24 includes a transistor 25 including a semiconductor layer 29 including a channel formation region. The arithmetic circuit 23 and the memory circuit 24 are electrically connected to each other through a wiring 31.

The CPU 10 has a function of performing general-purpose processing such as execution of an operating system, control of data, and execution of various arithmetic operations and programs. The CPU 10 includes one or a plurality of CPU cores. The CPU 10 includes, for example, a transistor including silicon in its channel formation region (a Si transistor). When complementary Si transistors are used, a CMOS circuit (a Si CMOS) can be formed. The CPU 10 is connected to the accelerator 20 through the bus 30.

Each CPU core preferably includes a data retention circuit capable of retaining data even when supply of a power supply voltage is stopped. With this structure, the supply of power supply voltage can be controlled by electric isolation by a power switch or the like from a power domain. Note that power supply voltage is referred to as driving voltage in some cases. As the data retention circuit, for example, a memory including a transistor (an OS transistor) containing an oxide semiconductor in a channel formation region is suitable. The structure of the CPU core including the data retention circuit including the OS transistor is described in Embodiment 3.

The accelerator 20 has a function of executing a program (also referred to as kernel or a kernel program) called from a host program. The accelerator 20 can perform parallel processing of a matrix operation in graphics processing, parallel processing of a product-sum operation of a neural network, and parallel processing of a floating-point operation in a scientific computation, for example.

The memory unit 22 has a function of storing data to be processed by the accelerator 20. Specifically, the memory unit 22 can store data, such as weight data used for parallel processing of a product-sum operation of a neural network, input to or output from the arithmetic processing unit 21.

The memory unit 22 is provided across a plurality of memory circuit layers 22_1 to 22_N (N is a natural number of 2 or larger). Each of the plurality of memory circuit layers 22_1 to 22_N includes memory circuits 24. The memory circuit 24 included in each of the memory circuit layers 22_1 to 22_N is electrically connected to the arithmetic circuit 23 included in the arithmetic processing unit 21 through the wiring 31 and has a function of retaining a binary or ternary digital value. In the memory circuit 24, the semiconductor layer 29 in the transistor 25 is an oxide semiconductor. That is, the transistor 25 is an OS transistor. A memory including an OS transistor (hereinafter also referred to as an OS memory) is suitable for the memory circuit 24.

A metal oxide has a band gap of 2.5 eV or wider; thus, an OS transistor has an extremely low off-state current. For example, the off-state current per micrometer in channel width at a source-drain voltage of 3.5 V and room temperature (25° C.) can be lower than $1 \times 10^{-20}$ A, lower than $1 \times 10^{-22}$ A, or lower than $1 \times 10^{-24}$ A. That is, the on/off ratio of drain current can be greater than or equal to 20 digits and less than or equal to 150 digits. Therefore, in an OS memory, the amount of electric charge that leaks from a retention node through the OS transistor is extremely small. Accordingly, the OS memory can function as a nonvolatile memory circuit, and power gating of the accelerator is enabled.

A highly integrated semiconductor device generates heat due to circuit drive in some cases. This heat makes the temperature of a transistor rise to change the characteristics of the transistor, and the field-effect mobility thereof might change or the operation frequency thereof might decrease, for example. Since an OS transistor has a higher heat resistance than a Si transistor, the field-effect mobility is less likely to change and the operation frequency is less likely to decrease due to a temperature change. Even when the temperature becomes high, an OS transistor is likely to keep a property of the drain current increasing exponentially with respect to a gate-source voltage. Thus, the use of an OS transistor enables stable operation in a high-temperature environment.

A metal oxide used for an OS transistor is Zn oxide, Zn—Sn oxide, Ga—Sn oxide, In—Ga oxide, In—Zn oxide, In-M-Zn oxide (M is Ti, Ga, Y, Zr, La, Ce, Nd, Sn, or Hf), or the like. The use of a metal oxide containing Ga as M for the OS transistor is particularly preferable because the electrical characteristics such as field-effect mobility of the transistor can be made excellent by adjusting a ratio of elements. In addition, an oxide containing indium and zinc may contain one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

In order to improve the reliability and electrical characteristics of the OS transistor, it is preferable that the metal oxide used in the semiconductor layer is a metal oxide having a crystal portion such as CAAC-OS, CAC-OS, or nc-OS. CAAC-OS is an abbreviation for c-axis-aligned crystalline oxide semiconductor. CAC-OS is an abbreviation for Cloud-Aligned Composite oxide semiconductor. In addition, nc-OS is an abbreviation for nanocrystalline oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The CAC-OS has a function of allowing electrons (or holes) serving as carriers to flow and a function of not allowing electrons serving as carriers to flow. The function of allowing electrons to flow and the function of not allowing electrons to flow are separated, whereby both functions can be heightened to the maximum. In other words, when CAC-OS is used for a channel formation region of an OS transistor, a high on-state current and an extremely low off-state current can be both achieved.

Avalanche breakdown or the like is less likely to occur in some cases in an OS transistor than in a general Si transistor because, for example, a metal oxide has a wide band gap and thus electrons are less likely to be excited, and the effective mass of a hole is large. Therefore, for example, it may be possible to inhibit hot-carrier degradation or the like that is caused by avalanche breakdown. Since hot-carrier degradation can be inhibited, an OS transistor can be driven with a high drain voltage.

An OS transistor is an accumulation transistor in which electrons are majority carriers. Therefore, DIBL (Drain-Induced Barrier Lowering), which is one of short-channel effects, affects an OS transistor less than an inversion transistor having a pn junction (typically a Si transistor).

In other words, an OS transistor has higher resistance against short channel effects than a Si transistor.

Owing to its high resistance against short channel effects, an OS transistor can have a reduced channel length without deterioration in reliability, which means that the use of an OS transistor can increase the degree of integration in a circuit. Although a reduction in channel length enhances a drain electric field, avalanche breakdown is less likely to occur in an OS transistor than in a Si transistor as described above.

Since an OS transistor has a high resistance against short-channel effects, a gate insulating film can be made thicker than that of a Si transistor. For example, even in a minute OS transistor whose channel length and channel width are less than or equal to 50 nm, a gate insulating film as thick as approximately 10 nm can be provided in some cases. When the gate insulating film is made thick, parasitic capacitance can be reduced and thus the operating speed of a circuit can be improved. In addition, when the gate insulating film is made thick, leakage current through the gate insulating film is reduced, resulting in a reduction in static current consumption.

As described above, the accelerator 20 can retain data owing to the memory circuit 24 that is an OS memory even when supply of a power supply voltage is stopped. Thus, the power gating of the accelerator 20 is possible and power consumption can be reduced greatly.

The memory circuit 24 formed using an OS transistor can be stacked over the arithmetic circuit 23 that can be formed using a Si CMOS. That is, the plurality of memory circuit layers 22_1 to 22_N are provided over a substrate provided with the arithmetic processing unit 21. The plurality of memory circuit layers 22_1 to 22_N can be stacked. Therefore, the memory circuit layers can be provided without an increase in circuit area and the storage capacity needed for the arithmetic processing in the accelerator 20 can be increased. The number of transfer times of data needed for the arithmetic processing can be reduced, leading to a reduction in power consumption. The memory circuit layers 22_1 to 22_N each including the plurality of memory circuits 24 are electrically connected to the arithmetic circuit 23 through the wiring 31 extended in a direction substantially perpendicular to a surface of a substrate provided with the arithmetic circuit 23 (a direction perpendicular to the xy plane in FIG. 1B). Note that "substantially perpendicular" refers to a state where an arrangement angle is greater than or equal to 85° and less than or equal to 95°.

Although an OS transistor is used as a transistor included in the memory circuit 24 in the description, there is no limitation on the transistor as long as the transistor can be stacked over a Si transistor included in the arithmetic circuit 23 below the memory circuit 24. For example, by bonding technique or the like, a Si transistor stacked over a substrate including a Si transistor can be used as a transistor in an upper layer. In that case, the Si transistor provided in the upper layer preferably has a longer channel length than the Si transistor in a lower layer so as to be a transistor with low off-state current.

For the memory circuit 24 included in the accelerator 20, a stacked layer structure like the plurality of memory circuit layers 22_1 to 22_N or a single layer structure may be employed. The memory circuit layer 22_1, which is a single layer including an OS transistor can be stacked over the arithmetic circuit 23 that can be formed using a Si CMOS. Thus, when the physical distance between the arithmetic circuit 23 and the memory circuit 24 is decreased, a wiring distance can be shortened, parasitic capacitance generated in a signal line can be reduced, and low power consumption can be achieved.

The accelerator 20 having a stacked structure of transistors can prevent an increase in circuit area; thus, the number of arithmetic circuits 23 can be increased. The number of circuits (the number of cores) performing arithmetic operation in the arithmetic circuit 23 can be increased; thus, the frequency of a signal for driving the arithmetic circuit 23 can be lowered. In addition, power supply voltage for driving the arithmetic circuit 23 can be low. As a result, power consumption for arithmetic operation can be reduced to several tenths.

The memory circuit 24 can have a circuit structure of a NOSRAM. "NOSRAM (registered trademark)" is an abbreviation for "Nonvolatile Oxide Semiconductor RAM". A NOSRAM is a memory in which its memory cell is a 2-transistor (2T) or 3-transistor (3T) gain cell, and its access transistor is an OS transistor. With use of OS transistors, the memory circuits 24 in the memory circuit layers 22_1 to 22_N can be stacked. An OS transistor has an extremely low current that flows between a source and a drain in an off state, that is, leakage current. The NOSRAM can be used as a nonvolatile memory by retaining electric charge corresponding to data in the memory circuit, using characteristics of an extremely low leakage current. In particular, the NOSRAM is capable of reading out retained data without destruction (non-destructive reading), and thus is suitable for parallel processing of a product-sum operation of a neural network in which only data reading operation is repeated many times.

The arithmetic processing unit 21 has a function of performing arithmetic processing using a digital value. The digital value is unlikely to be affected by noise. Thus, the accelerator 20 is suitable for performing arithmetic processing that requires a highly accurate arithmetic result. Note that the arithmetic processing unit 21 is preferably formed using a Si CMOS, i.e., a transistor containing silicon in a channel formation region (Si transistor). With this structure, an OS transistor can be stacked.

The arithmetic circuit 23 have a function of performing any one of an integer arithmetic operation, a single precision floating-point arithmetic operation, a double precision floating-point arithmetic operation, and the like using data of the digital value retained in each memory circuit 24 of the plurality of memory circuit layers 22_1 to 22_N. The arithmetic circuit 23 has a function of repeating the same processing such as a product-sum operation.

Note that the arithmetic circuits 23 employ such a structure that one arithmetic circuit 23 is provided for every read bit line of the memory circuit 24, i.e., for every one column (Column-Parallel Calculation). With this structure, data of one row (all bit lines at the maximum) of the memory circuit 24 can be subjected to arithmetic processing in parallel. As compared to a product-sum operation using the CPU 10, there is no limitation on the data bus size (e.g., 32 bits) between the CPU and the memory, and thus the parallelism of arithmetic operation can be greatly increased in Column-Parallel Calculation. Accordingly, an arithmetic efficiency regarding an enormous amount of arithmetic processing such as learning of a deep neural network (deep learning) or a scientific computation that performs a floating-point arithmetic operation, which is the AI technology, can be improved. Additionally, data output from the memory circuit 24 can be read out after completion of the arithmetic operation, whereby power required for memory access (data transfer between a CPU and a memory and arithmetic operation in a CPU) can be reduced and heat generation and an increase in power consumption can be inhibited. Furthermore, when the physical distance between the arithmetic circuit 23 and the memory circuit 24 is decreased, for example, a wiring distance can be shortened by stacking layers, parasitic capacitance generated in a signal line can be reduced and low power consumption can be achieved.

A product-sum operation in inference processing necessitates a large quantity of data, for which an extremely large bandwidth (data transfer rate) is needed. Such a large bandwidth can be secured by arranging the plurality of memory circuit layers 22_1 to 22_N over the arithmetic circuits 23 as in the structure of FIG. 1B. Moreover, the distance between circuits can be shortened, and the transfer rate for multiple pieces of data can be accordingly increased. Thus, the power consumption required for a product-sum operation in inference processing can be reduced to one several tenth, for example.

Note that inference processing based on a deep neural network is optimized for arithmetic operation of data with a number of bits, preferably less than or equal to 32 bits, more preferably less than or equal to 16 bits, more preferably less than or equal to 8 bits, not data with a large number of bits such as 64 bits; thus, the power consumption can be reduced without a decrease in the accuracy of the arithmetic processing.

The bus 30 electrically connects the CPU 10 to the accelerator 20. That is, data can be transferred between the CPU 10 and the accelerator 20 through the bus 30.

Figure 2A:
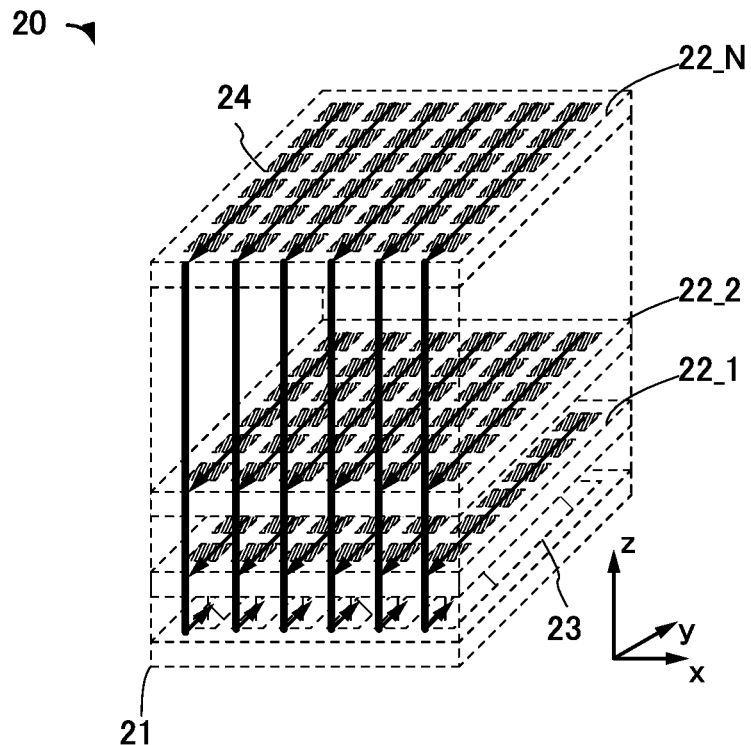
FIG. 2A and FIG. 2B are diagrams illustrating a structure example of a semiconductor device.
Figure 2B:
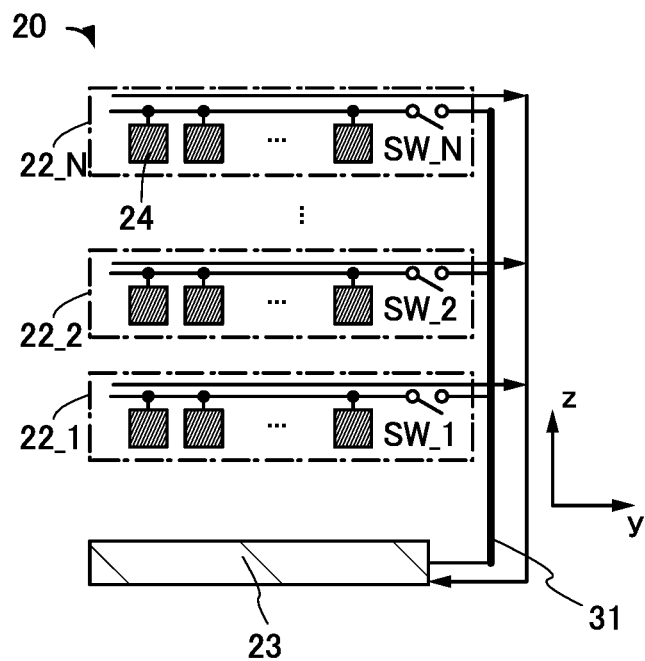

FIG. 2A schematically illustrates data reading in the accelerator 20 illustrated in FIG. 1B, from the memory circuits 24 in the stacked memory circuit layers 22_1 to 22_N to the arithmetic circuit 23. In FIG. 2A, arrows represent movement of data. As illustrated in FIG. 2A, the semiconductor device of one embodiment of the present invention can read data from the memory circuits 24 included in the plurality of memory circuit layers 22_1 to 22_N stacked through the wirings 31. Since the physical distance between the arithmetic circuit 23 and the memory circuit 24, which form a stacked structure, is extremely short, the wiring distance is short. Thus, the parasitic capacitance caused in the wirings 31 can be reduced, which enables a reduction in power consumption.

As the number of the stacked memory circuit layers 22_1 to 22_N increases, the parasitic capacitance caused in the wirings 31 increases. For this reason, between wirings to which the memory circuits 24 are connected, for example, between a read bit line and the wiring 31, switches SW_1 to SW_N are preferably provided in the memory circuit layers 22_1 to 22_N, respectively. The switches SW_1 to SW_N are off in the layers among the memory circuit layers 22_1 to 22_N from which data is not read, and on in the layers among the memory circuit layers 22_1 to 22_N from which data is read. This structure can reduce the parasitic capacitance in the wirings 31 due to the increase in the number of memory circuit layers 22_1 to 22_N, leading to a reduction in power consumption.

Figure 3A:
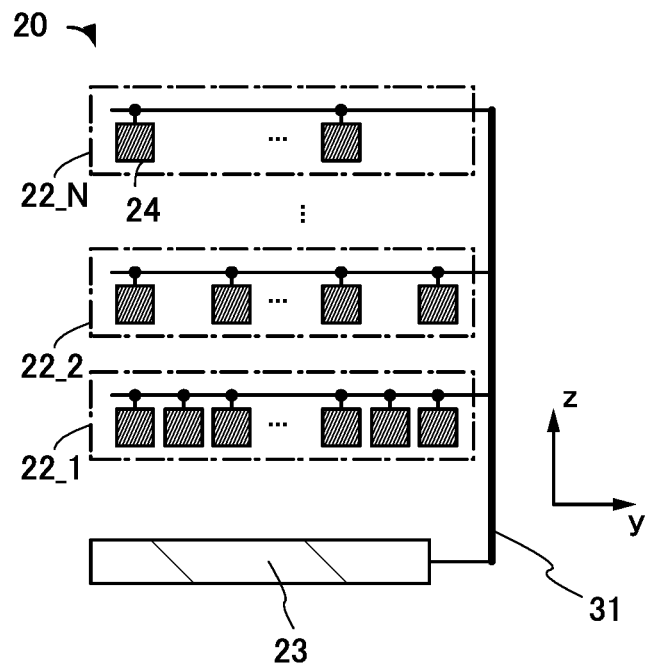
FIG. 3A and FIG. 3B are diagrams each illustrating a structure example of a semiconductor device.

Furthermore, the circuit layout, the channel length or channel width of a transistor, or the transistor density may be different, whereby the number of memory circuits 24 may be different between the stacked memory circuit layers 22_1 to 22_N. For example, a circuit layout as illustrated in FIG. 3A may be employed: a lower layer (e.g., the memory circuit layer 22_1) among the memory circuit layers 22_1 to 22_N has a higher transistor density of the memory circuits 24, and an upper layer (toward the z direction in the drawing) has a lower transistor density. This structure can increase the number of memory circuits whose physical distance to the arithmetic circuit 23 is short, and thus can improve data retention characteristics of the memory circuits 24 in the upper layers.

Figure 3B:
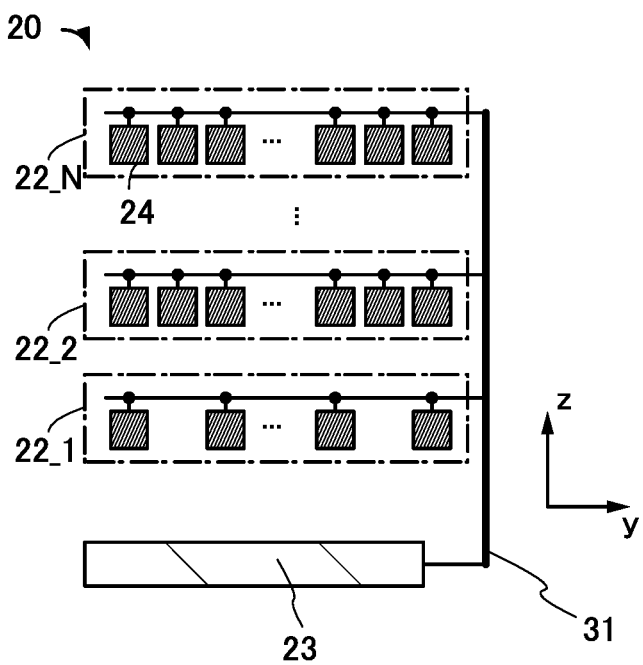

Alternatively, a circuit layout as illustrated in FIG. 3B may be employed in which an upper layer (e.g., the memory circuit layer 22_N) among the memory circuit layers 22_1 to 22_N has a higher transistor density of the memory circuits 24 and a lower layer (the memory circuit layer 22_1 side in the drawing) has a lower transistor density. This structure can improve the data retention characteristics of memory circuits whose physical distance to the arithmetic circuit 23 is short and can increase the data density.

In one embodiment of the present invention, the power consumption of a semiconductor device functioning as an accelerator used for the AI technology or the like with an enormous amount of calculation and an enormous number of parameters can be reduced. Alternatively, in one embodiment of the present invention, a semiconductor device functioning as an accelerator used for the AI technology or the like with an enormous amount of calculation and an enormous number of parameters can be downsized. Alternatively, in one embodiment of the present invention, heat generation can be suppressed in a semiconductor device functioning as an accelerator used for the AI technology or the like with an enormous amount of calculation and an enormous number of parameters. Alternatively, in one embodiment of the present invention, in a semiconductor device functioning as an accelerator used for the AI technology or the like with an enormous amount of calculation and an enormous number of parameters, the number of times of data transfer between a CPU and a semiconductor device functioning as a memory can be reduced. In other words, a semiconductor device functioning as an accelerator used for the AI technology or the like with an enormous amount of calculation and an enormous number of parameters has a non-von Neumann architecture, and can perform parallel processing with extremely low power consumption as compared with a von Neumann architecture, in which power consumption increases with increasing processing speed.

Figure 4A:
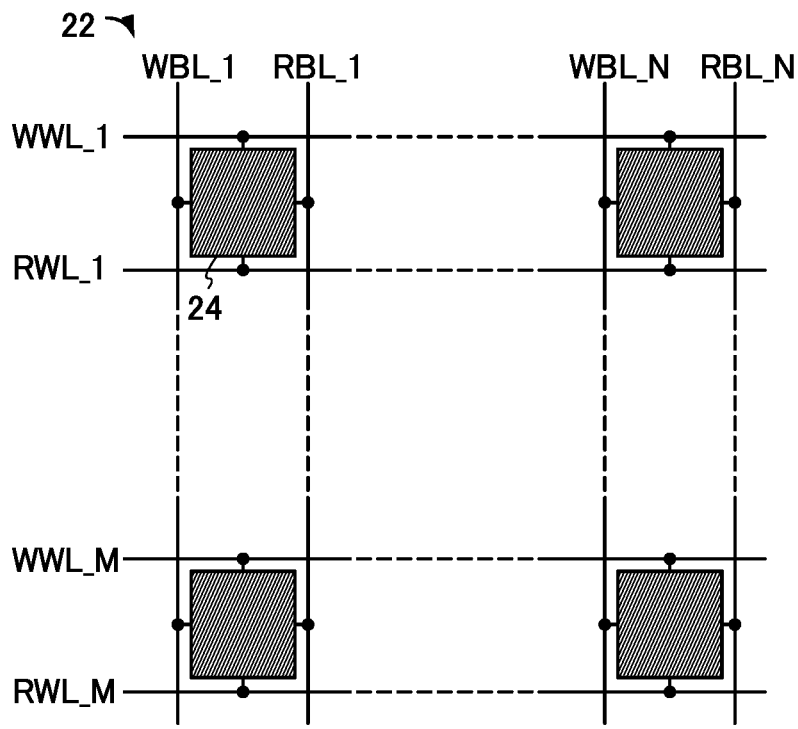
FIG. 4A and FIG. 4B are diagrams illustrating a structure example of a semiconductor device.

FIG. 4A is a diagram illustrating a circuit structure example applicable to the memory circuit layers 22_1 to 22_N included in the semiconductor device 100 of the present invention. FIG. 4A shows write word lines WWL_1 to WWL_M, read word lines RWL_1 to RWL_M, write bit lines WBL_1 to WBL_N, and read bit lines RBL_1 to RBL_N, which are arranged in a matrix of M rows and N columns (M and N are natural numbers greater than or equal to 2). The memory circuits 24 connected to the word lines and the bit lines are also shown.

Figure 4B:
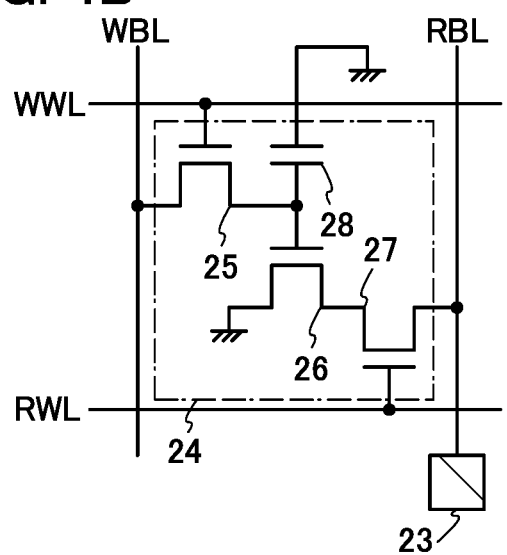

FIG. 4B is a diagram illustrating a circuit structure example applicable to the memory circuit 24. The memory circuit 24 includes the transistor 25, a transistor 26, a transistor 27, and a capacitor 28.

One of a source and a drain of the transistor 25 is connected to the write bit line WBL. A gate of the transistor 25 is connected to the write word line WWL. The other of the source and the drain of the transistor 25 is connected to one electrode of the capacitor 28 and a gate of the transistor 26. One of a source and a drain of the transistor 26 and the other electrode of the capacitor 28 are connected to a wiring for supplying a fixed potential such as a ground potential. The other of the source and the drain of the transistor 26 is connected to one of a source and a drain of the transistor 27. A gate of the transistor 27 is connected to the read word line RWL. The other of the source and the drain of the transistor 27 is connected to the read bit line RBL. As described above, the read bit line RBL is connected to the arithmetic circuit 23 through the wiring 31 or the like provided to extend in the direction substantially perpendicular to the surface of the substrate provided with the arithmetic circuit 23.

The circuit structure of the memory circuit 24 illustrated in FIG. 4B corresponds to a NOSRAM of a 3-transistor (3T) gain cell. The transistor 25 to the transistor 27 are OS transistors. An OS transistor has an extremely low current that flows between a source and a drain in an off state, that is, leakage current. The NOSRAM can be used as a non-volatile memory by retaining electric charge corresponding to data in the memory circuit, using characteristics of an extremely low leakage current.

Figure 5A:
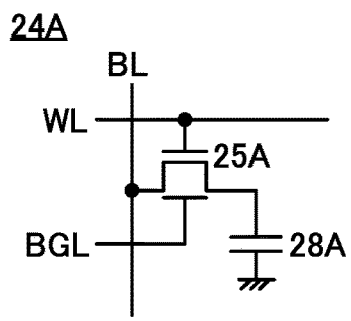
FIG. 5A to FIG. 5E are diagrams illustrating structure examples of a semiconductor device.

A circuit configuration applicable to the memory circuit 24 in FIG. 4A is not limited to a 3T NOSRAM in FIG. 4B. For example, a circuit corresponding to a DOSRAM illustrated in FIG. 5A may be employed. Note that a DOSRAM refers to a RAM including a 1T1C memory cell and is an abbreviation for Dynamic Oxide Semiconductor RAM. FIG. 5A illustrates a memory circuit 24A including a transistor 25A and a capacitor 28A. The transistor 25A is an OS transistor. The memory circuit 24A is an example of a circuit connected to a bit line BL, a word line WL, and a back gate line BGL.

Figure 5B:
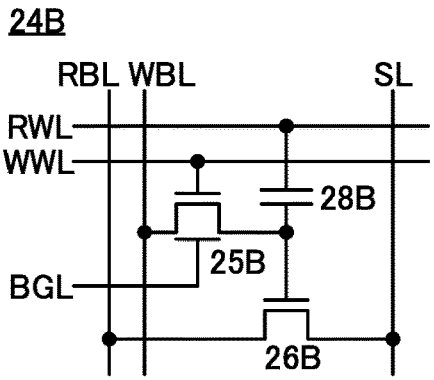

The circuit configuration applicable to the memory circuit 24 in FIG. 4A may be a circuit corresponding to a 2T NOSRAM illustrated in FIG. 5B. FIG. 5B illustrates a memory circuit 24B including a transistor 25B, a transistor 26B, and a capacitor 28B. The transistor 25B and the transistor 26B are OS transistors. The transistor 25B and the transistor 26B may be OS transistors whose semiconductor layers are provided in different layers or may be OS transistors whose semiconductor layers are provided in the same layer. The memory circuit 24B is an example of a circuit connected to the write bit line WBL, the read bit line RBL, the write word line WWL, the read word line RWL, a source line SL, and the back gate line BGL.

Figure 5C:
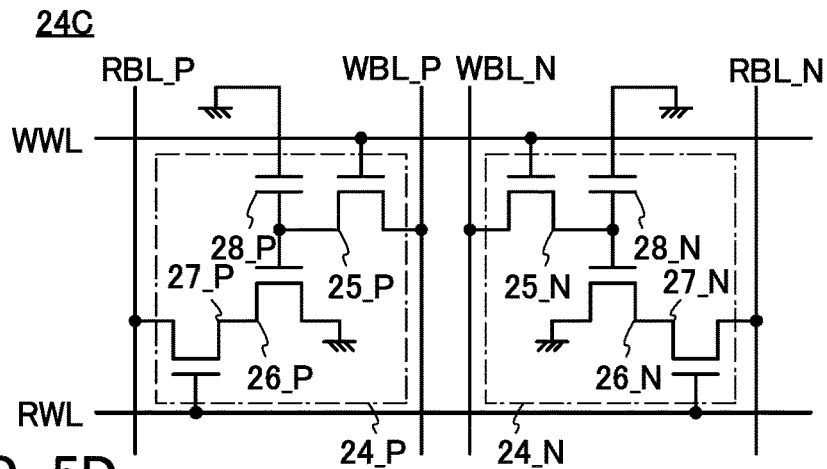

The circuit configuration applicable to the memory circuit 24 in FIG. 4A may be a circuit combined with a 3T NOSRAM illustrated in FIG. 5C. FIG. 5B illustrates a memory circuit 24C including a memory circuit 24_P and a memory circuit 24_N which can retain different logic data. FIG. 5B illustrates the memory circuit 24_P including a transistor 25_P, a transistor 26_P, a transistor 27_P, and a capacitor 28_P and the memory circuit 24_N including a transistor 25_N, a transistor 26_N, a transistor 27_N, and a capacitor 28_N. The transistors included in the memory circuit 24_P and the memory circuit 24_N are OS transistors. The transistors included in the memory circuit 24_P and the memory circuit 24_N may be OS transistors whose semiconductor layers are provided in different layers or may be OS transistors whose semiconductor layers are provided in the same layer. The memory circuit 24C is an example of a circuit connected to a write bit line WBL_P, a read bit line RBL_P, a write bit line WBL_N, a read bit line RBL_N, a write word line WWL, and a read word line RWL. The memory circuit 24C retains different logic data, reads different logic data to the read bit line RBL_P and the write bit line WBL_N, and amplifies the data in a sense amplifier or the like, thereby achieving high-speed data reading.

Note that in the structure of FIG. 5C, an exclusive OR circuit (an XOR circuit) may be provided in order to output data corresponding to multiplication of data retained in the memory circuit 24_P and the memory circuit 24_N, to the read bit line RBL. This structure can omit arithmetic operation corresponding to multiplication in the arithmetic circuit 23, and thus can achieve a reduction in power consumption.

Figure 5D:
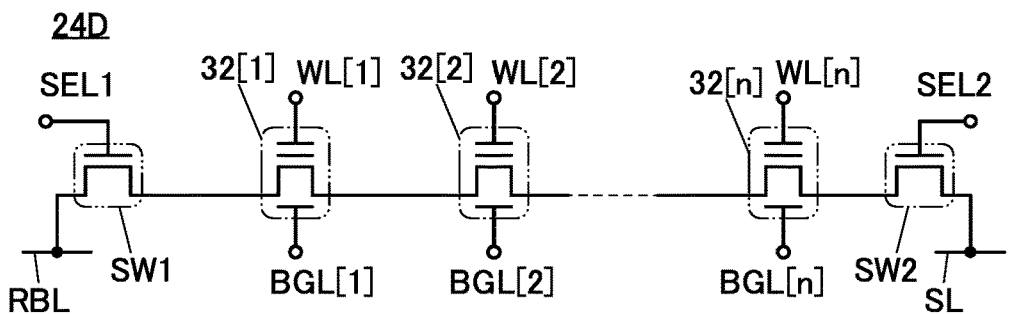

The circuit configuration applicable to the memory circuit 24 in FIG. 4A may be a NAND memory circuit including a charge accumulation layer, such as a MONOS type, illustrated in FIG. 5D. FIG. 5D illustrates a memory circuit 24D including transistors 32[1] to 32[n] and transistors SW1 and SW2. The transistors 32[1] to 32[n] and the transistors SW1 and SW2 are OS transistors. The transistors 32[1] to 32[n] and the transistors SW1 and SW2 may be OS transistors whose semiconductor layers are provided in the same layer or may be OS transistors whose semiconductor layers are provided in different layers. The transistors 32[1] to 32[n] each include a control gate electrode, and a charge accumulation layer or a floating gate electrode.

The transistors 32[1] to 32[n] in FIG. 5D may form a string (also referred to as a macaroni-type) NAND memory in which an opening is formed in a stack obtained by stacking a conductive layer and an insulating layer alternately, and a conductor, an insulator, a semiconductor, and the like are provided in the opening to overlap with one another in a concentric way. The memory circuit 24D is an example in which the transistors 32[1] to 32[n] are connected to a word line WL[1] to a word line WL[n], a back gate line BGL[1] to a back gate line BGL[n], and the transistors SW1 and SW2 are connected to control lines SEL1 and SEL2, the read bit line, and the source line SL.

Figure 5E:
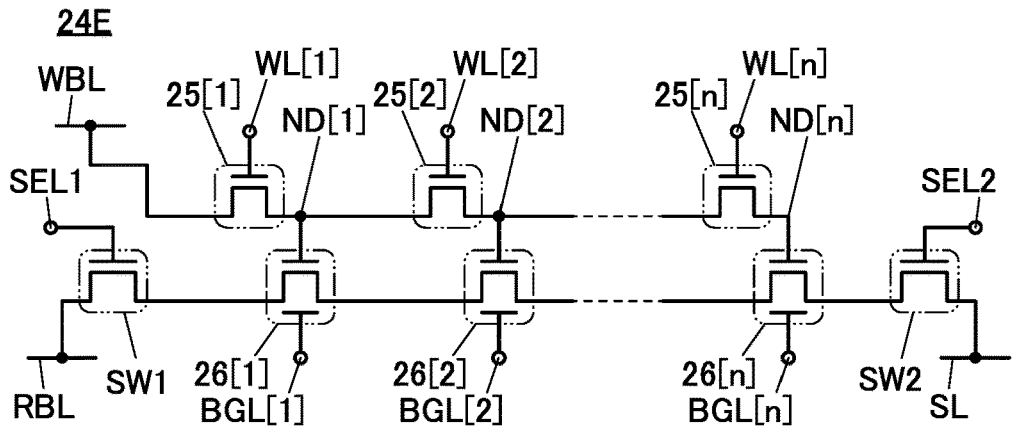

The circuit configuration applicable to the memory circuit 24 in FIG. 4A may be a NAND memory circuit combined with a NOSRAM illustrated in FIG. 5E. FIG. 5E illustrates a memory circuit 24E including transistors 25[1] to 25[n], transistors 26[1] to 26[n], and the transistors SW1 and SW2. The transistors 25[1] to 25[n], the transistors 26[1] to 26[n], and the transistors SW1 and SW2 are OS transistors. The transistors 25[1] to 25[n], the transistors 26[1] to 26[n], and the transistors SW1 and SW2 may be OS transistors whose semiconductor layers are provided in the same layer or may be OS transistors whose semiconductor layers are provided in different layers. A circuit formed with the transistors 25[1] to 25[n] and the transistors 26[1] to 26[n] includes a node ND[1] to a node ND[n] which retain electric charges in accordance with data by turning off the transistors 25[1] to 25[n].

The transistors 25[1] to 25[n] and the transistors 26[1] to 26[n] in FIG. 5E may form a vertical-channel (also referred to as a macaroni-type) NAND memory in which an opening is formed in a stack obtained by stacking a conductive layer and an insulating layer alternately, and a conductor, an insulator, a semiconductor, and the like are provided in the opening to overlap with one another in a concentric way. Note that a NAND memory, which includes an OS transistor capable of being formed over a layer including a Si transistor, has a function as a main memory in addition to a function as a storage memory, and can be called a universal memory. The universal memory doubles as a main memory such as a DRAM (Dynamic RAM), which is usually provided as a different chip, and may be able to form a computer system that does not need a DRAM. The memory circuit 24E is an example in which the transistors 25[1] to 25[n] are connected to the word lines WL[1] to WL[n], respectively, and the transistors 26[1] to 26[n] are connected to the node ND[1] to the node ND[n], respectively, which are data retention nodes of the NOSRAM. The memory circuit 24E is an example in which the transistors SW1 and SW2 are connected to the control lines SEL1 and SEL2, the read bit line RBL, and the source line SL.

Figure 6A:
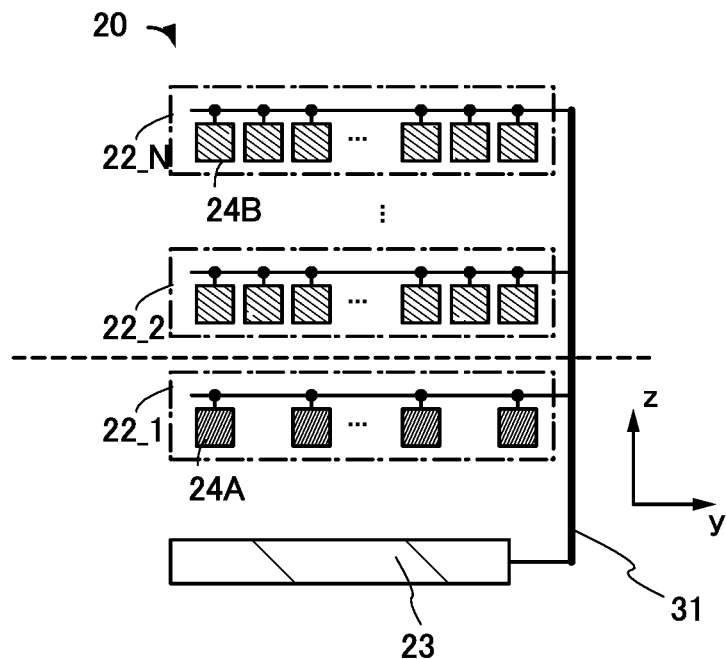
FIG. 6A and FIG. 6B are diagrams illustrating a structure example of a semiconductor device.

The circuit configurations of memory circuits applicable to the memory circuit layers 22_1 to 22_N included in the semiconductor device 100 of the present invention may be different. For example, as illustrated in FIG. 6A, the memory circuit 24A is used as a memory circuit in a lower layer among the memory circuit layers 22_1 to 22_N (e.g., the memory circuit layer 22_1), and the memory circuit 24B is used as a memory circuit in an upper layer (e.g., the memory circuit layer 22_2 and the memory circuit layer 22_N). The circuit configuration of the NOSRAM is applied to the memory circuit 24A whose physical distance to the arithmetic circuit 23 is short, and a configuration of another circuit such as a DOSRAM or a NAND memory is applied to the memory circuit 24B.

Figure 6B:
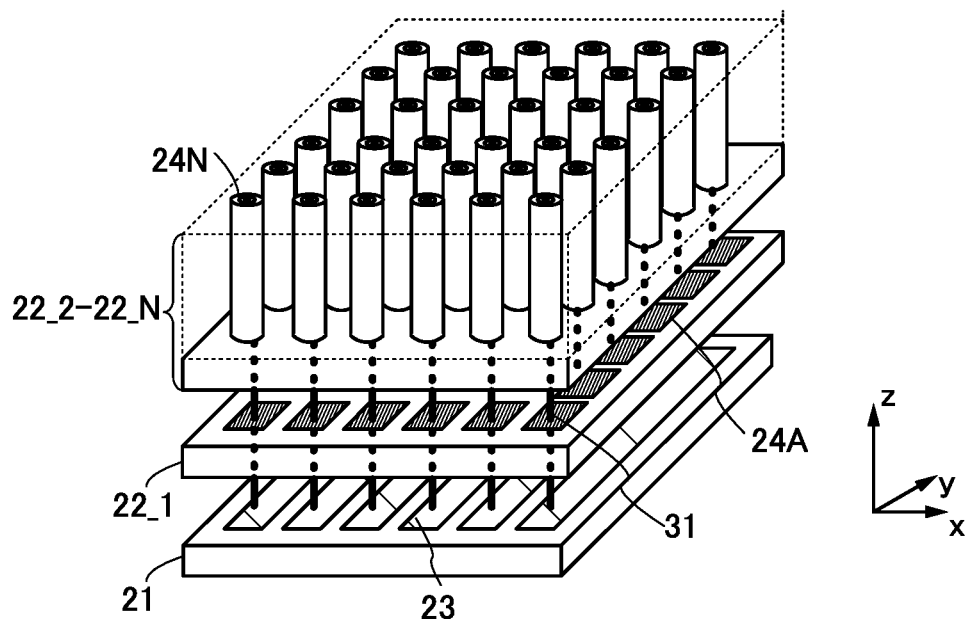

In a structure in FIG. 6B, which is different from that in FIG. 6A, a memory circuit 24N, which is a vertical-channel universal memory, is used as each of memory circuits in the upper layers (e.g., the memory circuit layers 22_2 to 22_N). The circuit configuration of the NOSRAM can be applied to the memory circuit 24A whose physical distance to the arithmetic circuit 23 is short. Since the memory circuit 24N is a vertical-channel universal memory with high storage density, an external memory such as a DRAM can be omitted. In addition, data needed for arithmetic processing is retained in the NOSRAM having a higher writing speed and a higher reading speed than the universal memory, so that the arithmetic processing can be performed at high speed. With this structure, data retained in the universal memory (the memory circuit 24N) can be subjected to arithmetic processing through the NOSRAM (the memory circuit 24A), and thus the storage capacity for data used for arithmetic processing can be significantly increased in the semiconductor device 100. In addition, a gap of delay time required for data reading and data writing can be reduced.

Figure 7A:
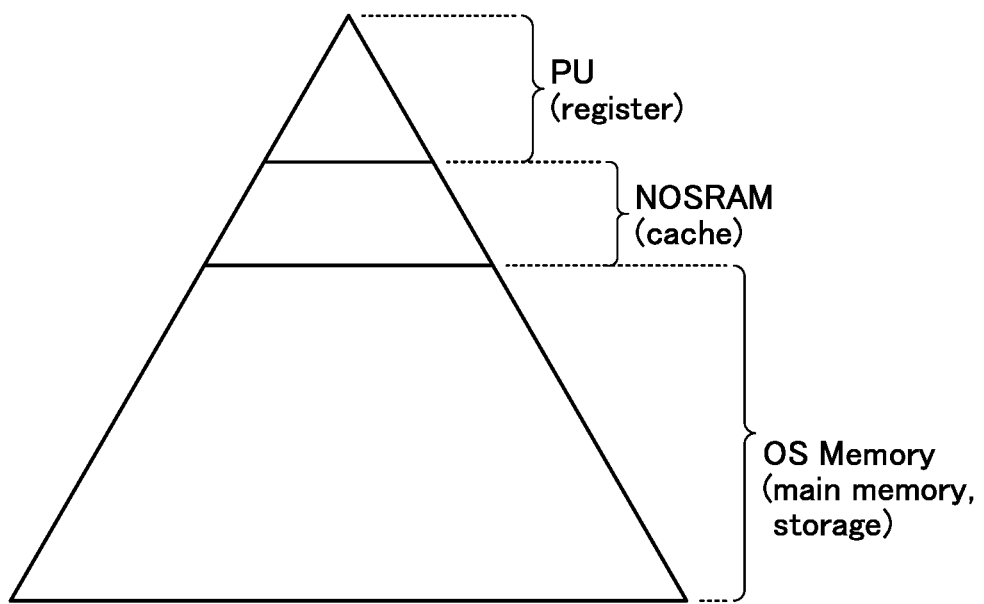
FIG. 7A and FIG. 7B each illustrate a hierarchy of various kinds of memories.

In general, a variety of memory devices are used in semiconductor devices such as computers in accordance with the intended use. FIG. 7A shows the hierarchy of various memory devices used in a semiconductor device. The memory devices at the upper levels require a higher operating speed, whereas the memory devices at the lower levels require a larger storage capacity and a higher record density. FIG. 7A illustrates, in order from the top level, a memory included in an arithmetic processing unit (PU) as a register, a memory, such as a NOSRAM, which can be used as a cache, and a memory, such as an OS memory, which can be used as a storage memory or a main memory.

Figure 7B:
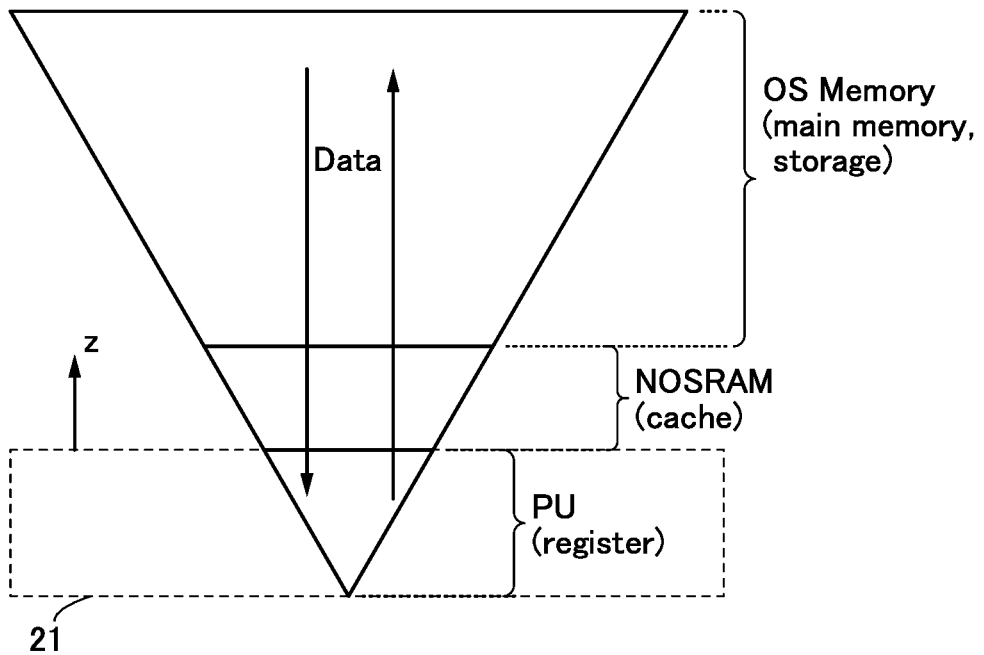

In FIG. 7A and FIG. 7B, a three-dimensional NAND universal memory using an OS transistor is referred to as an "OS memory". Note that the "OS memory" is preferably an OS transistor having a larger storage capacity than the NOSRAM.

Since the universal memory enables random access and has a feature of an extremely low off-state current of an OS transistor, the universal memory can retain written data for a period of a year or longer, furthermore, ten years or longer even after power supply is stopped. Thus, the universal memory can be regarded as a nonvolatile memory.

In the universal memory, the amount of written electric charge is less likely to change over a long period of time; hence, the universal memory can retain multilevel (multibit) data as well as binary (1-bit) data.

A universal memory employs a method in which electric charge is written to a node through the OS transistor; hence, high voltage, which a conventional NAND flash memory requires, is unnecessary and high-speed writing operation is possible. The universal memory does not require an erasing operation before data rewriting, which is performed in the NAND flash memory. Furthermore, the number of data writing and reading operations in the universal memory is substantially unlimited because electric charge injection and extraction into/from a floating gate or a charge trap layer are not performed. The universal memory is less likely to degrade than the conventional NAND flash memory and can have high reliability.

In the semiconductor device of one embodiment of the present invention, the storage capacity for data used for arithmetic processing can be significantly increased. In addition, a gap of delay time required for data reading and data writing can be reduced. Furthermore, as shown in FIG. 7B, memory circuits with different data retention characteristics or storage capacities are stacked in the z direction (a direction perpendicular to the substrate provided with the arithmetic processing unit 21), and input/output of data (Data) can be performed through the layers. Since the input/output of data (Data) can be performed with use of wirings between the layers, parasitic capacitance or resistance in the wirings can be lowered, and thus an increase in power consumption due to the input/output of data can be inhibited.

Figure 8A:
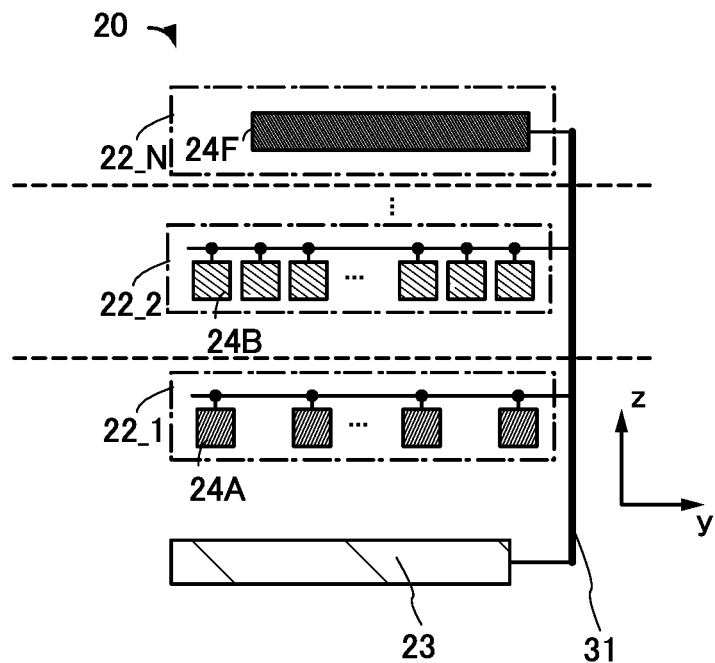
FIG. 8A to FIG. 8C are diagrams illustrating structure examples of a semiconductor device.

In one embodiment of the present invention, some of the memory circuit layers 22_1 to 22_N may be circuits having a different function. For example, as illustrated in FIG. 8A, a circuit 24F which has a different function from the memory circuit can be provided in the memory circuit layer 22_N which is positioned in the uppermost layer of the accelerator 20.

Figure 8B:
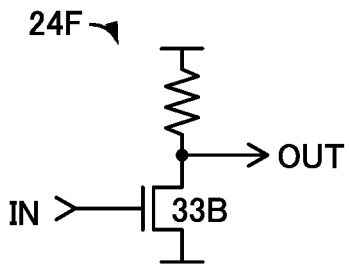
Figure 8C:
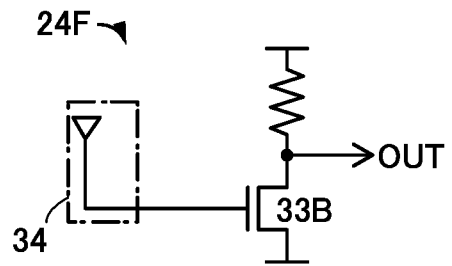

The circuit 24F is a circuit that can be formed with an OS transistor. For example, the circuit 24F can be an amplifier circuit capable of amplifying a potential of input IN to output OUT, as illustrated in FIG. 8B. A transistor 33B can be an OS transistor. The circuit 24F may include, in addition to the components in FIG. 8B, an antenna 34 as illustrated in FIG. 8C, for example. The antenna 34 can be formed by placing a conductive layer used in the circuit 24F so as to function as an antenna. In the case where the antenna 34 is, for example, an antenna of the fifth-generation mobile communications system (5G), a communication frequency of a 3.7 GHz band, a 4.5 GHz band, or a 28 GHz band is used in Japan.

In one embodiment of the present invention, the memory circuits provided in the memory circuit layers 22_1 to 22_N have different data retention characteristics. The data retention characteristics correspond to time for which written data can be retained (data retention time). In the schematic diagram of FIG. 9A, the memory circuit 24A and the memory circuit 24B have different data retention characteristics. In the case where the memory circuit 24A is used as a cache memory, the data retention time of the memory circuit 24A may be several milliseconds. In the case where the memory circuit 24B is used as a main memory or a storage memory, the data retention time of the memory circuit 24B is preferably longer than that of the cache memory.

Figure 9A:
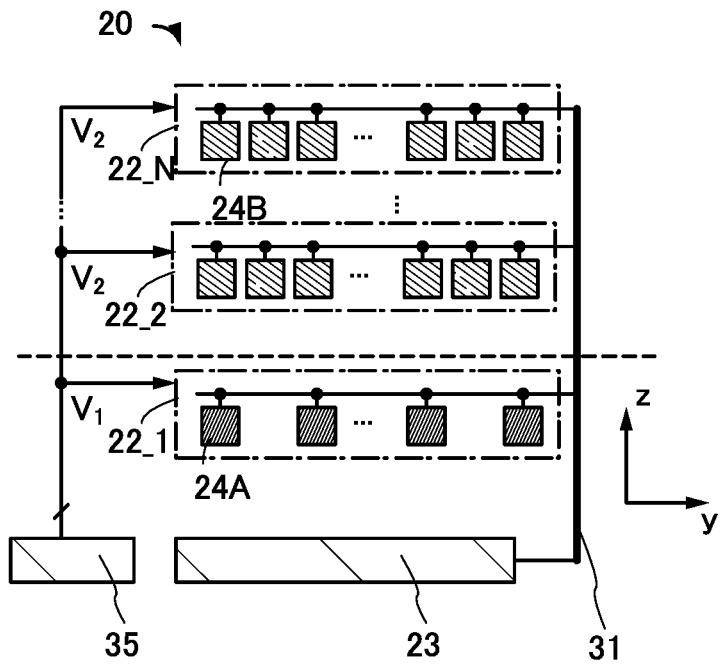
FIG. 9A to FIG. 9C are diagrams illustrating a structure example of a semiconductor device.
Figure 9B:
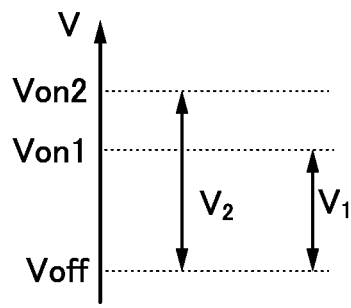

To make retention times different, driving voltages $V_1$ and $V_2$, which are output by a driver circuit 35 to drive the memory circuits, are made different as illustrated in FIG. 9A. For example, as illustrated in FIG. 9B, the driving voltages $V_1$ and $V_2$ have different amplitude voltages for driving transistors included in memory circuits. In FIG. 9B, a potential for turning off the transistors included in the memory circuits 24A and 24B is a potential Voff. In FIG. 9B, a potential Von1 for turning on the transistor included in the memory circuit 24A is set lower than a potential Von2 for turning on the transistor included in the memory circuit 24B. By setting the driving voltages $V_1$ and $V_2$ in this manner, the memory circuits provided in the memory circuit layers 22_1 to 22_N can have different data retention characteristics. When the driving voltages $V_1$ and $V_2$ for driving the memory circuits are made different, S values (subthreshold swing values) or field-effect mobilities of the transistors included in the memory circuits can be different.

Figure 9C:
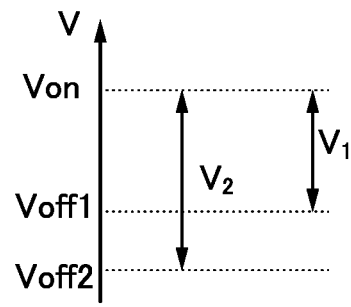

As another example, for example, a potential for turning on the transistors included in the memory circuits 24A and 24B is a potential Von as shown in FIG. 9C. In FIG. 9C, a potential Voff1 for turning off the transistor included in the memory circuit 24A is set higher than a potential Voff2 for turning on the transistor included in the memory circuit 24B. By setting the driving voltages $V_1$ and $V_2$ in this manner, the memory circuits provided in the memory circuit layers 22_1 to 22_N can have different data retention characteristics.

Figure 10:
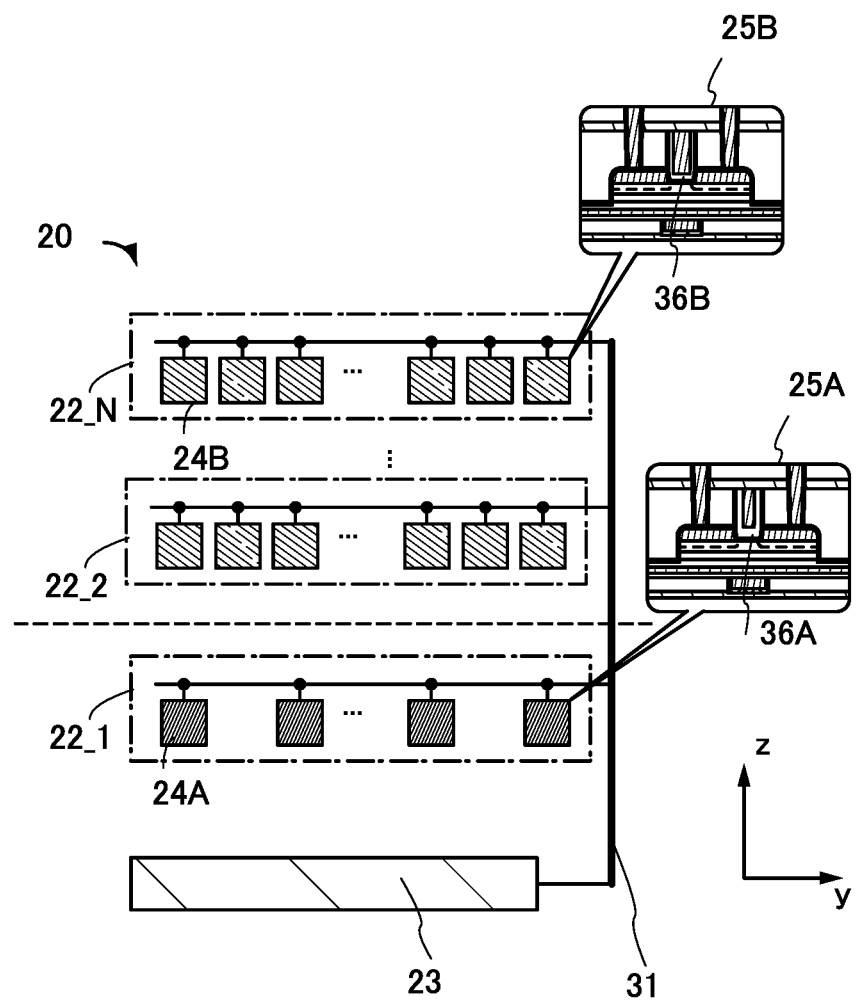
FIG. 10 is a diagram illustrating a structure example of a semiconductor device.

To make the retention times different, the thickness of an insulator functioning as a gate insulating film of a transistor included in a memory circuit is made different between layers. For example, as illustrated in FIG. 10, the thickness of an insulator 36A functioning as a gate insulating film of the transistor 25A included in the memory circuit 24A in the memory circuit layer 22_1 is made smaller than the thickness of an insulator 36B functioning as a gate insulating film of the transistor 25B included in the memory circuit 24B in each of the memory circuit layers 22_2 to 2_N. The thickness of the insulator functioning as a gate insulating film of a transistor included in a memory circuit is made different between layers in this manner, whereby the memory circuits provided in the memory circuit layers 22_1 to 22_N can have different data retention characteristics.

Figure 11:
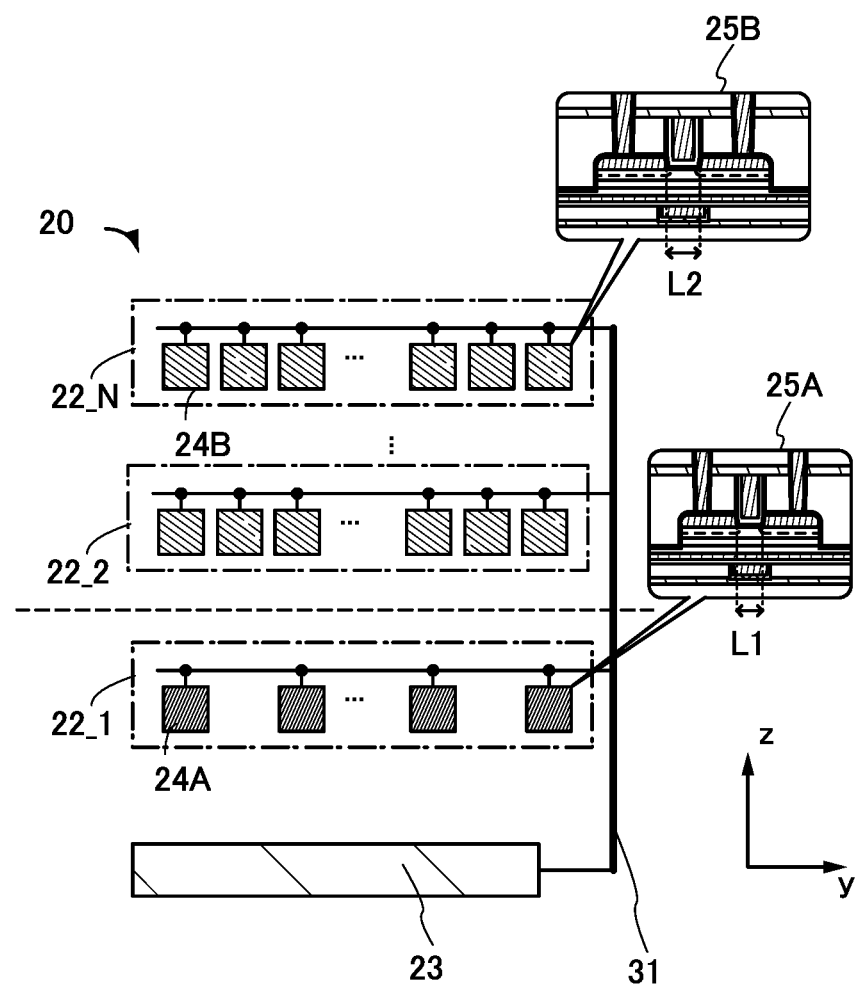
FIG. 11 is a diagram illustrating a structure example of a semiconductor device.

To make the retention times different, the channel length of a transistor included in a memory circuit is made different between layers. For example, as illustrated in FIG. 11, a channel length L1 of the transistor 25A included in the memory circuit 24A in the memory circuit layer 22_1 is made smaller than a channel length L2 of the transistor 25B included in the memory circuit 24B in each of the memory circuit layers 22_2 to 2_N. The channel length of a transistor included in a memory circuit is made different between layers in this manner, whereby the memory circuits provided in the memory circuit layers 22_1 to 22_N can have different data retention characteristics. Although FIG. 11 illustrates a structure in which the channel length is different between layers, a structure in which transistors have different channel widths or different ratios of the channel length to the channel width (W/L), a structure in which the driving frequency is different between layers, or the like may be employed or may be combined.

Figure 12A:
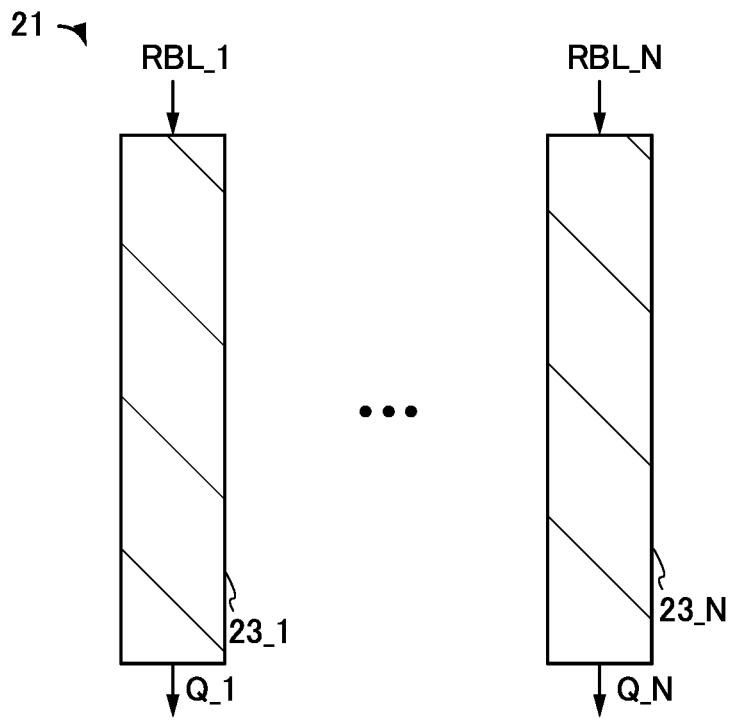
FIG. 12A and FIG. 12B are diagrams illustrating a structure example of a semiconductor device.

FIG. 12A is a diagram illustrating a circuit structure example applicable to the arithmetic processing unit 21 included in the semiconductor device 100 of the present invention. The arithmetic processing unit 21 includes N arithmetic circuits 23_1 to 23_N. The N arithmetic circuits 23_1 to 23_N are supplied with signals of the corresponding N read bit lines RBL_1 to RBL_N and output signals Q_1 to Q_N. The signals of the read bit lines RBL_1 to RBL_N may be amplified by a sense amplifier or the like and read out. The output signals Q_1 to Q_N correspond to data obtained by performing a product-sum operation using data retained in the memory circuit 24.

Figure 12B:
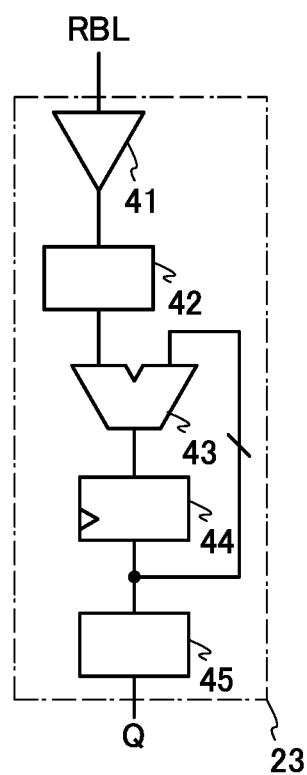
Figure 13:
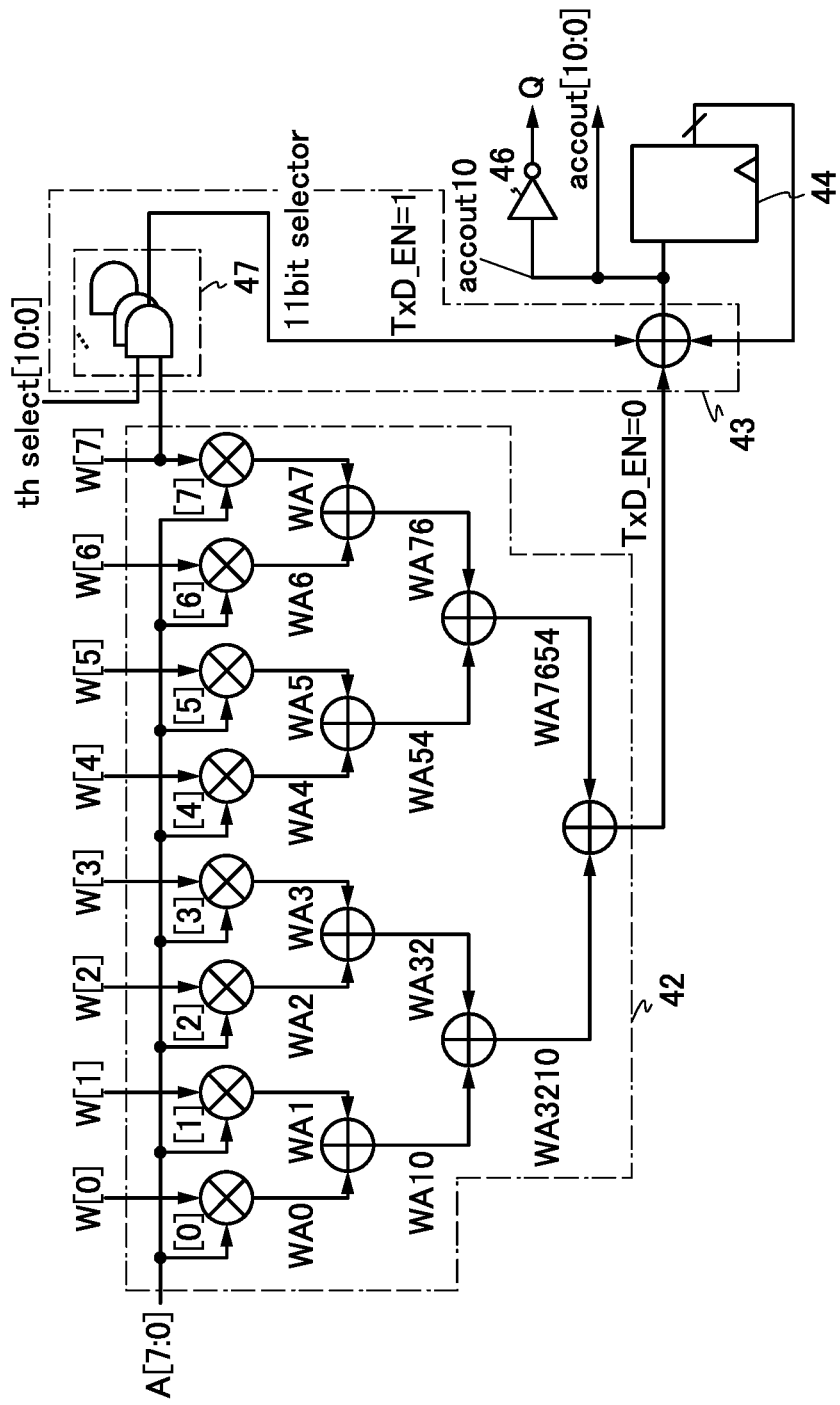
FIG. 13 is a diagram illustrating a structure example of a semiconductor device.

FIG. 12B is a diagram illustrating a circuit structure example of the arithmetic circuit 23 applicable to the arithmetic circuit 23_1 to the arithmetic circuit 23_N. FIG. 13 illustrates a circuit for executing arithmetic processing based on Binary Neural Network (BNN) architecture. The arithmetic circuit 23 includes a readout circuit 41 supplied with a signal of the read bit line RBL, a bit product-sum operation unit 42, an accumulator 43, a latch circuit 44, and an encoding circuit 45 for outputting the output signal Q.

FIG. 13 illustrates a detailed structure example of the structure of the arithmetic circuit 23 illustrated in FIG. 12B. FIG. 13 illustrates a structure example in which a product-sum operation of signals of eight bits (W[0] to W[7], A[0] to A[7]) is performed and the 1-bit output signal Q and an 11-bit output signal (accout[10:0]) are output. In FIG. 12B, one row is selected in one clock in memory access, so that calculation of addition of M products (=1 bit×M rows) is executed in M clocks. In the arithmetic circuit in FIG. 13, the same calculation of addition of M products can be executed by eight parallel operations×1 bit×M/8 rows, and thus M/8 clocks are needed. Accordingly, in the structure in FIG. 13, arithmetic operation time can be shortened by executing a product-sum operation in parallel, whereby arithmetic efficiency can be improved.

When the arithmetic circuit 23 illustrated in FIG. 12A and FIG. 12B has a circuit configuration to perform product-sum operation dedicated to inference processing, the circuit area can be reduced. Accordingly, power consumption needed for transmission and reception of data using the accelerators 20 can be reduced to several tenths.

The power consumption of the existing data center or the existing supercomputer can be reduced to a thousandth by optimization of computer architecture, optimization of software, or optimization of a driving method in addition to the reduction in power consumption due to the arithmetic operation, the reduction in power consumption due to the arithmetic operation dedicated to product-sum operation in inference processing, and the reduction in power consumption due to the small circuit area which are described above.

In FIG. 13, the bit product-sum operation unit 42 includes multipliers to which signals of eight bits (W[0] to W[7], A[0] to A[7]) are input and adders to which values obtained with the multipliers are input. As shown in FIG. 13, products of 1-bit signals calculated by eight parallel operations are denoted as WA0 to WA7, their sums are denoted as WA10, WA32, WA54, and WA76, and their sums are denoted as WA3210 and WA7654.

In FIG. 13, the accumulator 43 functioning as an adder outputs the sum of a signal of the bit product-sum operation unit 42 and an output signal of the latch circuit 44 to the latch circuit 44. Note that in the accumulator 43, a signal input to the adder is changed depending on the control signal TxD_EN. When the control signal TxD_EN is 0 (TxD_EN=0), the sum of the signal of the bit product-sum operation unit 42 and the output signal of the latch circuit 44 is output to the latch circuit 44. When the control signal TxD_EN is 1 (TxD_EN=1), the sum of the signal of the logic circuit 47 (11-bit selector) and the output signal of the latch circuit 44 is output to the latch circuit 44.

In FIG. 13, after completion of the product-sum operation of the signals A[0] to A[7] and the signals W[0] to W[7], the logic circuit 47 formed using an AND circuit adds data for batch normalization, specifically, the signal W[7] while switching signals (th select[10:0]) are changed. Note that as the data for batch normalization, any of the signals W[0] to W[6] other than the signal W[7] may be simultaneously read out and selected, for example. Batch normalization is operation for adjusting the distribution of output data of each layer in a neural network to fit in a certain range. For example, as for image data frequently used in the arithmetic operation in a neural network, the distribution of data used in learning is likely to vary, and thus is different from the distribution of estimated data (input data) in some cases. In batch normalization, the distribution of input data to an intermediate layer of the neural network is normalized to Gaussian distribution with the mean 0 and the variance 1, whereby the learning accuracy in the neural network can be increased. In Binary Neural Network (BNN), an output result of each layer is binarized by activation; thus, when unbalanced data distribution with respect to the threshold value is inhibited, appropriate activation, i.e., data classification can be performed.

The latch circuit 44 retains the output signal (accout[10:0]) of the accumulator 43. By batch normalization, binary data to be transferred to a layer (NN layer) in the next neural network becomes the most significant bit of the product-sum operation result retained in the latch circuit 44. In the output signal (accout[10:0]), a signal of the most significant bit (accout10) denotes a sign of latch data obtained by arithmetic operation with the two's complement, and in order to transfer a positive data thereof as 1 and a negative data as 0 to the next NN layer, the signal is inverted in the inverter circuit 46 functioning as an encoding circuit and output as the output signal Q. Since the signal Q is an output of the intermediate layer, the signal Y is temporarily retained in a buffer memory (also referred to as an input buffer) in the accelerator 20 and then used in arithmetic operation in the next layer.

Figure 14A:
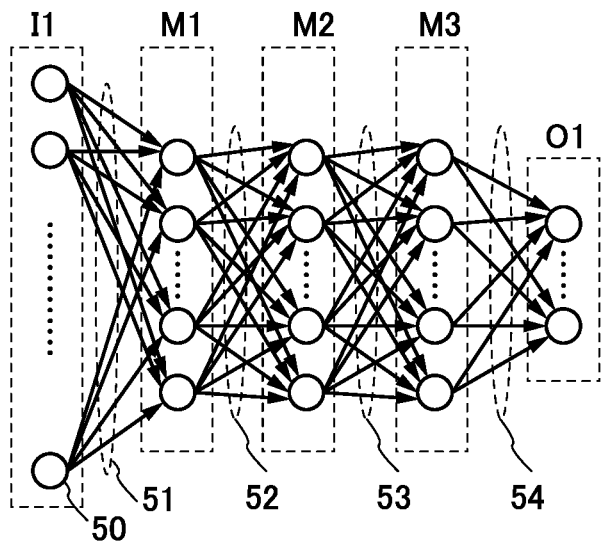
FIG. 14A and FIG. 14B are diagrams each illustrating a structure example of a semiconductor device.

FIG. 14A illustrates a hierarchical neural network based on the Binary Neural Network (BNN) architecture. FIG. 14A illustrates a fully connected neural network including neurons 50, one input layer (I1), three intermediate layers (M1 to M3), and one output layer (O1). Given that the number of neurons in the input layer I1 is 786, the number of neurons in each of the intermediate layers M1 to M3 is 256, and the number of neurons in the output layer O1 is 10, the number of connections in layers (a layer 51, a layer 52, a layer 53, and a layer 54) is (786×256)+(256×256)+(256×256)+(256×10), i.e., 334336 in total. That is, the weight parameter required for the neural network calculation is approximately 330 K bits in total, whereby the memory capacity is adequate for a small system.

Figure 14B:
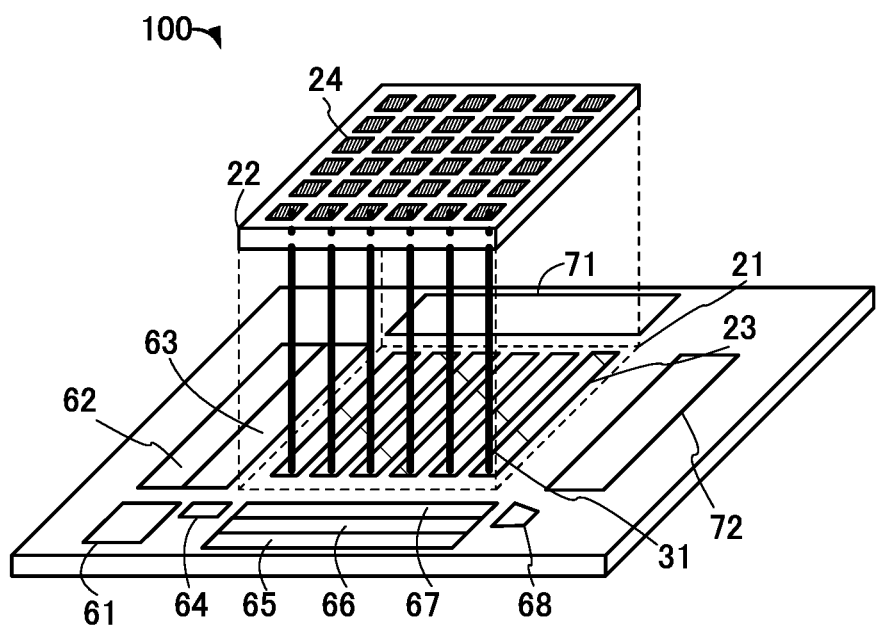

Next, FIG. 14B is a detailed block diagram of the semiconductor device 100 capable of the arithmetic operation of the neural network illustrated in FIG. 14A.

FIG. 14B illustrates structure examples of peripheral circuits for driving the structures illustrated in FIG. 1A and FIG. 1B, in addition to the arithmetic processing unit 21, the arithmetic circuit 23, the memory circuit layer 22_1 in the memory unit 22, the memory circuit 24, and the wiring 31 illustrated in FIG. 1A and FIG. 1B.

FIG. 14B illustrates the controller 61, the row decoder 62, the word line driver 63, the column decoder 64, the write driver 65, the precharge circuit 66, the sense amplifier 67, the selector 68, the input buffer 71, and the arithmetic control circuit 72.

Figure 15A:
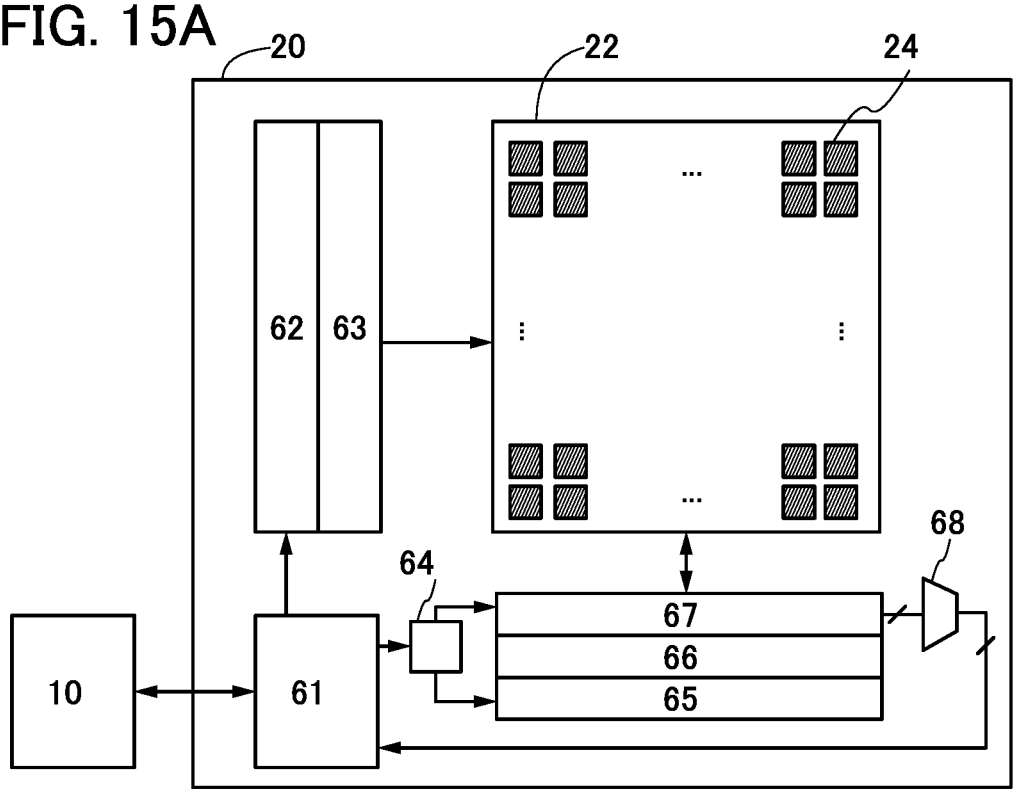
FIG. 15A and FIG. 15B are diagrams each illustrating a structure example of a semiconductor device.

FIG. 15A is a diagram of blocks for controlling the memory circuit layers 22_1 to 22_N in the memory unit 22, which are extracted from the structure illustrated in FIG. 14B. FIG. 15A illustrates the controller 61, the row decoder 62, the word line driver 63, the column decoder 64, the write driver 65, the precharge circuit 66, the sense amplifier 67, and the selector 68.

The controller 61 processes an input signal from the outside and generates control signals of the row decoder 62 and the column decoder 64. The input signal from the outside is a control signal for controlling the memory circuit layers 22_1 to 22_N in the memory unit 22, such as a write enable signal or a read enable signal. The controller 61 performs input and output of data written to the memory circuit layers 22_1 to 22_N in the memory unit 22 or data read out from the memory circuit layers 22_1 to 22_N in the memory unit 22 between the CPU 10 and the memory unit 22 through the bus.

The row decoder 62 generates a signal for driving the word line driver 63. The word line driver 63 generates signals to be supplied to the write word line WWL and the read word line RWL. The column decoder 64 generates signals for driving the sense amplifier 67 and the write driver 65. The sense amplifier 67 amplifies the potential of the read bit line RBL. The write driver generates signals for controlling the read bit line RBL and the write bit line WBL. The precharge circuit 66 has a function of precharging the read bit line RBL or the like. The signal read out from the memory circuit 24 of the memory circuit layers 22_1 to 22_N in the memory unit 22 is input to the arithmetic circuit 23 and can be output through the selector 68. The selector 68 can sequentially read out data corresponding to the bus width and output necessary data to the CPU 10 or the like through the controller 61.

Figure 15B:
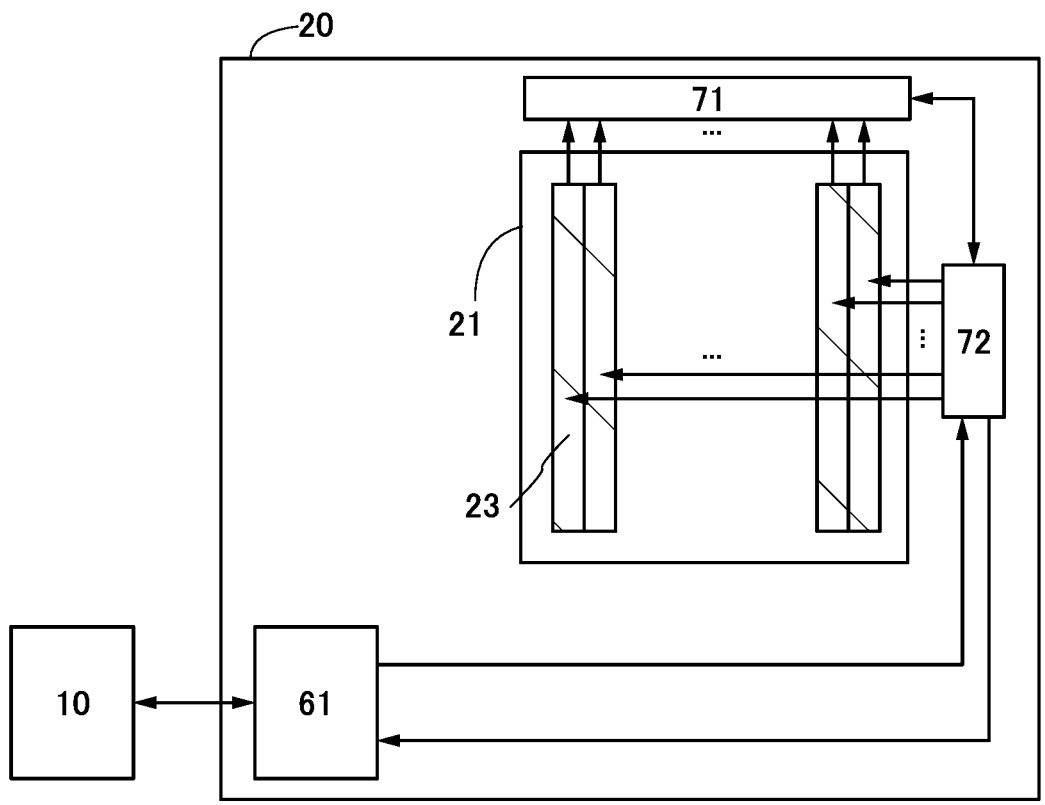

FIG. 15B is a diagram of blocks for controlling the arithmetic processing unit 21, which are extracted from the structure illustrated in FIG. 14B.

The controller 61 processes an input signal from the outside and generates a control signal of the arithmetic control circuit 72. The controller 61 generates a variety of signals for controlling the arithmetic circuit 23 included in the arithmetic processing unit 21. The controller 61 inputs and outputs data regarding the arithmetic result through the input buffer 71. With the use of the buffer memory, parallel calculation of the number of bits greater than the data bus width of the CPU is possible. Furthermore, the number of times of transferring an enormous number of weight parameters to/from the CPU 10 can be reduced, whereby power consumption can be reduced.

In one embodiment of the present invention, a semiconductor device functioning as an accelerator used for the AI technology or the like with an enormous amount of calculation and an enormous number of parameters can be downsized. Alternatively, in one embodiment of the present invention, the power consumption of a semiconductor device functioning as an accelerator used for the AI technology or the like with an enormous amount of calculation and an enormous number of parameters can be reduced. Alternatively, in one embodiment of the present invention, heat generation can be suppressed in a semiconductor device functioning as an accelerator used for the AI technology or the like with an enormous amount of calculation and an enormous number of parameters. Alternatively, in one embodiment of the present invention, in a semiconductor device functioning as an accelerator used for the AI technology or the like with an enormous amount of calculation and an enormous number of parameters, the number of times of data transfer between a CPU and a semiconductor device functioning as a memory can be reduced. In other words, a semiconductor device functioning as an accelerator used for the AI technology or the like with an enormous amount of calculation and an enormous number of parameters has a non-von Neumann architecture, and can perform parallel processing with extremely low power consumption as compared with a von Neumann architecture, in which power consumption increases with increasing processing speed.

Embodiment 2

In this embodiment, an example of operation of the case where the accelerator 20 executes part of arithmetic operation of a program executed by the CPU 10 described in the above embodiment is described.

Figure 16:
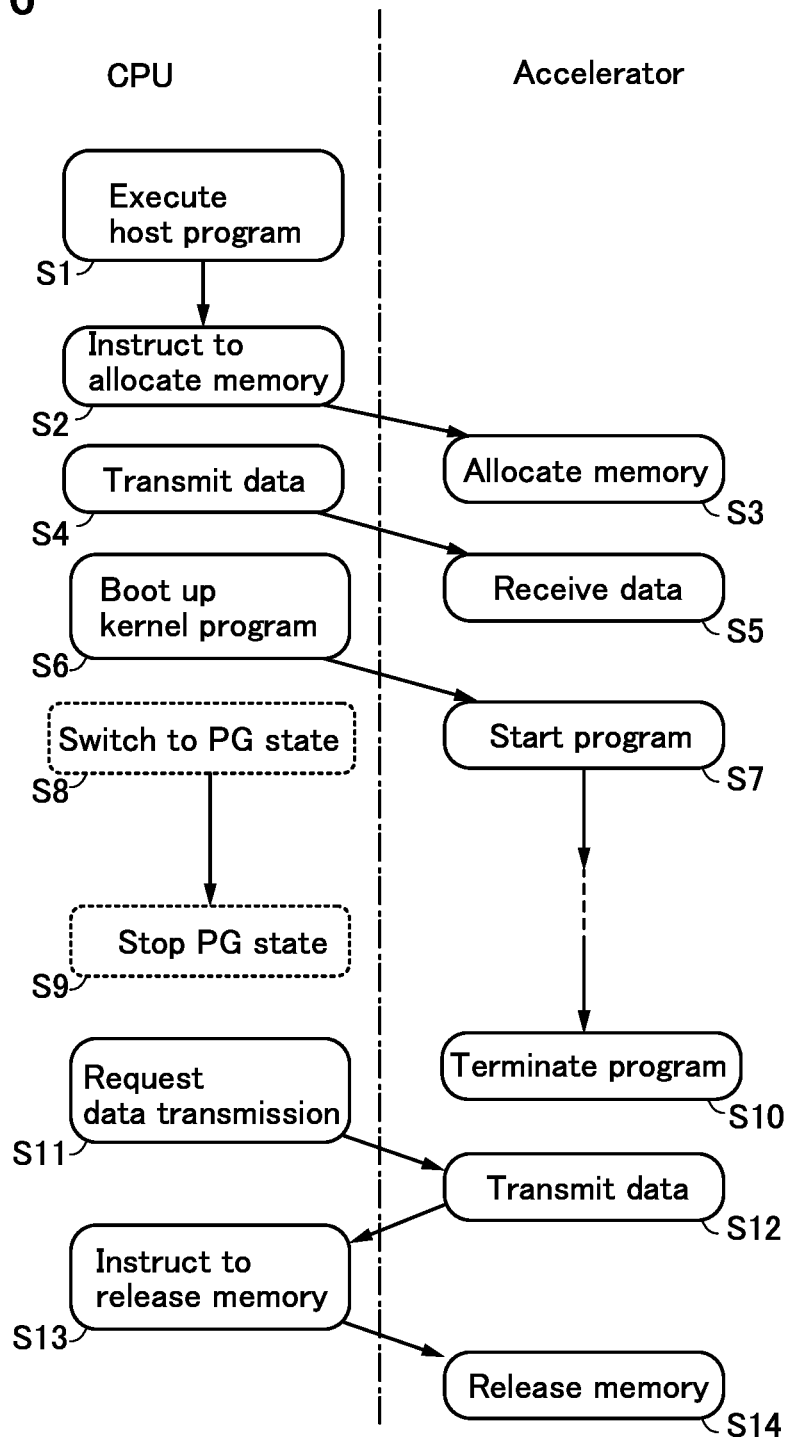
FIG. 16 shows a structure example of a semiconductor device.

FIG. 16 illustrates an example of operation of the case where the accelerator executes part of arithmetic operation of a program executed by the CPU.

The host program is executed by the CPU (Step S1).

In the case where the CPU confirms an instruction to allocate, to a memory portion, a region for data needed in performing arithmetic operation using the accelerator (Step S2), the CPU allocates the region for the data to the memory portion (Step S3). For example, in the case of Embodiment 1, data which the accelerator 20 needs in performing arithmetic operation in the arithmetic processing unit 21 is allocated to the memory unit 22.

Next, the CPU transmits input data from the main memory to the above-described memory portion (Step S4). The above-described memory portion receives the input data and stores the input data in the region allocated in Step S2 (Step S5).

In the case where the CPU confirms an instruction to boot up the kernel program (Step S6), the accelerator starts execution of the kernel program (Step S7).

Immediately after the accelerator starts the execution of the kernel program, the CPU may be switched from the state of performing arithmetic operation to a PG (power gating) state (Step S8). In that case, just before the accelerator terminates the execution of the kernel program, the CPU is switched from the PG state to a state of performing arithmetic operation (Step S9). By bringing the CPU into a PG state during the period from Step S8 to Step S9, the power consumption and heat generation of the semiconductor device as a whole can be suppressed.

When the accelerator terminates the execution of the kernel program, output data is stored in the above-described memory portion (Step S10).

After the execution of the kernel program is terminated, in the case where the CPU requests an instruction to transmit the output data stored in the memory portion to the main memory (Step S11), the accelerator transmits the output data to the main memory, and the output data is stored in the main memory (Step S12).

In the case where the CPU gives an instruction to release the region for the data allocated to the memory portion (Step S13), the region for data allocated to the above-described memory portion is released (Step S14).

By repeating the operations from Step S1 to Step S14 described above, part of the arithmetic operation of the program executed by the CPU can be executed by the accelerator while the power consumption and heat generation of the CPU and the accelerator are suppressed.

This embodiment can be combined with the description of the other embodiments as appropriate.

Embodiment 3

In this embodiment, an example of a CPU including a CPU core capable of power gating will be described.

Figure 17:
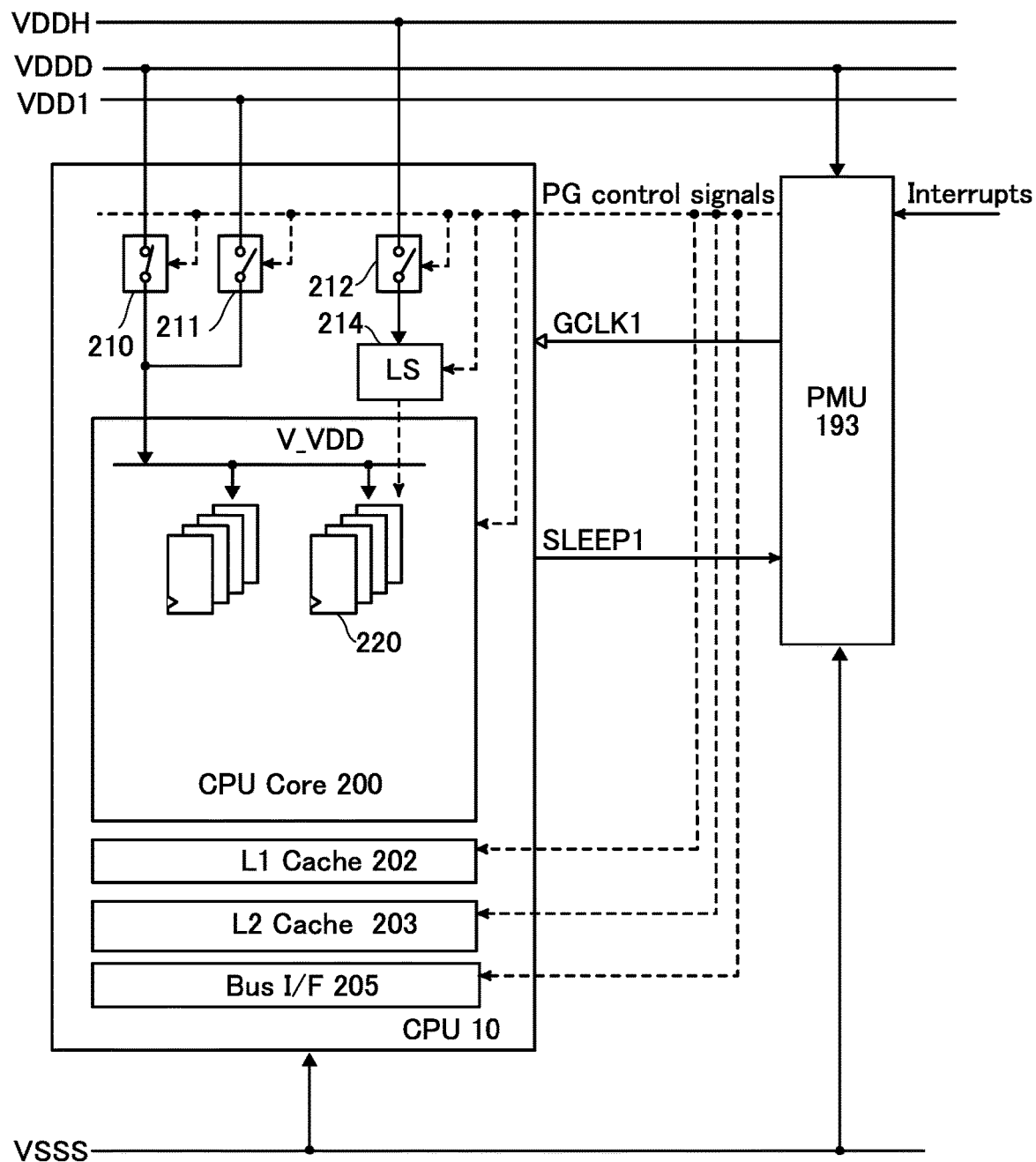
FIG. 17 is a diagram illustrating a structure example of a CPU.

FIG. 17 illustrates a structure example of the CPU 10. The CPU 10 includes a CPU core (CPU Core) 200, an L1 (level 1) cache memory device (L1 Cache) 202, an L2 cache memory device (L2 Cache) 203, a bus interface portion (Bus I/F) 205, power switches 210 to 212, and a level shifter (LS) 214. The CPU core 200 includes a flip-flop 220.

Through the bus interface portion 205, the CPU core 200, the L1 cache memory device 202, and the L2 cache memory device 203 are mutually connected to one another.

A PMU 193 generates a clock signal GCLK1 and various PG (power gating) control signals in response to signals such as an interrupt signal (Interrupts) input from the outside and a signal SLEEP1 issued from the CPU 10. The clock signal GCLK1 and the PG control signal are input to the CPU 10. The PG control signal controls the power switches 210 to 212 and the flip-flop 220.

The power switches 210 and 211 control application of voltages VDDD and VDD1 to a virtual power supply line V_VDD (hereinafter referred to as a V_VDD line), respectively. The power switch 212 controls application of a voltage VDDH to a virtual power supply line V_VDH (hereinafter referred to as a V_VDH line). A voltage VSSS is input to the CPU 10 and the PMU 193 without through the power switches. The voltage VDDD is input to the PMU 193 without through the power switches.

The voltages VDDD and VDD1 are driving voltages for a CMOS circuit. The voltage VDD1 is lower than the voltage VDDD and is a driving voltage in a sleep state. The voltage VDDH is a driving voltage for an OS transistor and is higher than the voltage VDDD.

The L1 cache memory device 202, the L2 cache memory device 203, and the bus interface portion 205 each include at least a power domain capable of power gating. The power domain capable of power gating is provided with one or a plurality of power switches. These power switches are controlled by the PG control signal.

The flip-flop 220 is used for a register. The flip-flop 220 is provided with a backup circuit. The flip-flop 220 is described below.

Figure 18A:
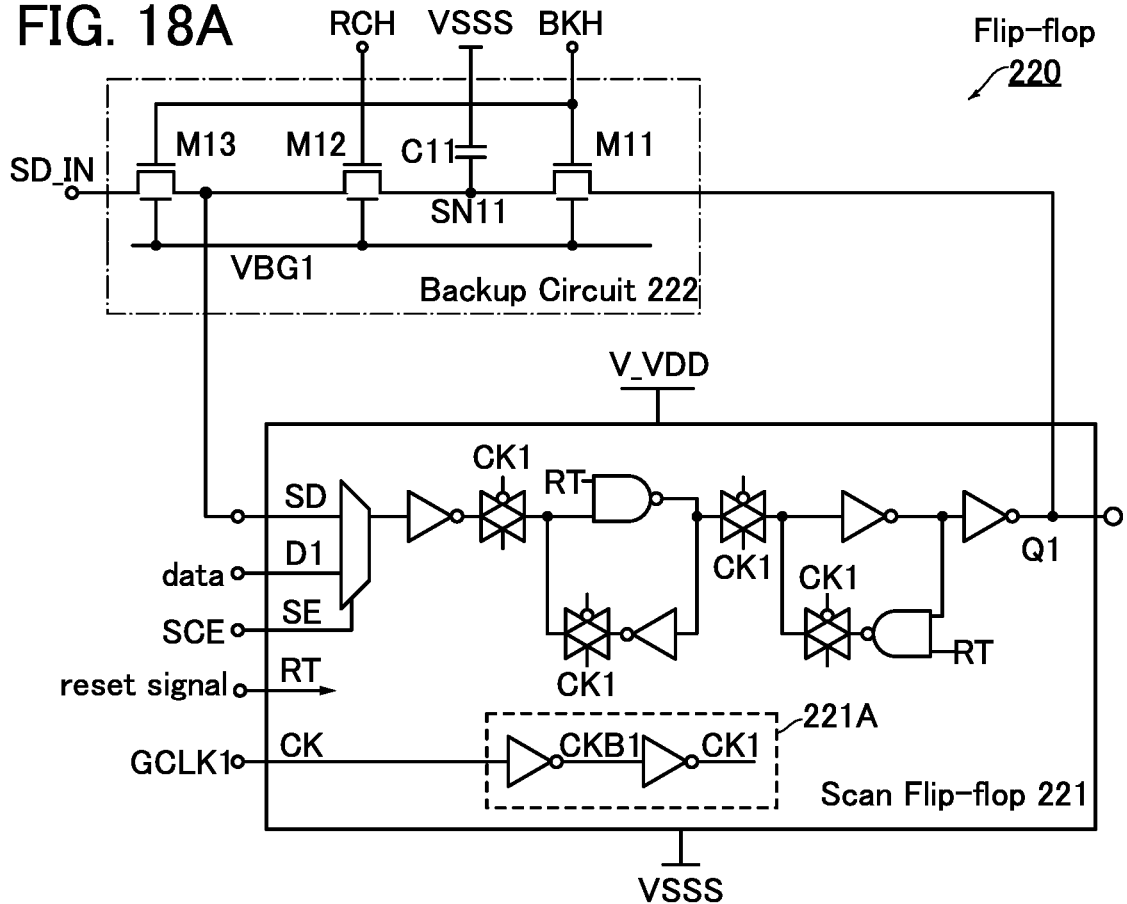
FIG. 18A and FIG. 18B are diagrams each illustrating a structure example of a CPU.

FIG. 18A shows a circuit structure example of the flip-flop 220. The flip-flop 220 includes a scan flip-flop 221 and a backup circuit 222.

The scan flip-flop 221 includes nodes D1, Q1, SD, SE, RT, and CK and a clock buffer circuit 221A.

The node D1 is a data input node, the node Q1 is a data output node, and the node SD is a scan test data input node. The node SE is a signal SCE input node. The node CK is a clock signal GCLK1 input node. The clock signal GCLK1 is input to the clock buffer circuit 221A. Respective analog switches in the scan flip-flop 221 are connected to nodes CK1 and CKB1 of the clock buffer circuit 221A. The node RT is a reset signal input node.

The signal SCE is a scan enable signal, which is generated in the PMU 193. The PMU 193 generates signals BK and RC. The level shifter 214 level-shifts the signals BK and RC to generate signals BKH and RCH. The signals BK and RC are a backup signal and a recovery signal.

The circuit structure of the scan flip-flop 221 is not limited to that in FIG. 18A. A scan flip-flop prepared in a standard circuit library can be applied.

The backup circuit 222 includes nodes SD_IN. and SN11, transistors M11 to M13, and a capacitor C11.

The node SD_IN is a scan test data input node and is connected to the node Q1 of the scan flip-flop 221. The node SN11 is a retention node of the backup circuit 222. The capacitor C11 is a storage capacitor for retaining the voltage of the node SN11.

The transistor M11 controls continuity between the node Q1 and the node SN11. The transistor M12 controls continuity between the node SN11 and the node SD. The transistor M13 controls continuity between the node SD_IN and the node SD. The on/off of the transistors M11 and M13 is controlled by the signal BKH, and the on/off of the transistor M12 is controlled by the signal RCH.

The transistors M11 to M13 are OS transistors, like transistors 25 to 27 included in the memory circuit 24. The transistors M11 to M13 have back gates in the illustrated structure. The back gates of the transistors M11 to M13 are connected to a power supply line for supplying a voltage VBG1.

At least the transistors M11 and M12 are preferably OS transistors. Because of an extremely low off-state current, which is a feature of the OS transistor, a decrease in the voltage of the node SN11 can be suppressed and almost no power is consumed to retain data; therefore, the backup circuit 222 has a nonvolatile characteristic. Data is rewritten by charging and discharging of the capacitor C11; hence, there is theoretically no limitation on rewrite cycles of the backup circuit 222, and data can be written and read out with low energy.

Figure 18B:
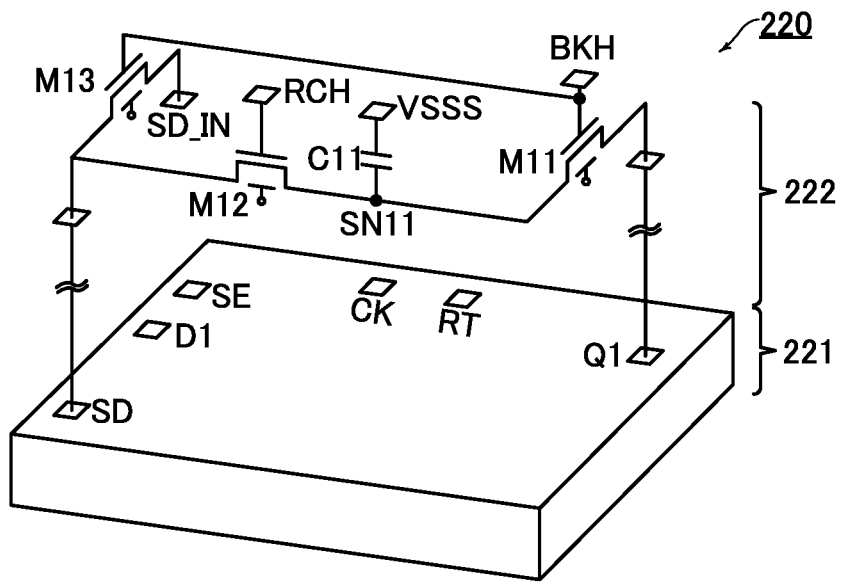

All of the transistors in the backup circuit 222 are extremely preferably OS transistors. As illustrated in FIG. 18B, the backup circuit 222 can be stacked on the scan flip-flop 221 configured with a silicon CMOS circuit.

The number of elements in the backup circuit 222 is much smaller than the number of elements in the scan flip-flop 221; thus, there is no need to change the circuit structure and layout of the scan flip-flop 221 in order to stack the backup circuit 222. That is, the backup circuit 222 is a backup circuit that has very broad utility. In addition, the backup circuit 222 can be provided in a region where the scan flip-flop 221 is formed; thus, even when the backup circuit 222 is incorporated, the area overhead of the flip-flop 220 can be zero. Thus, the backup circuit 222 is provided in the flip-flop 220, whereby power gating of the CPU core 200 is enabled. The power gating of the CPU core 200 is enabled with high efficiency owing to little energy necessary for the power gating.

When the backup circuit 222 is provided, parasitic capacitance due to the transistor M11 is added to the node Q1. However, the parasitic capacitance is lower than parasitic capacitance due to a logic circuit connected to the node Q1; thus, there is no influence of the parasitic capacitance on the operation of the scan flip-flop 221. That is, even when the backup circuit 222 is provided, the performance of the flip-flop 220 does not substantially decrease.

The CPU core 200 can be set to a clock gating state, a power gating state, or a resting state as a low power consumption state. The PMU 193 selects the low power consumption mode of the CPU core 200 on the basis of the interrupt signal, the signal SLEEP1, and the like. For example, in the case of transition from a normal operation state to a clock gating state, the PMU 193 stops generation of the clock signal GCLK1.

For example, in the case of transition from a normal operation state to a resting state, the PMU 193 performs voltage and/or frequency scaling. For example, when the voltage scaling is performed, the PMU 193 turns off the power switch 210 and turns on the power switch 211 to input the voltage VDD1 to the CPU core 200. The voltage VDD1 is a voltage at which data in the scan flip-flop 221 is not lost. When the frequency scaling is performed, the PMU 193 reduces the frequency of the clock signal GCLK1.

In the case where the CPU core 200 transitions from a normal operation state to a power gating state, data in the scan flip-flop 221 is backed up to the backup circuit 222. When the CPU core 200 is returned from the power gating state to the normal operation state, recovery operation of writing back data in the backup circuit 222 to the scan flip-flop 221 is performed.

Figure 19:
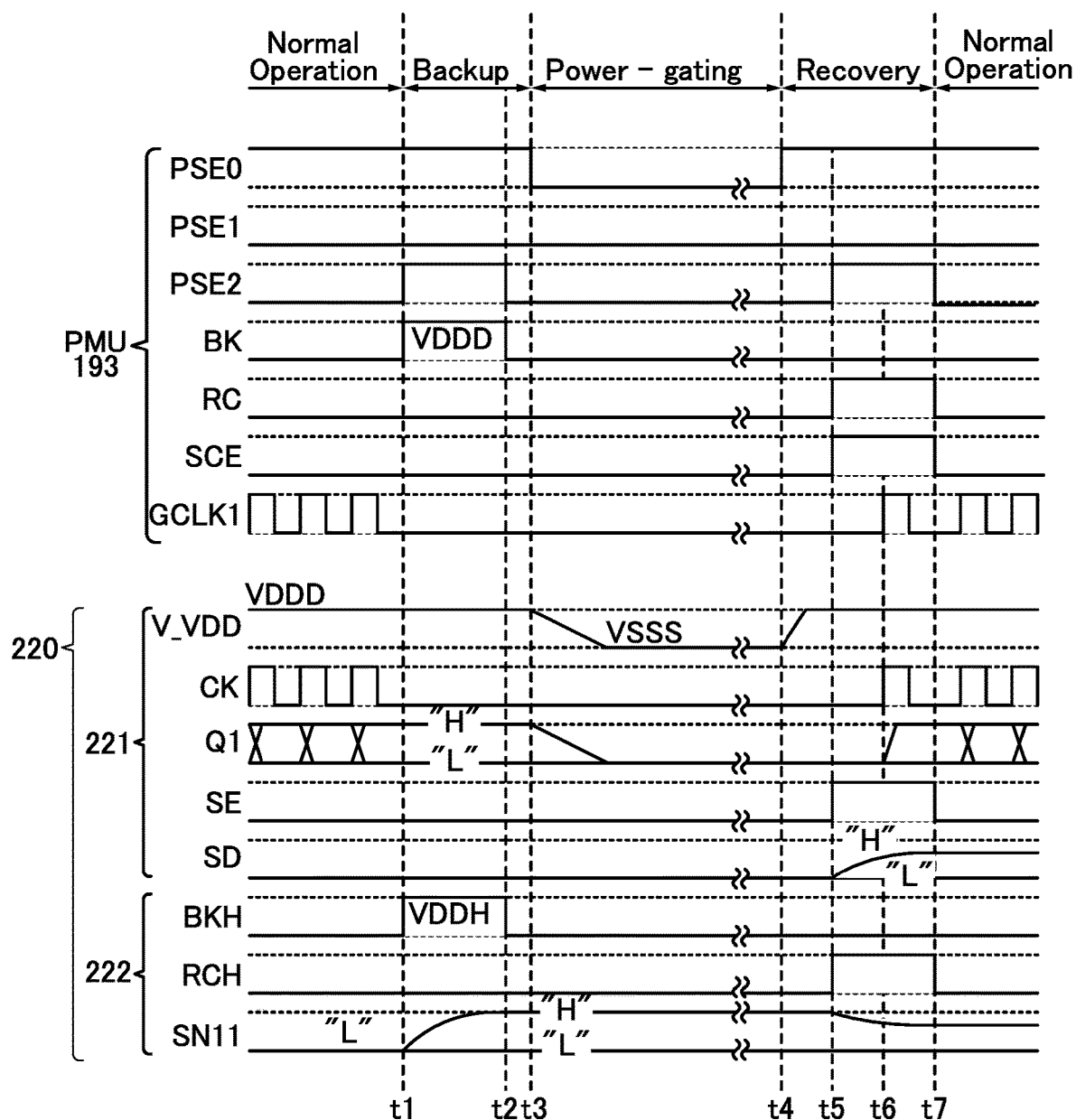
FIG. 19 shows a configuration example of a CPU.

FIG. 19 illustrates an example of the power gating sequence of the CPU core 200. Note that in FIGS. 19, t1 to t7 represent the time. Signals PSE0 to PSE2 are control signals of the power switches 210 to 212, which are generated in the PMU 193. When the signal PSE0 is at "H"/"L", the power switch 210 is on/off. The same applies also to the signals PSE1 and PSE2.

Until time t1, a normal operation is performed. The power switch 210 is on, and the voltage VDDD is input to the CPU core 200. The scan flip-flop 221 performs the normal operation. At this time, the level shifter 214 does not need to be operated; thus, the power switch 212 is off and the signals SCE, BK, and RC are each at "L". The node SE is at "L"; thus, the scan flip-flop 221 stores data in the node D1. Note that in the example of FIG. 19, the node SN11 of the backup circuit 222 is at "L" at time t1.

A backup operation is described. At operation time t1, the PMU 193 stops the clock signal GCLK1 and sets the signals PSE2 and BK at "H". The level shifter 214 becomes active and outputs the signal BKH at "H" to the backup circuit 222.

The transistor M11 in the backup circuit 222 is turned on, and data in the node Q1 of the scan flip-flop 221 is written to the node SN11 of the backup circuit 222. When the node Q1 of the scan flip-flop 221 is at "L", the node SN11 remains at "L", whereas when the node Q1 is at "H", the node SN11 becomes "H".

The PMU 193 sets the signals PSE2 and BK at "L" at time t2 and sets the signal PSE0 at "L" at time t3. The state of the CPU core 200 transitions to a power gating state at time t3. Note that at the timing when the signal BK falls, the signal PSE0 may fall.

A power-gating operation is described. When the signal PSE0 is set at "L, data in the node Q1 is lost because the voltage of the V_VDD line decreases. The node SN11 retains data that is stored in the node Q1 at time t3.

A recovery operation is described. When the PMU 193 sets the signal PSE0 at "H" at time t4, the power gating state transitions to a recovery state. Charging of the V_VDD line starts, and the PMU 193 sets the signals PSE2, RC, and SCE at "H" in a state where the voltage of the V_VDD line becomes VDDD (at time t5).

The transistor M12 is turned on, and electric charge in the capacitor C11 is distributed to the node SN11 and the node SD. When the node SN11 is at "H", the voltage of the node SD increases. The node SE is at "H", and thus, data in the node SD is written to a latch circuit on the input side of the scan flip-flop 221. When the clock signal GCLK1 is input to the node CK at time t6, data in the latch circuit on the input side is written to the node Q1. That is, data in the node SN11 is written to the node Q1.

When the PMU 193 sets the signals PSE2, SCE, and RC at "L" at time t7, the recovery operation is terminated.

The backup circuit 222 using an OS transistor is extremely suitable for normally-off computing because both dynamic power consumption and static power consumption are low. Even when the flip-flop 220 is mounted, a decrease in the performance and an increase in the dynamic power of the CPU core 200 can be made hardly to occur.

Note that the CPU core 200 may include a plurality of power domains capable of power gating. In the plurality of power domains, one or a plurality of power switches for controlling voltage input are provided. In addition, the CPU core 200 may include one or a plurality of power domains where power gating is not performed. For example, the power domain where power gating is not performed may be provided with a power gating control circuit for controlling the flip-flop 220 and the power switches 210 to 212.

Note that the application of the flip-flop 220 is not limited to the CPU 10. In the arithmetic device, the flip-flop 220 can be used as the register provided in a power domain capable of power gating.

This embodiment can be combined with the description of the other embodiments as appropriate.

Embodiment 4

Examples of the semiconductor device of the above embodiment will be described below with reference to FIG. 20 to FIG. 25. First, a structure example of a memory circuit (a memory cell) included in the memory device is described.

Structure Example of Memory Circuit

Figure 20A:
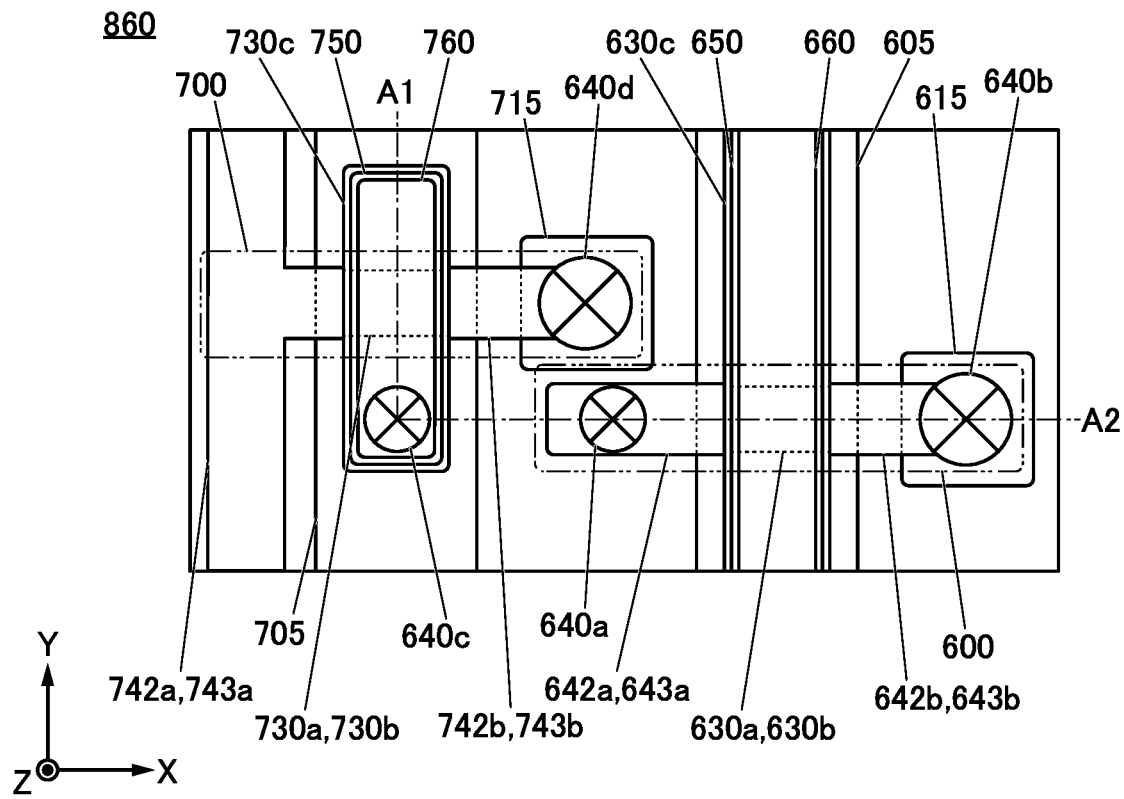
FIG. 20A and FIG. 20B are a top view and a cross-sectional view of a memory device of one embodiment of the present invention.
Figure 20B:
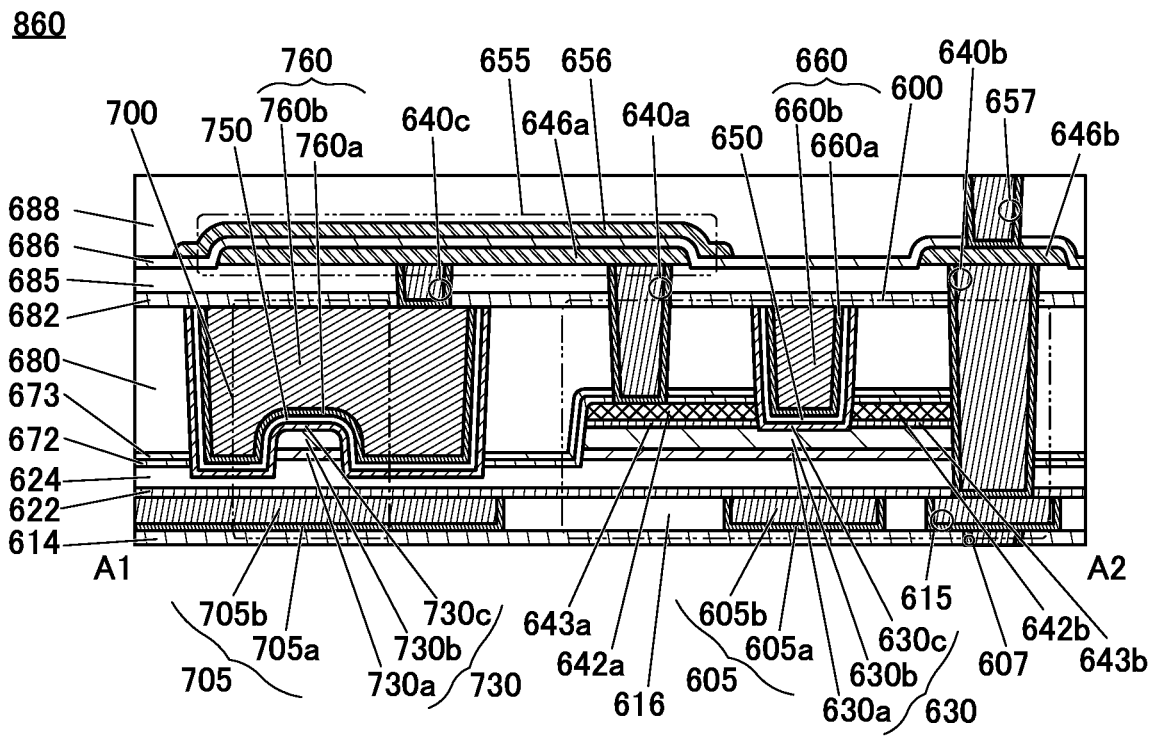

FIG. 20A and FIG. 20B illustrate the structure of a memory circuit 860 included in the semiconductor device of one embodiment of the present invention. FIG. 20A is a top view of the memory circuit 860 and its periphery. FIG. 20B is a cross-sectional view of the memory circuit 860, and FIG. 20B corresponds to a portion indicated by a dashed-dotted line A1-A2 in FIG. 20A. FIG. 20B illustrates a cross section of a transistor 600 in the channel length direction and a cross section of a transistor 700 in the channel width direction. Note that for clarity of the drawing, some components are omitted in the top view in FIG. 20A. Note that the X direction, the Y direction, and the Z direction illustrated in FIG. 20A are directions orthogonal to or intersecting with each other. Here, it is preferable that the X direction and the Y direction be parallel or substantially parallel to a substrate surface and the Z direction be perpendicular or substantially perpendicular to the substrate surface.

The memory circuit 860 described in this embodiment includes the transistor 600, the transistor 700, and a capacitor 655. The memory circuit 860 corresponds to the memory circuit 24 described in the above embodiment, and the transistor 600, the transistor 700, the capacitor 655 correspond to the transistor 25, the transistor 26, and the capacitor 28 described in Embodiment 1, respectively; and the memory circuit 860 corresponds to a 2T NOSRAM without including the transistor 27. Thus, one of a source and a drain of the transistor 600, a gate of the transistor 700, and one electrode of the capacitor 655 are electrically connected to each other.

As illustrated in FIG. 20A and FIG. 20B, in the memory circuit 860, the transistor 600 and the transistor 700 are placed over an insulator 614; an insulator 680 is placed over part of the transistor 600 and part of the transistor 700; an insulator 682 is placed over the transistor 600, the transistor 700, and the insulator 680; an insulator 685 is placed over the insulator 682; the capacitor 655 is placed over the insulator 685; and an insulator 688 is placed over the capacitor 655. The insulator 614, the insulator 680, the insulator 682, the insulator 685, and the insulator 688 function as interlayer films.

Here, the transistor 600 includes an insulator 616 over the insulator 614; conductors 605 (a conductor 605a and a conductor 605b) placed to be embedded in the insulator 616; an insulator 622 over the insulator 616 and the conductor 605; an insulator 624 over the insulator 622; an oxide 630a over the insulator 624; an oxide 630b over the oxide 630a; an oxide 643a and an oxide 643b over the oxide 630b; a conductor 642a over the oxide 643a; a conductor 642b over the oxide 643b; an insulator 672 in contact with part of the insulator 624, a side surface of the oxide 630a, a side surface of the oxide 630b, a side surface of the oxide 643a, a side surface of the conductor 642a, a top surface of the conductor 642a, a side surface of the oxide 643b, a side surface of the conductor 642b, and a top surface of the conductor 642b; an insulator 673 over the insulator 672; an oxide 630c over the oxide 630b; an insulator 650 over the oxide 630c; and conductors 660 (a conductor 660a and a conductor 660b) that are positioned over the insulator 650 and overlap with the oxide 630c. The oxide 630c is in contact with the side surface of the oxide 643a, the side surface of the oxide 643b, the side surface of the conductor 642a, and the side surface of the conductor 642b. Here, as illustrated in FIG. 20B, a top surface of the conductor 660 is placed to be substantially aligned with a top surface of the insulator 650, a top surface of the oxide 630c, and a top surface of the insulator 680. The insulator 682 is in contact with the top surfaces of the conductor 660, the insulator 650, the oxide 630c, and the insulator 680.

Hereinafter, the oxide 630a, the oxide 630b, and the oxide 630c may be collectively referred to as an oxide 630. The oxide 643a and the oxide 643b may be collectively referred to as an oxide 643. The conductor 642a and the conductor 642b may be collectively referred to as a conductor 642.

In the transistor 600, the conductor 660 functions as a gate, and the conductor 642a and the conductor 642b function as a source and a drain. The conductor 605 functions as a back gate. In the transistor 600, the conductor 660 functioning as a gate is formed in a self-aligned manner to fill an opening formed in the insulator 680 and the like. As described above, in the semiconductor device of this embodiment, the conductor 660 can be surely placed in a region between the conductor 642a and the conductor 642b without position alignment.

The transistor 700 includes the insulator 616 over the insulator 614; conductors 705 (a conductor 705a and a conductor 705b) placed to be embedded in the insulator 616; the insulator 622 over the insulator 616 and the conductor 705; the insulator 624 over the insulator 622; an oxide 730a over the insulator 624; an oxide 730b over the oxide 730a; an oxide 743a and an oxide 743b over the oxide 730b; a conductor 742a over the oxide 743a; a conductor 742b over the oxide 743b; the insulator 672 in contact with part of the insulator 624, a side surface of the oxide 730a, a side surface of the oxide 730b, a side surface of the oxide 743a, a side surface of the conductor 742a, a top surface of the conductor 742a, a side surface of the oxide 743b, a side surface of the conductor 742b, and a top surface of the conductor 742b; an insulator 673 over the insulator 672; an oxide 730c over the oxide 730b; an insulator 750 over the oxide 730c; and conductors 760 (a conductor 760a and a conductor 760b) that are positioned over the insulator 750 and overlap with the oxide 730c. The oxide 730c is in contact with the side surface of the oxide 743a, the side surface of the oxide 743b, the side surface of the conductor 742a, and the side surface of the conductor 742b. Here, as illustrated in FIG. 20B, a top surface of the conductor 760 is placed to be substantially aligned with a top surface of the insulator 750, a top surface of the oxide 730c, and the top surface of the insulator 680. The insulator 682 is in contact with the top surfaces of the conductor 760, the insulator 750, the oxide 730c, and the insulator 680.

Hereinafter, the oxide 730a, the oxide 730b, and the oxide 730c may be collectively referred to as an oxide 730. The oxide 743a and the oxide 743b may be collectively referred to as an oxide 743. The conductor 742a and the conductor 742b may be collectively referred to as a conductor 742.

In the transistor 700, the conductor 760 functions as a gate, and the conductor 742a and the conductor 742b function as a source and a drain. The conductor 705 functions as a back gate. In the transistor 700, the conductor 760 functioning as a gate is formed in a self-aligned manner to fill an opening formed in the insulator 680 and the like. As described above, in the semiconductor device of this embodiment, the conductor 760 can be surely placed in a region between the conductor 742a and the conductor 742b without position alignment.

Here, the transistor 700 and the transistor 600 are formed in the same layer and have similar structures. Thus, although a cross section of the transistor 700 in the channel length direction is not illustrated, the cross section has a structure similar to that of the cross section of the transistor 600 in the channel length direction illustrated in FIG. 20B. That is, the oxide 743 and the conductor 742, which are not illustrated in the cross-sectional view, have structures similar to those of the oxide 643 and the conductor 642 illustrated in FIG. 20B. Note that although a cross section of the transistor 600 in the channel width direction is not illustrated, the cross section has a structure similar to that of the cross section of the transistor 700 in the channel width direction illustrated in FIG. 20B.

Thus, the oxide 730 has a structure similar to that of the oxide 630 and the description of the oxide 630 can be referred to. The conductor 705 has a structure similar to that of the conductor 605, and thus the description of the conductor 605 can be referred to. The oxide 743 has a structure similar to that of the oxide 643, and thus the description of the oxide 643 can be referred to. The conductor 742 has a structure similar to that of the conductor 642, and thus the description of the conductor 642 can be referred to. The insulator 750 has a structure similar to that of the insulator 650, and thus the description of the insulator 650 can be referred to. The conductor 760 has a structure similar to that of the conductor 660, and thus the description of the conductor 660 can be referred to. Unless otherwise specified, as described above, the description of the structure of the transistor 600 can be referred to for the structure of the transistor 700 in the following description.

Here, in the transistor 600 and the transistor 700, a metal oxide functioning as an oxide semiconductor (hereinafter also referred to as an oxide semiconductor) is preferably used as the oxide 630 and the oxide 730 each including a region where a channel is formed (hereinafter also referred to as a channel formation region).

For example, a metal oxide having an energy gap of 2 eV or more, preferably 2.5 eV or more is preferably used as the metal oxide functioning as an oxide semiconductor. With the use of a metal oxide having a wide energy gap, the leakage current in the non-conduction state (off-state current) of the transistor 600 can be extremely low.

As an oxide semiconductor, a metal oxide such as an In-M-Zn oxide (an element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, an In-M oxide, an In—Zn oxide, or an M-Zn oxide may be used as the oxide semiconductor.

The transistor 600 and the transistor 700 using an oxide semiconductor in their channel formation regions have an extremely low off-state current; thus, a semiconductor device with low power consumption can be provided. The off-state current of each of the transistor 600 and the transistor 700 hardly increases even in a high-temperature environment. Specifically, the off-state current hardly increases even at an environment temperature higher than or equal to room temperature and lower than or equal to 200° C. Thus, a semiconductor device can achieve stable operation and high reliability even in a high temperature environment.

Since the off-state current of the transistor 600 is extremely low, the capacitance value of the capacitor 655 can be set small. Accordingly, the area occupied by the memory circuit 860 can be small and integration of the semiconductor device can be achieved.

As illustrated in FIG. 20A, the conductor 742a, the conductor 660, the conductor 605, and the conductor 705 preferably extend in the Y direction. The conductor 660 functions as the write word line WWL described in the above embodiment.

The capacitor 655 includes a conductor 646a over the insulator 685, an insulator 686 covering the conductor 646a, and a conductor 656 placed over the insulator 686 to overlap with at least part of the conductor 656. Here, the conductor 646a functions as the one electrode of the capacitor 655 and a conductor 646b functions as the other electrode of the capacitor 655. The insulator 686 functions as a dielectric of the capacitor 655.

In addition, openings are formed in the insulator 622, the insulator 624, the insulator 672, the insulator 673, the insulator 680, the insulator 682, and the insulator 685, and conductors 640 (a conductor 640a, a conductor 640b, a conductor 640c, and a conductor 640d) functioning as plugs are embedded in the openings. The conductor 640 is provided so as to be exposed on a top surface of the insulator 685.

A bottom surface of the conductor 640a is in contact with the conductor 642a and a top surface is in contact with the conductor 646a. A bottom surface of the conductor 640c is in contact with the conductor 760 and a top surface is in contact with the conductor 646a. In this manner, one of the source and the drain of the transistor 600, the gate of the transistor 700, and the one electrode of the capacitor 655 are electrically connected to each other.

The conductor 640b is provided in contact with a side surface of the conductor 642b. A conductor 615 and a conductor 607 are provided below the conductor 640b, and the conductor 646b and a conductor 657 are provided above the conductor 640b. The conductor 607 is provided in an opening formed in the insulator 614. Here, the conductor 615 and the conductor 605 are formed in the same layer and have similar structures. The conductor 646b and the conductor 646a are formed in the same layer and have similar structures. The conductor 657 is provided in an opening formed in the insulator 686 and the insulator 688.

The conductor 640b is electrically connected to the conductor 640b of the memory circuit 860 in the lower layer through the conductor 607 and the conductor 615. The conductor 640b is electrically connected to the conductor 640b of the memory circuit 860 in the upper layer through the conductor 646b and the conductor 657. As described above, the conductor 607, the conductor 615, the conductor 640b, the conductor 646b, and the conductor 657 extend in the Z direction and function as the write bit line WBL described in the above embodiment.

Although not illustrated in the cross-sectional view, the conductor 640d is provided in contact with the side surface of the conductor 742b. A conductor 715 is provided below the conductor 640d. A conductor having a structure similar to that of the conductor 607, the conductor 646b, and the conductor 657 is provided, and the conductor 640d is electrically connected to the conductors 640d in an upper layer and a lower layer. As described above, the conductor 715, the conductor 640d, and the like extend in the Z direction and function as the read bit line RBL described in the above embodiment.

In the case where the transistor 600 and the transistor 700 are formed in the same layer as illustrated in FIG. 20B, the transistor 600 and the transistor 700 can be formed in the same step. Therefore, the manufacturing process of the semiconductor device can be shortened and productivity can be improved.

Note that although the transistor 600, the transistor 700, and the capacitor 655 in the memory circuit 860 are provided such that the channel length direction of the transistor 600 and the channel length direction of the transistor 700 are parallel to each other, the semiconductor device described in this embodiment is not limited thereto. The memory circuit 860 illustrated in FIG. 20 and the like is a structure example of the semiconductor device, and the transistors, capacitors, or the like having appropriate structures are placed as appropriate depending on a circuit structure or a driving method.

[Detailed Structure of Memory Circuit]

A detailed structure of the memory circuit 860 of one embodiment of the present invention will be described below. Hereinafter, the description of the components of the transistor 600 can be referred to for the components of the transistor 700.

As illustrated in FIG. 20B, the oxide 630 preferably includes the oxide 630a over the insulator 624, the oxide 630b over the oxide 630a, and the oxide 630c that is placed over the oxide 630b and is at least partly in contact with a top surface of the oxide 630b. Here, a side surface of the oxide 630c is preferably provided in contact with the oxide 643a, the oxide 643b, the conductor 642a, the conductor 642b, the insulator 672, the insulator 673, and the insulator 680.

That is, the oxide 630 includes the oxide 630a, the oxide 630b over the oxide 630a, and the oxide 630c over the oxide 630b. Including the oxide 630a under the oxide 630b makes it possible to inhibit diffusion of impurities into the oxide 630b from the components formed below the oxide 630a. Moreover, including the oxide 630c over the oxide 630b makes it possible to inhibit diffusion of impurities into the oxide 630b from the components formed above the oxide 630c.

Note that the transistor 600 has a structure in which three layers of the oxide 630a, the oxide 630b, and the oxide 630c are stacked in a channel formation region and its vicinity; however, the present invention is not limited thereto. For example, a single layer of the oxide 630b, a two-layer structure of the oxide 630b and the oxide 630a, a two-layer structure of the oxide 630b and the oxide 630c, or a stacked-layer structure of four or more layers may be employed. For example, a stacked-layer structure of four layers including the oxide 630c with a two-layer structure may be provided.

In addition, the oxide 630 preferably has a stacked-layer structure of a plurality of oxide layers which differ in the atomic ratio of metal atoms. Specifically, the atomic proportion of the element M in the constituent elements in the metal oxide used as the oxide 630a is preferably higher than the atomic proportion of the element M in the constituent elements in the metal oxide used as the oxide 630b. In addition, the atomic ratio of the element M to In in the metal oxide used as the oxide 630a is preferably higher than the atomic ratio of the element M to In in the metal oxide used as the oxide 630b. Furthermore, the atomic ratio of In to the element M in the metal oxide used as the oxide 630b is preferably higher than the atomic ratio of In to the element M in the metal oxide used as the oxide 630a. A metal oxide that can be used as the oxide 630a or the oxide 630b can be used as the oxide 630c. Note that the atomic ratio of In to the element M in the metal oxide used as the oxide 630c may be greater than the atomic ratio of In to the element M in the metal oxide used as the oxide 630b.

Specifically, as the oxide 630a, a metal oxide having In:Ga:Zn=1:3:4 [atomic ratio] or a composition that is a neighborhood thereof or 1:1:0.5 [atomic ratio] or a composition that is a neighborhood thereof is used.

As the oxide 630b, a metal oxide having In:Ga:Zn=4:2:3 [atomic ratio] or a composition that is a neighborhood thereof or 1:1:1 [atomic ratio] or a composition that is a neighborhood thereof is used. As the oxide 630b, a metal oxide having In:Ga:Zn=5:1:3 [atomic ratio] or a composition that is a neighborhood thereof or In:Ga:Zn=10:1:3 [atomic ratio] or a composition that is a neighborhood thereof may be used. As the oxide 630b, an In—Zn oxide (e.g., In:Zn=2:1 [atomic ratio] or a composition that is a neighborhood thereof, In:Zn=5:1 [atomic ratio] or a composition that is a neighborhood thereof, or In:Zn=10:1 [atomic ratio] or a composition that is a neighborhood thereof) may be used. As the oxide 630b, an In oxide may be used.

As the oxide 630c, a metal oxide having In:Ga:Zn=1:3:4 [atomic ratio or a composition that is a neighborhood thereof], Ga:Zn=2:1 [atomic ratio] or a composition that is a neighborhood thereof, or Ga:Zn=2:5 [atomic ratio] or a composition that is a neighborhood thereof is used. A single layer or stacked layers of the material that can be used for the oxide 630b may be used for the oxide 630c. Specific examples of the oxide 630c having a stacked-layer structure include a stacked-layer structure of In:Ga:Zn=4:2:3 [atomic ratio] or a composition that is a neighborhood thereof and In:Ga:Zn=1:3:4 [atomic ratio] or a composition that is a neighborhood thereof, a stacked-layer structure of Ga:Zn=2:1 [atomic ratio] or a composition that is a neighborhood thereof and In:Ga:Zn=4:2:3 [atomic ratio] or a composition that is a neighborhood thereof, a stacked-layer structure of Ga:Zn=2:5 [atomic ratio] or a composition that is a neighborhood thereof and In:Ga:Zn=4:2:3 [atomic ratio] or a composition that is a neighborhood thereof, and a stacked-layer structure of gallium oxide and In:Ga:Zn=4:2:3 [atomic ratio] or a composition that is a neighborhood thereof.

Moreover, an increase in the proportion of indium in the oxides 630b and 630c can increase the on-state current, field-effect mobility, or the like of the transistor, which is preferable. The above-described composition that is a neighborhood includes ±30% of an intended atomic ratio.

Furthermore, the composition of elements contained in a metal oxide may be changed depending on operation frequency or the like required for a transistor. For example, a metal oxide of a transistor included in a memory circuit may have In:Ga:Zn=4:2:3 [atomic ratio] or a composition that is a neighborhood thereof, and a metal oxide of another transistor may have In:Ga:Zn=5:1:3 [atomic ratio] or a composition that is a neighborhood thereof. Note that a metal oxide of the other transistor may have In:Ga:Zn=10:1:3 [atomic ratio] or a composition that is a neighborhood thereof or In:Zn=2:1 [atomic ratio] or a composition that is a neighborhood thereof.

The oxide 630b may have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit extraction of oxygen from the oxide 630b by the source electrode or the drain electrode. In addition, the amount of oxygen extracted from the oxide 630b can be reduced even when heat treatment is performed; thus, the transistor 600 is stable at high temperatures (what is called thermal budget) in a manufacturing process.

In addition, the oxide 630c is preferably provided in the opening provided in the interlayer films including the insulator 680. Thus, the insulator 650 and the conductor 660 include a region that overlaps with a stacked-layer structure of the oxide 630b and the oxide 630a with the oxide 630c therebetween. With this structure, the oxide 630c and the insulator 650 can be sequentially deposited and thus, the interface between the oxide 630 and the insulator 650 can be kept clean. Thus, the influence of interface scattering on carrier conduction is small, and the transistor 600 can have a high on-state current and excellent frequency characteristics.

An oxide semiconductor with a low carrier concentration is preferably used as the oxide 630 (e.g., the oxide 630b). In the case where the carrier concentration of the oxide semiconductor is lowered, the impurity concentration in the oxide semiconductor is lowered to decrease the density of defect states. In this specification and the like, a state with a low impurity concentration and a low density of defect states is referred to as a highly purified intrinsic or substantially highly purified intrinsic state. Examples of the impurities in the oxide semiconductor include hydrogen, nitrogen, alkali metal, alkaline earth metal, iron, nickel, and silicon.

In particular, hydrogen contained in an oxide semiconductor reacts with oxygen bonded to a metal atom to be water, and thus sometimes forms an oxygen vacancy (also referred to as Vo) in the oxide semiconductor. In some cases, a defect where hydrogen enters an oxygen vacancy (hereinafter, sometimes referred to as VoH) functions as a donor and generates an electron serving as a carrier. In other cases, bonding of part of hydrogen to oxygen bonded to a metal atom generates electrons serving as carriers. Thus, a transistor including an oxide semiconductor which contains a large amount of hydrogen is likely to be normally on. Moreover, hydrogen in an oxide semiconductor is easily transferred by a stress such as heat or an electric field; thus, a large amount of hydrogen in an oxide semiconductor might reduce the reliability of a transistor.

VoH can serve as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Accordingly, in the case where an oxide semiconductor is used as the oxide 630, the amount of VoH in the oxide 630 is preferably reduced as much as possible so that the oxide 630 becomes a highly purified intrinsic or substantially highly purified intrinsic oxide. In order to obtain such an oxide semiconductor with sufficiently reduced VoH, it is important to remove impurities such as moisture and hydrogen in the oxide semiconductor (this treatment is sometimes referred to as dehydration or dehydrogenation treatment) and supply oxygen to the oxide semiconductor to fill oxygen vacancies (this treatment is sometimes referred to as oxygen adding treatment). When an oxide semiconductor with sufficiently reduced impurities such as VoH is used for a channel formation region of a transistor, stable electrical characteristics can be given.

The hydrogen concentration of the oxide 630b, which is measured by secondary ion mass spectrometry (SIMS), can be lower than $1 \times 10^{20}$ atoms/cm$^{-3}$, preferably lower than $1 \times 10^{19}$ atoms/cm$^{-3}$, further preferably lower than $5 \times 10^{18}$ atoms/cm$^{-3}$, still further preferably lower than $1 \times 10^{18}$ atoms/cm$^{-3}$, for example. The oxide 630 with sufficiently reduced impurities such as hydrogen is used for the channel formation region of the transistor 600, whereby the transistor can have normally-off characteristics, stable electrical characteristics, and improved reliability.

When an oxide semiconductor is used for the oxide 630, the carrier concentration of the oxide semiconductor in a region functioning as a channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet still further preferably lower than $1\times10^{13}$ cm$^{-3}$, yet still further preferably lower than $1\times10^{12}$ cm$^{-3}$. Note that the lower limit of the carrier concentration of the oxide semiconductor in the region functioning as the channel formation region is not particularly limited and can be, for example, $1\times10^t$ cm$^{-3}$.

Thus, it is preferable to use a material inhibiting diffusion of impurities (hereinafter, also referred to as a material having a barrier property against impurities) for each of the insulator 614, the insulator 622, the insulator 672, the insulator 673, and the insulator 682 to reduce diffusion of impurities such as hydrogen into the oxide 630. A barrier property in this specification and the like means a function of inhibiting diffusion of a particular substance (also referred to as a function of less easily transmitting the substance). Alternatively, a barrier property in this specification and the like means a function of trapping and fixing (also referred to as gettering) a particular substance. In this specification and the like, an insulating film having a barrier property is referred to as a barrier insulating film in some cases.

Examples of a material that has a function of inhibiting diffusion of hydrogen and oxygen include aluminum oxide, hafnium oxide, gallium oxide, indium gallium zinc oxide, silicon nitride, and silicon nitride oxide. It is particularly preferable to use silicon nitride or silicon nitride oxide as a sealing material because of their high barrier properties against hydrogen.

Examples of a material having a function of trapping and fixing hydrogen include metal oxides such as aluminum oxide, hafnium oxide, gallium oxide, and indium gallium zinc oxide.

For example, as the insulator 614, aluminum oxide or hafnium oxide is preferably used. Accordingly, impurities such as water or hydrogen can be inhibited from being diffused to the transistor 600 side from the substrate side. In addition, oxygen contained in the insulator 624 and the like can be inhibited from being diffused to the substrate side.

The conductor 605 is provided to overlap with the oxide 630 and the conductor 660. Furthermore, the conductor 605 is preferably embedded in the insulator 616.

When the conductor 605 functions as a gate electrode, by changing a potential applied to the conductor 605 not in conjunction with but independently of a potential applied to the conductor 660, the threshold voltage (Vth) of the transistor 600 can be adjusted. In particular, by applying a negative potential to the conductor 605, Vth of the transistor 600 can be further increased, and the off-state current can be reduced. Thus, a drain current at the time when a potential applied to the conductor 660 is 0 V can be lower in the case where a negative potential is applied to the conductor 605 than in the case where a negative potential is not applied to the conductor 605.

As illustrated in FIG. 20A, the conductor 605 is preferably provided to be larger than a region of the oxide 630 that does not overlap with the conductor 642a or the conductor 642b. It is particularly preferable that the conductor 605 extend beyond an end portion of the oxide 630 that intersects with the channel width direction, as illustrated in FIG. 20B. That is, the conductor 605 and the conductor 660 preferably overlap with each other with the insulators therebetween on an outer side of the side surface of the oxide 630 in the channel width direction. A large conductor 605 can sometimes reduce local charging (referred to as charge up) in treatment using plasma of a fabrication step after the formation of the conductor 605. Note that one embodiment of the present invention is not limited thereto. The conductor 605 overlaps with at least the oxide 630 positioned between the conductor 642a and the conductor 642b.

When a bottom surface of the insulator 624 is used as a reference, the level of a bottom surface of the conductor 660 in a region where the oxide 630a and the oxide 630b do not overlap with the conductor 660 is preferably placed lower than the level of a bottom surface of the oxide 630b.

As illustrated in FIG. 20B, when a structure in which the conductor 660, which functions as a gate, covers the side surface and the top surface of the oxide 630b in the channel formation region with the oxide 630c and the insulator 650 therebetween is employed, electric fields generated from the conductor 660 are likely to affect the entire channel formation region generated in the oxide 630b. Thus, the on-state current of the transistor 600 can be increased and the frequency characteristics can be improved. In this specification, a transistor structure in which a channel formation region is electrically surrounded by electric fields of the gate (the first gate) and the back gate (the second gate) is referred to as a surrounded channel (S-channel) structure.

The conductor 605a is preferably a conductor that inhibits passage of oxygen and impurities such as water or hydrogen. For example, titanium, titanium nitride, tantalum, or tantalum nitride can be used. For the conductor 605b, it is preferable to use a conductive material containing tungsten, copper, or aluminum as its main component. Although the conductor 605 is illustrated as having two layers, a multilayer structure with three or more layers may be employed.

The insulator 616, the insulator 680, the insulator 685, and the insulator 688 preferably have a lower permittivity than the insulator 614. When a material with a low permittivity is used for the interlayer film, the parasitic capacitance generated between wirings can be reduced. For each of the insulator 616, the insulator 680, the insulator 685, and the insulator 688, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 616, the insulator 680, the insulator 685, and the insulator 688 may be deposited by a CVD method or an ALD method using a compound gas containing no hydrogen atom or having a low hydrogen atom content. Note that a thermal CVD method or a PECVD (Plasma Enhanced CVD) method may be used as the CVD method. A thermal ALD method or a PEALD (Plasma Enhanced ALD) may be used as the ALD method. A deposition method using plasma, such as PECVD or PEALD are more suitable in terms of mass productivity.

A gas containing a molecule including a silicon atom is mainly used as a deposition gas for depositing the above insulating films. In order to reduce hydrogen contained in the above insulating films, the molecule including a silicon atom preferably contains as few hydrogen atoms as possible; further preferably, the molecule including a silicon atom contains no hydrogen atom. A deposition gas other than a gas containing a molecule including a silicon atom preferably includes as few hydrogen atoms as possible, further preferably includes no hydrogen atom.

In the case where the molecule containing a silicon atom is expressed as $Si_x$—$R_y$, a functional group R can be at least one of an isocyanate group (—N═C═O), a cyanate group (—O—C≡N), a cyano group (—C≡N), a diazo group (=N$_2$), an azide group (—N$_3$), a nitroso group (—NO), and a nitro group (—NO$_2$). For example, $1 \leq x \leq 3$ and $1 \leq y \leq 8$ are employed. For example, tetraisocyanatesilane, tetracyanatesilane, tetracyanosilane, hexaisocyanatesilane, or octaisocyanatesilane can be used as the molecule including a silicon atom. The examples here each show the molecule in which functional groups of the same kind are bonded to the silicon atom; however, this embodiment is not limited to these examples. Different kinds of functional groups may be bonded to the silicon atom.

A halogen (Cl, Br, I, or F) can be used for the functional group R, for example. For example, $1 \leq x \leq 2$, and $1 \leq y \leq 6$ are employed. Examples of such a molecule including a silicon atom are tetrachlorosilane (SiCl$_4$), hexachlorodisilane (Si$_2$Cl$_6$), and the like. Although an example of using chlorine as the functional group is described here, halogens other than chlorine, such as bromine, iodine, or fluorine, may be used as the functional group. In addition, different kinds of halogens may be bonded to the silicon atom.

The insulator 622 and the insulator 624 have a function of a gate insulator.

Here, it is preferable that the insulator 624 in contact with the oxide 630 release oxygen by heating. In this specification, oxygen that is released by heating is referred to as excess oxygen in some cases. For example, silicon oxide, silicon oxynitride, or the like is used as appropriate for the insulator 624. When an insulator containing oxygen is provided in contact with the oxide 630, oxygen vacancies in the oxide 630 can be reduced and the reliability of the transistor 600 can be improved.

As the insulator 624, specifically, an oxide material from which part of oxygen is released by heating is preferably used. An oxide from which oxygen is released by heating is an oxide film in which the number of released oxygen molecules is greater than or equal to $1.0 \times 10^{18}$ molecules/cm$^{-3}$, preferably greater than or equal to $1.0 \times 10^{19}$ molecules/cm$^{-3}$, further preferably greater than or equal to $2.0 \times 10^{19}$ molecules/cm$^{-3}$ or greater than or equal to $3.0 \times 10^{20}$ molecules/cm$^{-3}$ in thermal desorption spectroscopy analysis (TDS analysis). Note that the temperature of the film surface in the TDS analysis is preferably within the range of 100° C. to 700° C., or 100° C. to 400° C.

The insulator 622 preferably functions as a barrier insulating film that inhibits impurities such as water or hydrogen from entering the transistor 600 from the substrate side. For example, the insulator 622 preferably has lower hydrogen permeability than the insulator 624. Surrounding the insulator 624, the oxide 630, and the like by the insulator 622 and the insulator 683 can inhibit entry of impurities such as water or hydrogen into the transistor 600 from the outside.

Furthermore, it is preferable that the insulator 622 have a function of inhibiting diffusion of oxygen (e.g., at least one of an oxygen atom, an oxygen molecule, and the like) (through which the above oxygen is less likely to pass). For example, the insulator 622 preferably has lower oxygen permeability than the insulator 624. The insulator 622 preferably has a function of inhibiting diffusion of oxygen or impurities, in which case diffusion of oxygen contained in the oxide 630 into a layer under the insulator 622 can be reduced. Moreover, the conductor 605 can be inhibited from reacting with oxygen contained in the insulator 624 and the oxide 630.

As the insulator 622, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 622 is formed using such a material, the insulator 622 functions as a layer that inhibits release of oxygen from the oxide 630 and entry of impurities such as hydrogen from the periphery of the transistor 600 into the oxide 630.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material, such as aluminum oxide, hafnium oxide, tantalum oxide, zirconium oxide, lead zirconate titanate (PZT), strontium titanate (SrTiO$_3$), or (Ba,Sr)TiO$_3$ (BST), may be used as the insulator 622. With miniaturization and high integration of transistors, a problem such as leakage current may arise because of a thinner gate insulator. When a high-k material is used for an insulator functioning as the gate insulator, a gate potential during operation of the transistor can be lowered while the physical thickness of the gate insulator is maintained.

Note that the insulator 622 and the insulator 624 may each have a stacked-layer structure of two or more layers. In such a case, without limitation to a stacked-layer structure formed of the same material, a stacked-layer structure formed of different materials may be employed.

The oxide 643 (the oxide 643*a* and the oxide 643*b*) may be placed between the oxide 630*b* and the conductor 642 (the conductor 642*a* and the conductor 642*b*) which functions as the source electrode or the drain electrode. This structure in which the conductor 642 and the oxide 630 are not in contact with each other can inhibit the conductor 642 from absorbing oxygen in the oxide 630. That is, preventing oxidation of the conductor 642 can inhibit the decrease in conductivity of the conductor 642. Thus, the oxide 643 preferably has a function of inhibiting oxidation of the conductor 642.

Accordingly, the oxide 643 preferably has a function of inhibiting passage of oxygen. It is preferable to place the oxide 643 having a function of inhibiting passage of oxygen between the oxide 630*b* and the conductor 642, which functions as the source electrode and the drain electrode, in which case the electrical resistance between the conductor 642 and the oxide 630*b* is reduced. Such a structure improves the electrical characteristics of the transistor 600 and the reliability of the transistor 600.

A metal oxide containing the element M may be used as the oxide 643. In particular, aluminum, gallium, yttrium, or tin is preferably used as the element M. The concentration of the element M in the oxide 643 is preferably higher than that in the oxide 630*b*. Alternatively, gallium oxide may be used as the oxide 643. A metal oxide such as an In-M-Zn oxide may be used as the oxide 643. Specifically, the atomic ratio of the element M to In in the metal oxide used as the oxide 643 is preferably greater than the atomic ratio of the element M to In in the metal oxide used as the oxide 630*b*. The thickness of the oxide 643 is preferably greater than or equal to 0.5 nm and less than or equal to 5 nm, further preferably greater than or equal to 1 nm and less than or equal to 3 nm. The oxide 643 preferably has crystallinity. In the case where the oxide 643 has crystallinity, release of oxygen from the oxide 630 can be favorably inhibited. When the oxide 643 has a hexagonal crystal structure, for example, release of oxygen from the oxide 630 can sometimes be inhibited.

Note that the oxide 643 is not necessarily provided. In that case, contact between the conductor 642 (the conductor 642a and the conductor 642b) and the oxide 630 may make oxygen in the oxide 630 diffuse into the conductor 642, resulting in oxidation of the conductor 642. It is highly possible that oxidation of the conductor 642 lowers the conductivity of the conductor 642. Note that diffusion of oxygen in the oxide 630 into the conductor 642 can be interpreted as absorption of oxygen in the oxide 630 by the conductor 642.

When oxygen in the oxide 630 is diffused into the conductor 642 (the conductor 642a and the conductor 642b), a layer is sometimes formed between the conductor 642a and the oxide 630b, and between the conductor 642b and the oxide 630b. The layer contains more oxygen than the conductor 642 does, and thus presumably has an insulating property. In this case, a three-layer structure of the conductor 642, the layer, and the oxide 630b can be regarded as a three-layer structure of a metal, an insulator, and a semiconductor and is sometimes referred to as a MIS (Metal-Insulator-Semiconductor) structure or a diode junction structure having an MIS structure as its main part.

The above layer is not necessarily formed between the conductor 642 and the oxide 630b, but the layer may be formed between the conductor 642 and the oxide 630c, or formed between the conductor 642 and the oxide 630b and between the conductor 642 and the oxide 630c, for example.

The conductor 642 (the conductor 642a and the conductor 642b) functioning as the source electrode and the drain electrode is provided over the oxide 643. The thickness of the conductor 642 is greater than or equal to 1 nm and less than or equal to 50 nm, preferably greater than or equal to 2 nm and less than or equal to 25 nm, for example.

For the conductor 642, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 672 is provided in contact with a top surface of the conductor 642 and preferably functions as a barrier insulating film. The insulator 673 functioning as a barrier insulating film is preferably provided over the insulator 672. With such a structure, absorption of excess oxygen contained in the insulator 680 by the conductor 642 can be inhibited. Furthermore, by inhibiting oxidation of the conductor 642, an increase in the contact resistance between the transistor 600 and a wiring can be inhibited. Consequently, the transistor 600 can have favorable electrical characteristics and reliability.

Thus, the insulator 672 and the insulator 673 preferably have a function of inhibiting diffusion of oxygen. For example, the insulator 672 preferably has a function of further inhibiting diffusion of oxygen as compared to the insulator 680. An insulator containing an oxide of one or both of aluminum and hafnium is preferably deposited as the insulator 672, for example. As the insulator 673, for example, silicon nitride or silicon nitride oxide is used.

Impurities such as water or hydrogen can be inhibited from being diffused to the transistor 600 side from the insulator 680 and the like, which are provided with the insulator 672 and the insulator 673 therebetween. In this manner, the transistor 600 is preferably surrounded by the insulator 672 and the insulator 673 having a function of inhibiting diffusion of oxygen and impurities such as water or hydrogen.

The insulator 650 functions as a gate insulator. The insulator 650 is preferably placed in contact with the top surface of the oxide 630c. For the insulator 650, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

Like the insulator 624, the insulator 650 is preferably formed using an insulator from which oxygen is released by heating. When an insulator from which oxygen is released by heating is provided as the insulator 650 in contact with the top surface of the oxide 630c, oxygen can be efficiently supplied to the channel formation region of the oxide 630b. Furthermore, as in the insulator 624, the concentration of impurities such as water or hydrogen in the insulator 650 is preferably reduced. The thickness of the insulator 650 is preferably greater than or equal to 1 nm and less than or equal to 20 nm.

Furthermore, a metal oxide may be provided between the insulator 650 and the conductor 660. The metal oxide preferably inhibits diffusion of oxygen from the insulator 650 into the conductor 660. Providing the metal oxide that inhibits diffusion of oxygen inhibits diffusion of oxygen from the insulator 650 into the conductor 660. That is, a reduction in the amount of oxygen supplied to the oxide 630 can be inhibited. In addition, oxidation of the conductor 660 due to oxygen from the insulator 650 can be inhibited.

The metal oxide has a function of part of the gate insulator in some cases. Therefore, when silicon oxide, silicon oxynitride, or the like is used for the insulator 650, a metal oxide that is a high-k material with a high relative permittivity is preferably used as the metal oxide. When the gate insulator has a stacked-layer structure of the insulator 650 and the metal oxide, the stacked-layer structure can be thermally stable and have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, it is possible to use a metal oxide containing one kind or two or more kinds selected from hafnium, aluminum, gallium, yttrium, zirconium, tungsten, titanium, tantalum, nickel, germanium, magnesium, and the like. It is particularly preferable to use an insulator containing an oxide of one or both of aluminum and hafnium, such as aluminum oxide, hafnium oxide, or an oxide containing aluminum and hafnium (hafnium aluminate).

Alternatively, the metal oxide has a function of part of the gate in some cases. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide where the channel is formed. Alternatively, a conductive material containing the above metal element and nitrogen may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

The bottom surface and a side surface of the conductor 660 are in contact with the insulator 650. Although the conductor 660 has a two-layer structure in FIG. 20B, the conductor 660 may have a single-layer structure or a stacked-layer structure of three or more layers.

For the conductor 660a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, and the like), and a copper atom. Alternatively, it is preferable to use a conductive material having a function of inhibiting diffusion of oxygen (e.g., at least one of an oxygen atom, an oxygen molecule, and the like).

In addition, when the conductor 660a has a function of inhibiting diffusion of oxygen, the conductivity of the conductor 660b can be inhibited from being lowered because of oxidation due to oxygen contained in the insulator 650. As a conductive material having a function of inhibiting diffusion of oxygen, for example, tantalum, tantalum nitride, ruthenium, ruthenium oxide, or the like is preferably used.

For the conductor 660b, a conductive material containing tungsten, copper, or aluminum as its main component is preferably used. The conductor 660 also functions as a wiring and thus is a conductor with high conductivity is preferably used. For example, a conductive material containing tungsten, copper, or aluminum as its main component can be used. Moreover, the conductor 660b may have a stacked-layer structure, for example, a stacked-layer structure of the above conductive material and titanium or titanium nitride.

For the insulator 680, for example, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably used. In particular, silicon oxide and silicon oxynitride, which have thermal stability, are preferable.

Materials such as silicon oxide, silicon oxynitride, and porous silicon oxide, in each of which a region containing oxygen released by heating can be easily formed, are particularly preferable. The insulator 680 may have a stacked-layer structure of the above materials, for example, a structure in which silicon oxynitride deposited by a CVD method is stacked over silicon oxide deposited by a sputtering method. Furthermore, silicon nitride may be stacked thereover.

Here, the insulator 680 preferably contains excess oxygen. For example, silicon oxide, silicon oxynitride, or the like is used as appropriate for the insulator 680. When the insulator 680 containing excess oxygen is provided in contact with the oxide 630, oxygen vacancies in the oxide 630 can be reduced and the reliability of the transistor 600 can be improved. In order that the insulator 680 contains excess oxygen, deposition of the insulator 682 is performed by a sputtering method in an oxygen-containing atmosphere, for example. The insulator 682 is deposited by a sputtering method in an oxygen-containing atmosphere, whereby oxygen can be added to the insulator 680 during the deposition.

The concentration of impurities such as water or hydrogen in the insulator 680 is preferably reduced. In addition, the top surface of the insulator 680 may be planarized.

The insulator 682 preferably functions as a barrier insulating film that inhibits impurities such as water or hydrogen from entering the insulator 680 from the above. The insulator 682 preferably functions as a barrier insulating film that inhibits passage of oxygen. As the insulator 682, an insulator such as aluminum oxide, silicon nitride, or silicon nitride oxide is used, for example. For example, as the insulator 682, aluminum oxide having a high barrier property against oxygen is used.

As illustrated in FIG. 20B, the insulator 682 is directly in contact with the oxide 630c. Owing to this structure, diffusion of oxygen contained in the insulator 680 into the conductor 660 can be inhibited. Therefore, oxygen contained in the insulator 680 can be supplied to the oxide 630a and the oxide 630b efficiently through the oxide 630c; hence, oxygen vacancies in the oxide 630a and the oxide 630b can be reduced and the electrical characteristics and the reliability of the transistor 600 can be improved.

The insulator 685 functioning as an interlayer film is preferably provided over the insulator 682. As in the insulator 624 and the like, the concentration of impurities such as water or hydrogen in the insulator 685 is preferably reduced.

For the conductor 640, a conductive material containing tungsten, copper, or aluminum as its main component is preferably used. In addition, the conductor 640 may have a stacked-layer structure. Note that the conductor 640 has a circular shape in the top view in FIG. 20A; however, the shape of the conductor is not limited thereto. For example, in the top view, the conductor 640 may have an almost circular shape such as an elliptical shape, a polygonal shape such as a quadrangular shape, or a polygonal shape such as a quadrangular shape with rounded corners.

In the case where the conductor 640 has a stacked-layer structure, a conductive material having a function of inhibiting passage of oxygen and impurities such as water or hydrogen is preferably used. For example, tantalum, tantalum nitride, titanium, titanium nitride, ruthenium, ruthenium oxide, or the like is preferably used. A single layer or stacked layers of the conductive material having a function of inhibiting passage of oxygen and impurities such as water or hydrogen may be used. With the use of the conductive material, entry of impurities diffused from the insulator 680 and the like, such as water or hydrogen, into the oxide 630 through the conductor 640 can be further reduced. In addition, oxygen added to the insulator 680 can be prevented from being absorbed by the conductor 640.

In addition, the conductor 646a is placed to be in contact with a top surface of the conductor 640a and a top surface of the conductor 640c, and the conductor 646b is placed to be in contact with a top surface of the conductor 640b. For the conductor 646a and the conductor 646b, a conductive material containing tungsten, copper, or aluminum as its main component is preferably used. The conductor 646a and the conductor 646b may each have a stacked-layer structure, for example, may be stacked layers of titanium or titanium nitride and the above conductive material. Note that the conductor may be formed to be embedded in an opening provided in an insulator.

The insulator 686 is provided to cover the insulator 685, the conductor 646a, and the conductor 646b. The insulator 686 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide.

For example, for the insulator 686, a stacked-layer structure using a material with high dielectric strength such as silicon oxynitride and a high permittivity (high-k) material may be employed. In the capacitor 655 having such a structure, a sufficient capacitance can be ensured owing to the high permittivity (high-k) insulator, and the dielectric strength can be increased owing to the insulator with high dielectric strength, so that the electrostatic breakdown of the capacitor 655 can be inhibited.

As the insulator of a high permittivity (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

Alternatively, for example, a single layer or stacked layers of an insulator containing a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as the insulator 686. In the case where the insulator 686 has a stacked-layer structure, a three-layer structure in which zirconium oxide, aluminum oxide, and zirconium oxide are formed in this order, or a four-layer structure in which zirconium oxide, aluminum oxide, zirconium oxide, and aluminum oxide are formed in this order is employed, for example. For the insulator 686, a compound containing hafnium and zirconium may be used. When the semiconductor device is minimized and highly integrated, a gate insulator and a dielectric used for a capacitor become thin, which causes a problem of, for example, leakage current from a transistor and a capacitor in some cases. When a high-k material is used as an insulator functioning as the gate insulator and the dielectric used for the capacitor, a gate potential during operation of the transistor can be lowered and the capacitance of the capacitor can be ensured while the physical thicknesses of the gate insulator and the dielectric are maintained.

As the material having a high dielectric strength (a material having a low relative permittivity), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

The conductor 656 is placed to overlap with at least part of the conductor 646a with the insulator 686 therebetween. For the conductor 656, a conductor that can be used as the conductor 646 is used.

The insulator 688 functioning as an interlayer film is preferably provided over the insulator 686 and the conductor 646b. As in the insulator 624 and the like, the concentration of impurities such as water or hydrogen in the insulator 688 is preferably reduced.

<<Modification Example of Memory Circuit>>

Figure 21A:
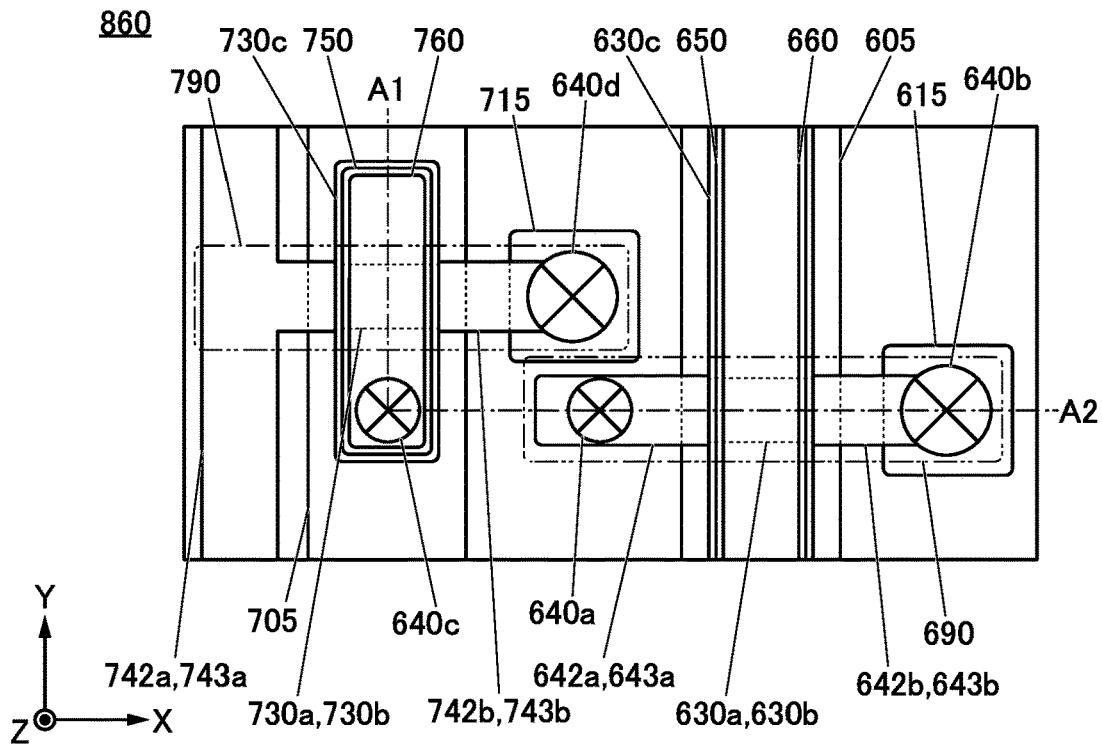
FIG. 21A and FIG. 21B are a top view and a cross-sectional view of a memory device of one embodiment of the present invention.
Figure 21B:
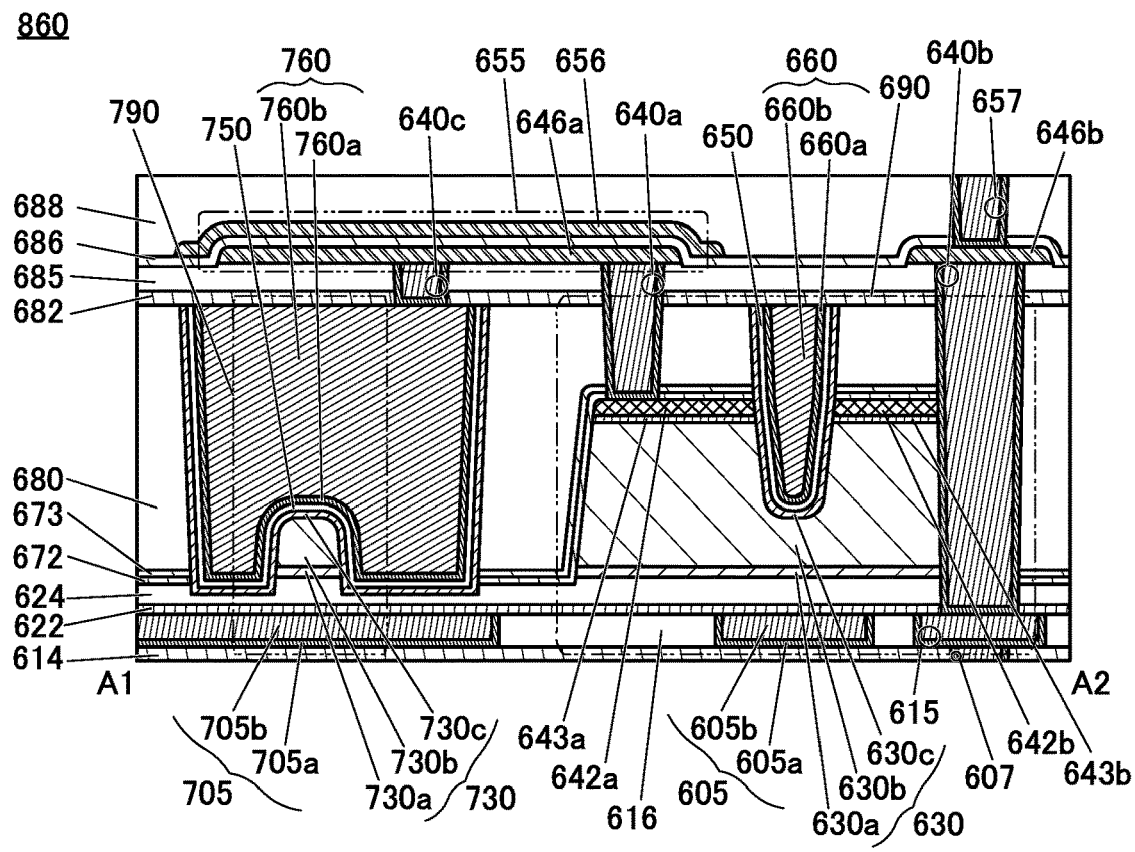

A modification example of the memory circuit will be described below with reference to FIG. 21A and FIG. 21B. FIG. 21A is a top view of a periphery of the memory circuit 860. FIG. 21B is a cross-sectional view of the memory circuit 860, and FIG. 21B corresponds to a portion indicated by a dashed-dotted line A1-A2 in FIG. 21A. FIG. 21B illustrates a cross section of a transistor 600 in the channel length direction and a cross section of a transistor 700 in the channel width direction. Note that for clarity of the drawing, some components are omitted in the top view in FIG. 21A. Note that the X direction, the Y direction, and the Z direction illustrated in FIG. 21A are directions orthogonal to or intersecting with each other. Here, it is preferable that the X direction and the Y direction be parallel or substantially parallel to a substrate surface and the Z direction be perpendicular or substantially perpendicular to the substrate surface.

The memory circuit 860 illustrated in FIGS. 21A and 21B is different from the memory circuit 860 illustrated in FIGS. 20A and 20B in that a transistor 690 and a transistor 790 are used instead of the transistor 600 and the transistor 700. Here, the transistor 790 and the transistor 690 are formed in the same layer and have similar structures. Hereinafter, the description of the components of the transistor 690 can be referred to for the components of the transistor 790.

The transistor 690 is different from the transistor 600 in that the oxide 630c is formed in a U-shape along an opening portion formed in the insulator 680, the insulator 672, the insulator 673, the conductors 642 (the conductor 642a and the conductor 642b), and the oxide 630b.

For example, in the case where the channel length of the transistor is reduced (typically greater than or equal to 5 nm and less than 60 nm, preferably greater than or equal to 10 nm and less than or equal to 30 nm), the above-described structure of the transistor 600 can make the effective L length longer. For example, in the case where the distance between the conductor 642a and the conductor 642b is 20 nm, the effective L length can be greater than or equal to 40 nm and less than or equal to 60 nm, i.e., approximately two to three times the distance between the conductor 642a and the conductor 642b or the minimum feature size. Thus, the memory circuit 860 illustrated in FIGS. 21A and 21B has a structure including the transistor 690, the transistor 790, and the capacitor 655, which are excellent in miniaturization.

<<Metal Oxide>>

As the oxide 630, a metal oxide functioning as an oxide semiconductor is preferably used. A metal oxide that can be used as the oxide 630 of the present invention is described below.

The metal oxide preferably contains at least indium or zinc. In particular, indium and zinc are preferably contained. Moreover, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc is considered. Note that the element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also referred to as a metal oxide in some cases. A metal oxide containing nitrogen may be referred to as a metal oxynitride.

[Composition of Metal Oxide]

Here, a CAC-OS (Cloud-Aligned Composite Oxide Semiconductor) or a CAC-metal oxide is described as a composition example of a metal oxide.

The CAC-OS or the CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used for a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

Oxide semiconductors might be classified in a manner different from the above-described one when classified in terms of the crystal structure. Here, the classification of the crystal structures of an oxide semiconductor will be explained with FIG. 26A. FIG. 26A is a diagram showing the classification of the crystal structures of an oxide semiconductor, typically IGZO (a metal oxide containing In, Ga, and Zn).

As shown in FIG. 26A, IGZO is roughly classified into Amorphous, Crystalline, and Crystal. Amorphous includes completely amorphous structure. In addition, Crystalline includes CAAC, nc, and CAC. Crystal includes single crystal and poly crystal.

Note that the structure shown in the thick frame in FIG. 26A is a structure that belongs to new crystalline phase. This structure is positioned in a boundary region between Amorphous and Crystal. In other words, Amorphous, which is energetically unstable, and Crystalline are completely different structures.

A crystal structure of a film or a substrate can be analyzed with X-ray diffraction (XRD) images. Here, XRD spectra of quartz glass and IGZO, which has a crystal structure classified into Crystalline (also referred to as Crystalline IGZO), are shown in FIGS. 26B and 26C. FIG. 26B shows an XRD spectrum of quartz glass and FIG. 26C shows an XRD spectrum of crystalline IGZO. Note that the crystalline IGZO shown in FIG. 26C has a composition of In:Ga:Zn=4:2:3 [atomic ratio]. Furthermore, the crystalline IGZO shown in FIG. 26C has a thickness of 500 nm.

As indicated by arrows in FIG. 26B, the XRD spectrum of the quartz glass shows a substantially symmetrical peak. In contrast, as indicated by arrows in FIG. 26C, the XRD spectrum of the crystalline IGZO shows an asymmetrical peak. The asymmetrical peak of the XRD spectrum clearly shows the existence of a crystal. In other words, the structure cannot be regarded as Amorphous unless it has a bilaterally symmetrical peak in the XRD spectrum.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

A crystal structure in which a clear crystal grain boundary (grain boundary) is observed is what is called a polycrystal. It is highly probable that the crystal grain boundary becomes a recombination center and traps carriers and thus decreases the on-state current or field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is less likely to occur. Entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure may be obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) has various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of each impurity in the metal oxide will be described.

Entry of the impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. Moreover, when the channel formation region includes oxygen vacancies, the transistor tends to have normally-on characteristics.

The above-described defect states may include a trap state. Charges trapped by the trap states in the metal oxide take a long time to disappear and may behave like fixed charges. Thus, a transistor whose channel formation region includes a metal oxide having a high density of trap states has unstable electrical characteristics in some cases.

If the impurities exist in the channel formation region of the oxide semiconductor, the crystallinity of the channel formation region may decrease, and the crystallinity of an oxide provided in contact with the channel formation region may decrease. Low crystallinity of the channel formation region tends to result in deterioration in stability or reliability of the transistor. Moreover, if the crystallinity of the oxide provided in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor. Examples of impurities include hydrogen, nitrogen, an alkali metal, an alkaline earth metal, iron, nickel, and silicon.

Specifically, the concentration of the above impurities obtained by SIMS is lower than or equal to $1 \times 10^{18}$ atoms/cm$^{-3}$, preferably lower than or equal to $2 \times 10^{16}$ atoms/cm$^{-3}$ in and around the channel formation region of the oxide semiconductor. Alternatively, the concentration of the above impurities obtained by element analysis using EDX is lower than or equal to 1.0 atomic % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region whose concertation of the impurities is calculated or may be a concentration in the oxide semiconductor.

A metal oxide with a low impurity concentration has a low density of defect states and thus has a low density of trap states in some cases.

In the case where hydrogen enters an oxygen vacancy in the metal oxide, the oxygen vacancy and the hydrogen are bonded to each other to form VoH in some cases. The VoH serves as a donor and an electron serving as a carrier is generated in some cases. In other cases, bonding of part of hydrogen to oxygen bonded to a metal atom generates electrons serving as carriers.

Thus, a transistor including an oxide semiconductor which contains a large amount of hydrogen is likely to be normally on. Moreover, hydrogen in an oxide semiconductor is easily transferred by a stress such as heat or an electric field; thus, a large amount of hydrogen in an oxide semiconductor might reduce the reliability of a transistor.

Accordingly, the amount of VoH in the metal oxide is preferably reduced as much as possible so that the metal oxide becomes a highly purified intrinsic or substantially highly purified intrinsic metal oxide. In order to obtain such an oxide semiconductor with sufficiently reduced VoH, it is important to remove impurities such as moisture and hydrogen in the oxide semiconductor (this treatment is sometimes referred to as dehydration or dehydrogenation treatment) and supply oxygen to the oxide semiconductor to fill oxygen vacancies (this treatment is sometimes referred to as oxygen adding treatment). When an oxide semiconductor with sufficiently reduced impurities such as VoH is used for a channel formation region of a transistor, stable electrical characteristics can be given.

An oxide semiconductor with a low carrier concentration is preferably used for a transistor. In the case where the carrier concentration of the oxide semiconductor is lowered, the impurity concentration in the oxide semiconductor is lowered to decrease the density of defect states. In this specification and the like, a state with a low impurity concentration and a low density of defect states is referred to as a highly purified intrinsic or substantially highly purified intrinsic state. Examples of the impurities in the oxide semiconductor include hydrogen, nitrogen, alkali metal, alkaline earth metal, iron, nickel, and silicon.

In particular, hydrogen contained in an oxide semiconductor reacts with oxygen bonded to a metal atom to be water, and thus sometimes forms an oxygen vacancy in the oxide semiconductor. If the channel formation region in the oxide semiconductor includes an oxygen vacancy, the transistor sometimes has normally-on characteristics. In some cases, a defect where hydrogen enters an oxygen vacancy functions as a donor and generates an electron serving as a carrier. In other cases, bonding of part of hydrogen to oxygen bonded to a metal atom generates electrons serving as carriers. Thus, a transistor including an oxide semiconductor which contains a large amount of hydrogen is likely to be normally on.

A defect where hydrogen enters an oxygen vacancy (VoH) can serve as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration in the oxide semiconductor that is obtained by secondary ion mass spectrometry (SIMS) is set lower than $1 \times 10^{20}$ atoms/cm$^{-3}$, preferably lower than $1 \times 10^{19}$ atoms/cm$^{-3}$, further preferably lower than $5 \times 10^{18}$ atoms/cm$^{-3}$, still further preferably lower than $1 \times 10^{18}$ atoms/cm$^{-3}$. When an oxide semiconductor with sufficiently reduced impurities such as hydrogen is used for a channel formation region of a transistor, stable electrical characteristics can be given.

The carrier concentration of the oxide semiconductor in the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet still further preferably lower than $1 \times 10^{13}$ cm$^{-3}$, yet still further preferably lower than $1 \times 10^{12}$ cm$^{-3}$. Note that the lower limit of the carrier concentration of the oxide semiconductor in the channel formation region is not particularly limited and can be, for example, $1 \times 10^{-9}$ cm$^{-3}$.

According to one embodiment of the present invention, a semiconductor device with high reliability can be provided. According to another embodiment of the present invention, a semiconductor device having favorable electrical characteristics can be provided. According to another embodiment of the present invention, a semiconductor device with a high on-state current can be provided. According to another embodiment of the present invention, a semiconductor device that can be miniaturized or highly integrated can be provided. Another object of one embodiment of the present invention is to provide a semiconductor device with low power consumption.

<<Other Semiconductor Materials>>

Note that a semiconductor material that can be used for the oxide 630 is not limited to the above metal oxides. A semiconductor material which has a band gap (a semiconductor material that is not a zero-gap semiconductor) may be used for the oxide 630. For example, a single element semiconductor such as silicon, a compound semiconductor such as gallium arsenide, or a layered material functioning as a semiconductor (also referred to as an atomic layered material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 630, a transition metal chalcogenide functioning as a semiconductor is preferably used, for example. Specific examples of the transition metal chalcogenide which can be used for the oxide 630 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), zirconium selenide (typically $ZrSe_2$).

<Structure Example of Memory Circuit Arrangement>

Figure 22:
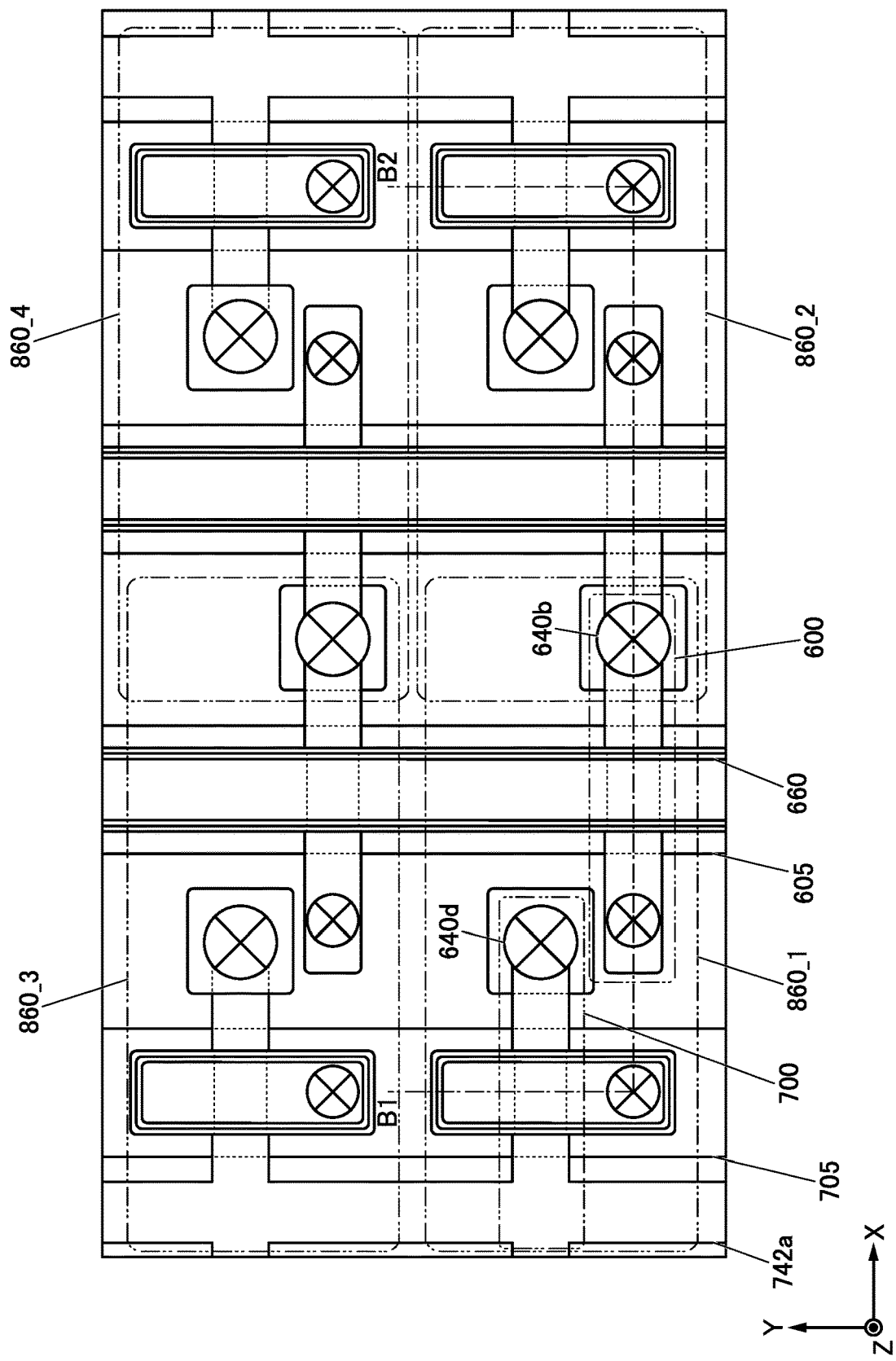
FIG. 22 is a top view of a memory device of one embodiment of the present invention.
Figure 23:
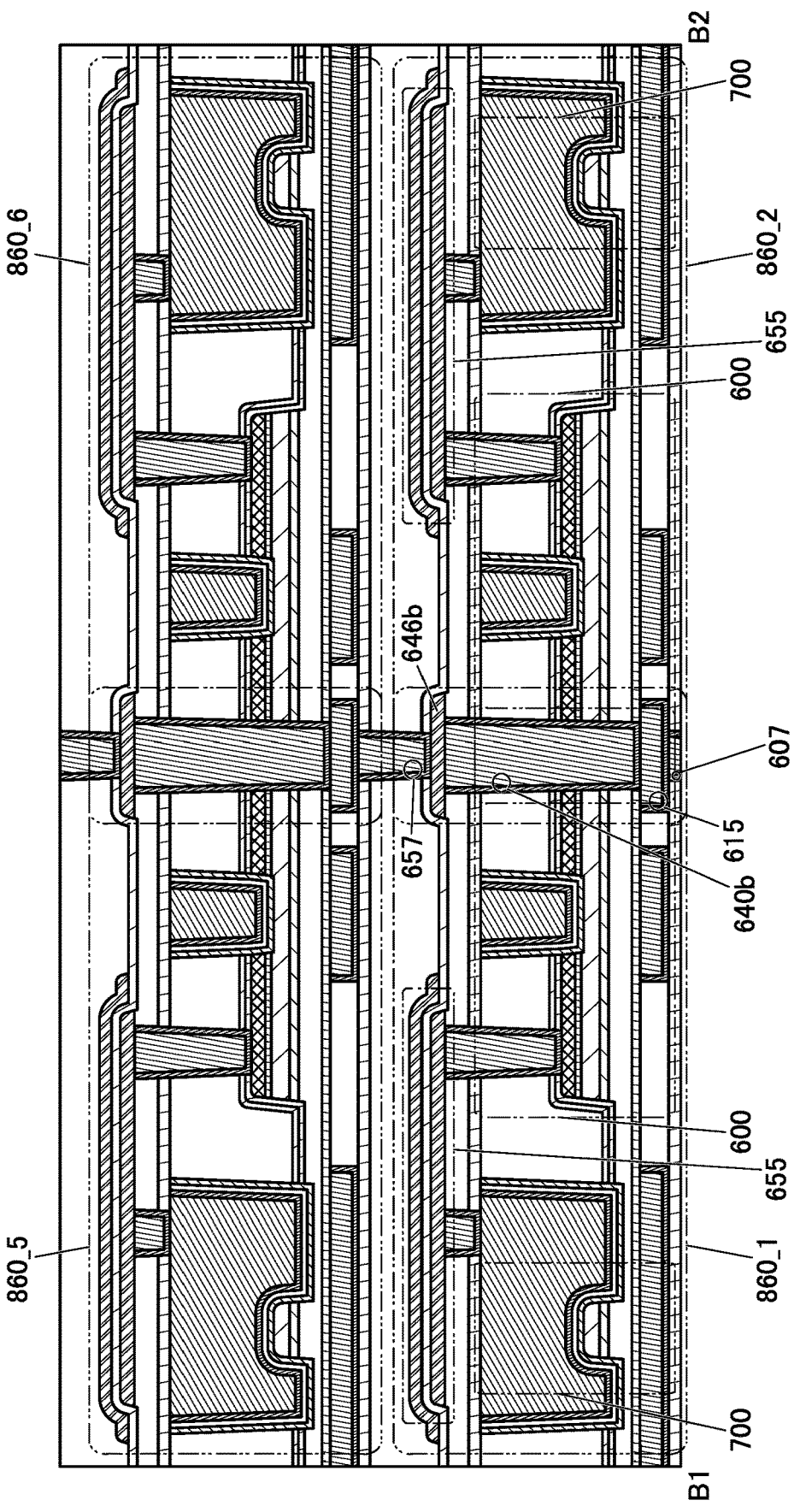
FIG. 23 is a cross-sectional view of a memory device of one embodiment of the present invention.

Next, an arrangement example of the memory circuits 860 will be described with reference to FIG. 22 and FIG. 23. FIG. 22 and FIG. 23 illustrate a memory circuit block in which 2×2×2 memory circuits 860 described above are arranged. FIG. 22 is a top view of the memory circuit block. FIG. 23 is a cross-sectional view of the memory circuit block, and FIG. 23 corresponds to a portion indicated by a dashed-dotted line B1-B2 in FIG. 22. FIG. 23 illustrates a cross section of a transistor 600 in the channel length direction and a cross section of a transistor 700 in the channel width direction. Note that for clarity of the drawing, some components are omitted in the top view in FIG. 22. Note that the X direction, the Y direction, and the Z direction illustrated in FIG. 22 are directions orthogonal to or intersecting with each other. Here, it is preferable that the X direction and the Y direction be parallel or substantially parallel to a substrate surface and the Z direction be perpendicular or substantially perpendicular to the substrate surface.

In the memory circuit block illustrated in FIG. 22 and FIG. 23, a memory circuit 860_2 is placed adjacent to a memory circuit 860_1 in the X direction. A memory circuit 860_3 and a memory circuit 860_4 are placed adjacent to the memory circuit 860_1 and the memory circuit 860_2, respectively, in the Y direction. A memory circuit 860_5 and a memory circuit 860_6 are placed adjacent to the memory circuit 860_1 and the memory circuit 860_2, respectively, in the Z direction.

As illustrated in FIG. 22 and FIG. 23, the components of the memory circuit 860_1 and the components of the memory circuit 860_2 can be placed axisymmetrically. Here, side surfaces of the conductor 640b are preferably in contact with the conductor 642b of the memory circuit 860_1 and the conductor 642b of the memory circuit 860_2. That is, it is preferable that the conductor 607, the conductor 615, the conductor 640b, the conductor 646b, and the conductor 657 that function as the bit line WBL be electrically connected to one of the source and the drain of the transistor 600 of the memory circuit 860_1 and one of the source and the drain of the transistor 600 of the memory circuit 860_2. When the memory circuit 860_1 and the memory circuit 860_2 are connected to the same wiring in such a manner, the area occupied by the memory cell can be further reduced.

As illustrated in FIG. 23, the conductor 607, the conductor 615, the conductor 640b, the conductor 646b, and the conductor 657 that function as the write bit line WBL are electrically connected also to the transistors 600 of the memory circuit 860_5 and the memory circuit 860_6 placed in the upper layer. Note that as illustrated in FIG. 23, the conductors 657 of the memory circuit 860_1 and the memory circuit 860_2 correspond to the conductors 607 of the memory circuit 860_5 and the memory circuit 860_6. In this manner, the bit line WBL can be extended in the Z direction. Similarly, the conductor 640d that functions as the read bit line RBL, and the like can be extended in the Z direction though not illustrated in the cross-sectional view.

As illustrated in FIG. 22, the conductor 660 of the memory circuit 860_1 is provided to extend to the memory circuit 860_3. In this manner, the word line WWL can extend in the Y direction. As illustrated in FIG. 22, the conductor 742a of the memory circuit 860_1 is provided to extend to the memory circuit 860_3. In this manner, the selection line SL can extend in the Y direction. Note that the selection line SL may be shared by the memory circuit 860_1 and the memory circuit 860 adjacent in the X direction. As illustrated in FIG. 22, the conductor 605 of the memory circuit 860_1 is provided to extend to the memory circuit 860_3. In this manner, the wiring BGL1 can extend in the Y direction. As illustrated in FIG. 22, the conductor 705 of the memory circuit 860_1 is provided to extend to the memory circuit 860_3. In this manner, the wiring BGL1 can extend in the Y direction.

Although FIG. 22 illustrates the structure in which the oxide 630c extends overlapping with the conductor 660, the semiconductor device described in this embodiment is not limited thereto. For example, a structure may be employed in which the oxide 630c is patterned for each memory circuit 860 and the oxide 630c is separately provided for each transistor 600. In the case where the oxide 630c has a stacked-layer structure of two layers, for example, a structure may be employed in which one of the upper layer and the lower layer of the oxide 630c may be separately provided for each transistor 600.

<Structure Example of Semiconductor Device>

Figure 24:
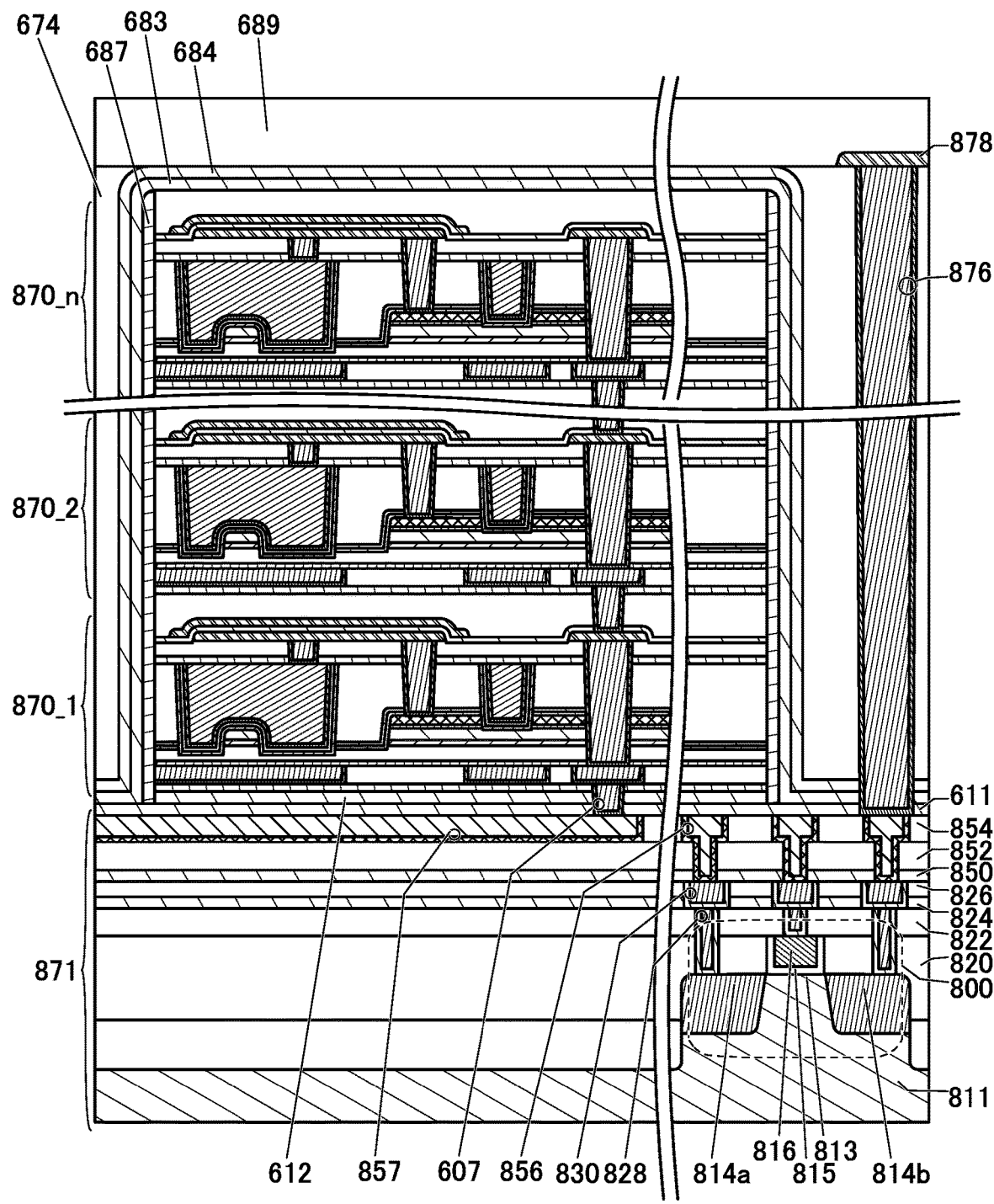
FIG. 24 is a cross-sectional view of a memory device of one embodiment of the present invention.

Next, an example of a semiconductor device in which the above-described memory circuits 860 are stacked is described with reference to FIG. 24. FIG. 24 is a cross-sectional view of a semiconductor device in which a plurality of memory circuit layers 870 including the memory circuits 860 are stacked over a silicon layer 871. The semiconductor device illustrated in FIG. 24 corresponds to the accelerator 20 illustrated in FIG. 1 and the like, the silicon layer 871 corresponds to the arithmetic processing unit 21, and the memory circuit layer 870 corresponds to the memory unit 22.

First, the silicon layer 871 is described. A plurality of transistors 800 are provided in the silicon layer 871, and form the arithmetic circuit 23 and the like illustrated in FIG. 1 and the like.

The transistor 800 is provided over a substrate 811 and includes a conductor 816 functioning as a gate, an insulator 815 functioning as a gate insulator, a semiconductor region 813 formed of part of the substrate 811, and a low-resistance region 814a and a low-resistance region 814b functioning as a source region and a drain region. The transistor 800 may be a p-channel transistor or an n-channel transistor.

Here, in the transistor 800 illustrated in FIG. 24, the semiconductor region 813 (part of the substrate 811) where a channel is formed has a convex shape. Furthermore, the conductor 816 is provided to cover a side surface and a top surface of the semiconductor region 813 with the insulator 815 therebetween. Note that a material adjusting the work function may be used for the conductor 816. Such a transistor 800 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 800 illustrated in FIG. 24 is an example and the structure is not limited thereto; an appropriate transistor is used in accordance with a circuit structure or a driving method.

Wiring layers provided with an interlayer film, a wiring, a plug, and the like may be provided between the structure bodies. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

For example, an insulator 820, an insulator 822, an insulator 824, and the insulator 826 are stacked over the transistor 800 in this order as interlayer films. A conductor 828, a conductor 830, and the like, which function as a plug or a wiring, are embedded in the insulator 820, the insulator 822, the insulator 824, and the insulator 826.

The insulator functioning as an interlayer film may function as a planarization film that covers an uneven shape thereunder. For example, a top surface of the insulator 822 may be planarized by planarization treatment using a chemical mechanical polishing (CMP) method or the like to improve planarity.

A wiring layer may be provided over the insulator 826 and the conductor 830. For example, in FIG. 24, an insulator 850, an insulator 852, and an insulator 854 are stacked in this order. Furthermore, a conductor 856 is formed in the insulator 850, the insulator 852, and the insulator 854. The conductor 856 functions as a plug or a wiring.

As an insulator that can be used as an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material having a low relative permittivity is used for the insulator functioning as an interlayer film, the parasitic capacitance generated between wirings can be reduced. Accordingly, a material is preferably selected depending on the function of an insulator.

For example, for the insulator 820, the insulator 822, the insulator 826, the insulator 852, the insulator 854, and the like, an insulator having a low relative permittivity is preferably used. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by insulators having a function of inhibiting passage of oxygen and impurities such as hydrogen, the electrical characteristics of the transistor can be stable. Thus, an insulator having a function of inhibiting passage of oxygen and impurities such as hydrogen is used for the insulator 824, the insulator 850, or the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride can be used.

As the conductors that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor with high electrical conductivity, typified by polycrystalline silicon containing an impurity element such as phosphorus, or silicide such as nickel silicide may be used.

For example, for the conductor 828, the conductor 830, the conductor 856, and the like, a single layer or stacked layers of a conductive material such as a metal material, an alloy material, a metal nitride material, or a metal oxide material that is formed using the above material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

An insulator 611 and an insulator 612 are placed over the silicon layer 871, and a memory circuit layer 870_1 to a memory circuit layer 870_n are stacked over the insulator 611 and the insulator 612. Although not particularly limited, n described above is greater than or equal to 2 and less than or equal to 200, preferably greater than or equal to 2 and less than or equal to 100, further preferably greater than or equal to 2 and less than or equal to 10. For example, 1 n 10, preferably 1 n 50, further preferably 1 n 100.

In each of the memory circuit layers 870, the memory circuits 860 and a variety of wirings are arranged in a matrix as in FIG. 22. The memory circuit layers 870 adjacent in the stacking direction are electrically connected to each other through the wirings such as the write bit lines WBL as illustrated in FIG. 23.

As illustrated in FIG. 24, the conductor 607 is placed to be embedded in the insulator 611 and the insulator 612 in the undermost memory circuit layer 870_1. The conductor 607 is in contact with a conductor 857 provided in the same layer as the conductor 856.

A structure is preferable in which the memory circuit layer 870_1 to the memory circuit layer 870_n are sealed with the insulator 611, the insulator 612, an insulator 687, the insulator 683, and an insulator 684. Here, the insulator 611 is placed over the silicon layer 871, and the insulator 612 is placed over the insulator 611. The memory circuit layer 870_1 to the memory circuit layer 870_n are placed over the insulator 612, and the insulator 612 is formed in the same pattern as those of the memory circuit layer 870_1 to the memory circuit layer 870_n in a top view. The insulator 687 is placed in contact with a top surface of the insulator 611, a side surface of the insulator 612, and side surfaces of the memory circuit layer 870_1 to the memory circuit layer 870_n. That is, the insulator 687 is formed in a sidewall shape along the memory circuit layer 870_1 to the memory circuit layer 870_n. The insulator 683 is placed to cover the insulator 611, the insulator 687, and the memory circuit layer 870_1 to the memory circuit layer 870_n. In addition, the insulator 684 is placed to cover the insulator 683.

For the insulator 611, the insulator 612, the insulator 687, the insulator 683, and the insulator 684, a barrier material is preferably used in a similar manner to that of the insulator 682 and the like.

Here, each of the memory circuit layers 870 is sealed with the insulator 687 and the insulator 683. The same material is preferably used for the insulator 687 and the insulator 683. The insulator 687 and the insulator 683 are preferably deposited by a deposition method using the same conditions. When the insulator 687 and the insulator 683 having the same film property are in contact with each other, a sealing structure with high hermeticity can be formed.

In addition, a material having a function of trapping and fixing hydrogen is preferably used for the insulator 687 and the insulator 683. Specifically, it is possible to use a metal oxide such as aluminum oxide, hafnium oxide, gallium oxide, or indium gallium zinc oxide.

The insulator 687 and the insulator 683 by which the memory circuit layer 870 is sealed are further covered with the insulator 684.

A material having a function of inhibiting diffusion of hydrogen and oxygen is preferably used for the insulator 611, the insulator 612, and the insulator 683. It is particularly preferable to use silicon nitride or silicon nitride oxide as a sealing material because of their high barrier properties against hydrogen.

It is preferable that the insulator 684 with high coverage be provided above the insulator 683 that covers the transistor 600. Note that for the insulator 684, the same material as those for the insulator 612 and the insulator 683 is preferably used.

When the insulator 612 and the insulator 683 are deposited by a sputtering method, for example, the sealing structure can be formed of the films having relatively low hydrogen concentrations.

On the other hand, films that are deposited by a sputtering method have relatively low coverage. In view of this, the insulator 611 and the insulator 684 are deposited by a CVD method or the like which enables high coverage, whereby higher hermeticity can be achieved.

Accordingly, the insulator 612 and the insulator 683 preferably have lower hydrogen concentration than the insulator 611 and the insulator 684.

When the memory circuit layer 870_1 to the memory circuit layer 870_n are sealed with the barrier insulating film in the above-described manner, diffusion of hydrogen into the oxide semiconductor included in each memory circuit 860 can be reduced, so that a memory device with high reliability can be provided.

Note that a material with a barrier property against oxygen is preferably used for the insulator 611, the insulator 612, the insulator 682, the insulator 687, the insulator 683, and the insulator 684. When the above sealing structure has a barrier property against oxygen, excess oxygen contained in the insulator 680 can be inhibited from diffusing outward and can be efficiently supplied to the transistor 600.

An insulator 674 is preferably provided so that the memory circuit layer 870_1 to the memory circuit layer 870_n, the insulator 684, and the like are embedded therein. An insulator that can be used as the insulator 680 is used as the insulator 674. As illustrated in FIG. 24, top surfaces of the insulator 674 and the insulator 684 are preferably substantially level with each other.

As illustrated in FIG. 24, an opening may be provided in the insulator 674, the insulator 684, the insulator 683, and the insulator 611 and a conductor 876 may be placed in the opening.

A bottom surface of the conductor 876 is in contact with the conductor 856. A conductor 878 functioning as a wiring may be provided in contact with a top surface of the conductor 876. Furthermore, an insulator 689 functioning as an interlayer film is preferably provided to cover the memory circuit layer 870_n, the insulator 674, and the conductor 878. With such a structure, the wiring (the conductor 878) in the upper layer and the circuit of the silicon layer 871 can be electrically connected to each other without the memory circuit layer 870 therebetween.

Figure 25:
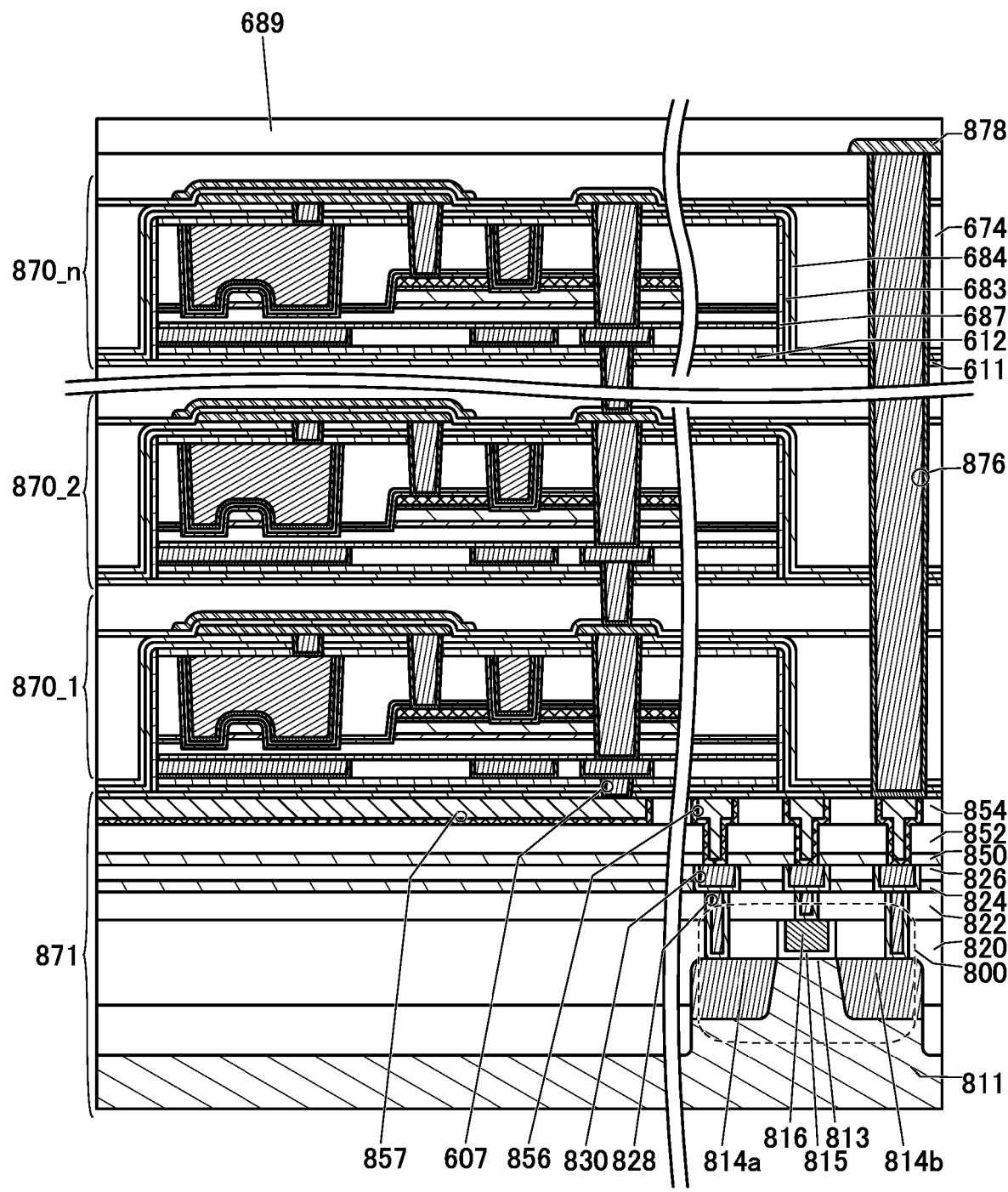
FIG. 25 is a cross-sectional view of a memory device of one embodiment of the present invention.

Although FIG. 24 illustrates the structure in which the memory circuit layer 870_1 to the memory circuit layer 870_n are collectively sealed with the insulator 611, the insulator 612, the insulator 687, the insulator 683, and the insulator 684, the semiconductor device of this embodiment is not limited thereto. For example, as illustrated in FIG. 25, each of the memory circuit layers 870 may be sealed with the insulator 611, the insulator 612, the insulator 687, the insulator 683, and the insulator 684.

This embodiment can be implemented in an appropriate combination with the structures described in the other embodiments and the like.

Embodiment 5

In this embodiment, a structure of an integrated circuit including the components of the semiconductor device 100 described in the above embodiment will be described with reference to FIG. 27 and FIG. 28.

Figure 27:
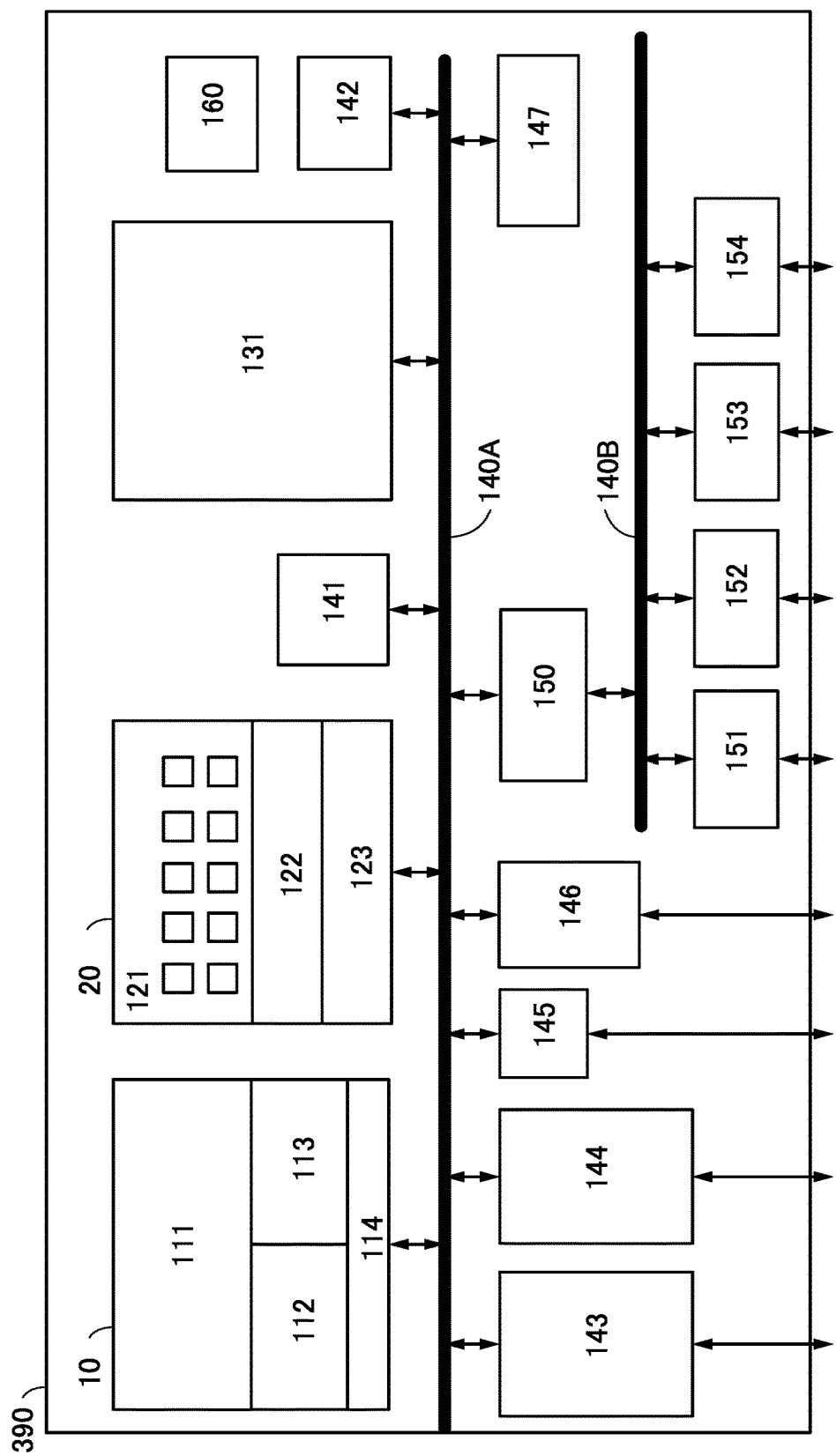
FIG. 27 is a diagram illustrating a structure example of an integrated circuit.

FIG. 27 is an example of a block diagram illustrating the structure example of the integrated circuit including the components of the semiconductor device 100.

An integrated circuit 390 illustrated in FIG. 27 includes the CPU 10, the accelerator 20, an on-chip memory 131, a DMAC (Direct Memory Access Controller) 141, a power supply circuit 160, a power management unit (PMU) 142, a security circuit 147, a memory controller 143, a DDR SDRAM (Double Data Rate Synchronous Dynamic Random Access Memory) controller 144, a USB (Universal Serial Bus) interface circuit 145, a display interface circuit 146, a bridge circuit 150, an interrupt control circuit 151, an interface circuit 152, a battery control circuit 153, and an ADC (Analog-to-digital converter)/DAC (Digital-to-analog converter) interface circuit 154.

The CPU 10 includes a CPU core 111, an instruction cache 112, a data cache 113, and a bus interface circuit 114, for example. The accelerator 20 includes a memory circuit 121, an arithmetic circuit 122, and a control circuit 123.

The CPU core 111 includes a plurality of CPU cores. The instruction cache 112 can have a circuit structure in which an instruction executed by the CPU core 111 is temporarily stored. The data cache 113 can have a circuit structure in which data processed by the CPU core 111 or data obtained by the processing is temporarily stored. The bus interface circuit 114 can have a circuit structure that can transmit and receive signals such as data and an address to and from a bus for connecting the CPU 10 and another circuit in the semiconductor device.

The memory circuit 121 corresponds to a structure including the memory circuit 24 described in Embodiment 1. The memory circuit 121 can have a circuit structure in which data processed by the accelerator 20 is stored. The arithmetic circuit 122 corresponds to a structure including the arithmetic circuit 23 described in Embodiment 1. The arithmetic circuit 122 can have a circuit structure in which arithmetic operation of data retained in the memory circuit 121 is performed. The control circuit 123 can have a circuit structure as illustrated in FIG. 14B, which controls the circuits in the accelerator 20.

A high-speed bus 140A is a bus for transmitting and receiving at high speed various signals between the CPU 10, the accelerator 20, the on-chip memory 131, the DMAC 141, the power management unit 142, the security circuit 147, the memory controller 143, the DDR SDRAM controller 144, the USB interface circuit 145, and the display interface circuit 146. As an example, an AMBA (Advanced Micro-controller Bus Artcitecture)—AHB (Advanced High-performance Bus) can be used as a bus.

The on-chip memory 131 has a circuit structure for storing data or a program that is input into and output from the circuit included in the integrated circuit 390, for example, the CPU 10 or the accelerator 20.

The DMAC 141 is a direct memory access controller. With the DMAC 141, a peripheral device other than the CPU 10 can access the on-chip memory 131 without through the CPU 10.

The power management unit 142 has a circuit structure for controlling power gating of circuits such as the CPU core included in the integrated circuit 390.

The security circuit 147 has a circuit structure for improving confidentiality of signals in such a manner that signals are transmitted and received between the integrated circuit 390 and an external circuit after being encrypted.

The memory controller 143 has a circuit structure for writing or reading out a program to be executed by the CPU 10 or the accelerator 20 from a program memory outside the integrated circuit 390.

The DDR SDRAM controller 144 has a circuit structure for writing or reading out data to or from a main memory, such as a DRAM, outside the integrated circuit 390.

The USB interface circuit 145 has a circuit structure for transmitting and receiving data to and from a circuit outside the integrated circuit 390 through a USB port.

The display interface circuit 146 has a circuit structure for transmitting and receiving data to and from a display device outside the integrated circuit 390.

The power supply circuit 160 is a circuit for generating a voltage used in the integrated circuit 390. For example, it is a circuit that generates a negative voltage supplied to a back gate of an OS transistor for stabilizing electrical characteristics.

A low-speed bus 140B is a bus for transmitting and receiving at low speed various signals between the interrupt control circuit 151, the interface circuit 152, the battery control circuit 153, and the ADC/DAC interface circuit 154. As an example, an AMBA—APB (Advanced Peripheral Bus) can be used as the bus. Transmission and reception of various signals between the high-speed bus 140A and the low-speed bus 140B are performed through the bridge circuit 150.

The interrupt control circuit 151 has a circuit structure for performing interrupt processing in response to a request received from a peripheral device.

The interface circuit 152 has a circuit structure for operating an interface such as a UART (Universal Asynchronous Receiver/Transmitter), an I2C (Inter-Integrated Circuit), or an SPI (Serial Peripheral Interface).

The battery control circuit 153 has a circuit structure for transmitting and receiving data related to charging and discharging of a battery outside the integrated circuit 390.

The ADC/DAC interface circuit 154 has a circuit structure for transmitting and receiving data to and from a device outside the integrated circuit 390 that outputs an analog signal, such as a MEMS (Micro Electro Mechanical Systems) device.

Figure 28A:
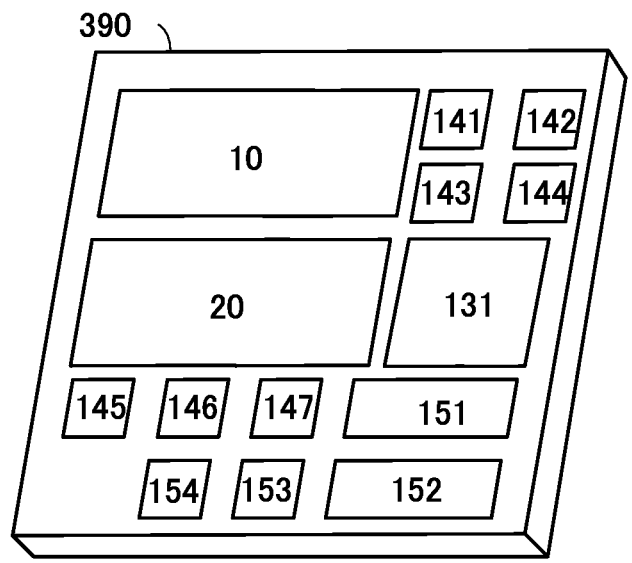
FIG. 28A and FIG. 28B are diagrams each illustrating a structure example of an integrated circuit.
Figure 28B:
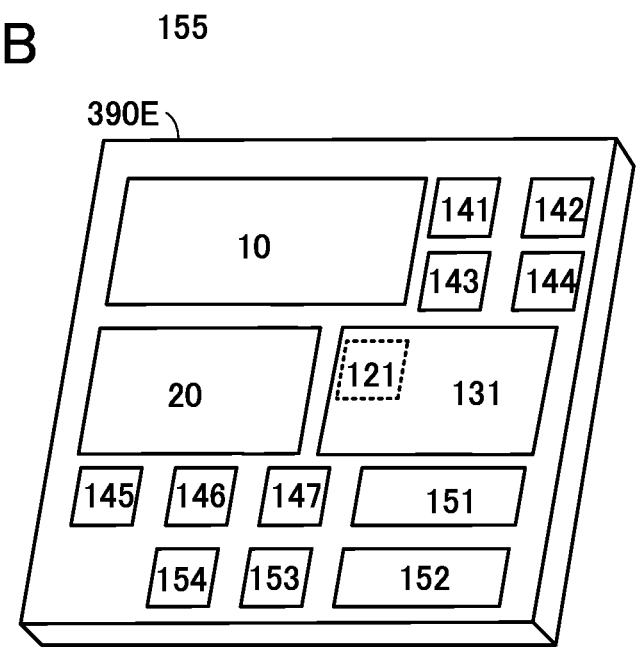

FIG. 28A and FIG. 28B are diagrams each illustrating an arrangement example of the circuit blocks when they are made into an SoC. As in the integrated circuit 390 illustrated in FIG. 28A, the components illustrated in the block diagram of FIG. 27 can be arranged on a chip by being divided into regions.

Note that the on-chip memory 131 illustrated in FIG. 27 can be configured with a memory circuit including an OS memory, for example, a NOSRAM. That is, the on-chip memory 131 and the memory circuit 121 have the same circuit structures. Therefore, when the SoC is made, the on-chip memory 131 and the memory circuit 121 can be arranged in the same region by being integrated as in an integrated circuit 390E illustrated in FIG. 28B.

According to one embodiment of the present invention described above, a novel semiconductor device and electronic device can be provided. Alternatively, according to one embodiment of the present invention, a semiconductor device and an electronic device having low power consumption can be provided. Alternatively, according to one embodiment of the present invention, a semiconductor device and an electronic device capable of suppressing heat generation can be provided.

This embodiment can be combined with the description of the other embodiments as appropriate.

Embodiment 6

In this embodiment, an electronic device, a moving object, and an arithmetic system to which the integrated circuit 390 described in the above embodiment can be applied will be described with reference to FIG. 29A to FIG. 32.

Figure 29B:
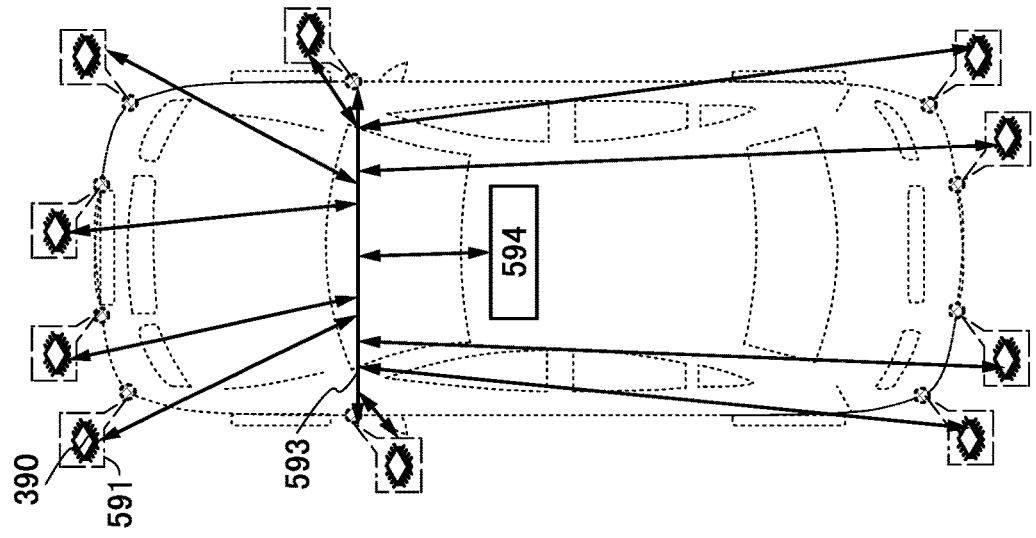
FIG. 29A and FIG. 29B are diagrams illustrating an application example of an integrated circuit.
Figure 29A:
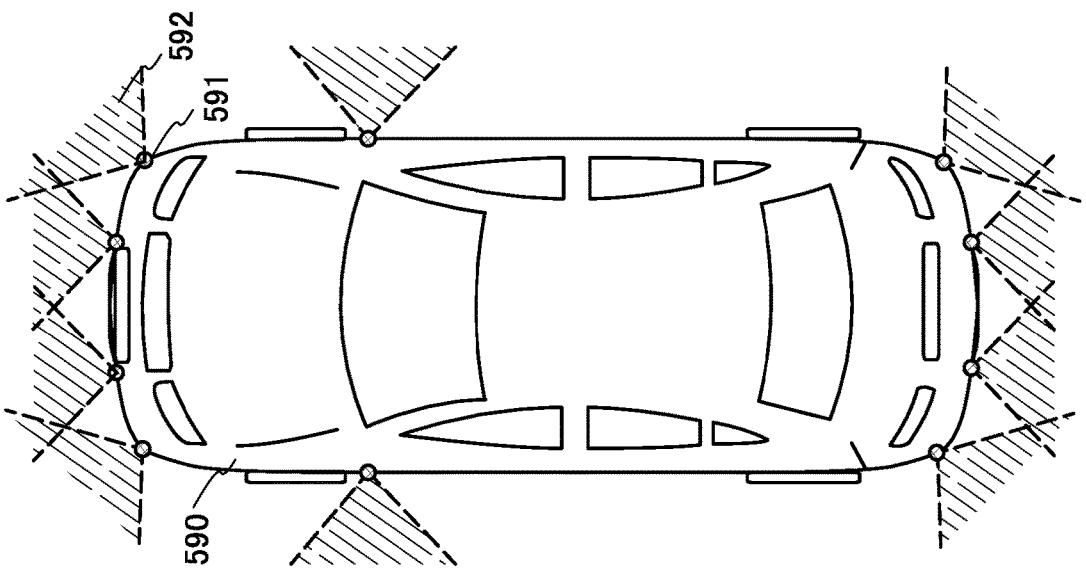

FIG. 29A illustrates an external view of an automobile as an example of a moving object. FIG. 29B is a simplified diagram illustrating data transmission in the automobile. An automobile 590 includes a plurality of cameras 591 and the like. The automobile 590 also includes various sensors such as an infrared radar, a millimeter wave radar, and a laser radar (not illustrated) and the like.

In the automobile 590, the above-described integrated circuit 390 can be used for the camera 591 and the like. The automobile 590 can perform autonomous driving by judging surrounding traffic information such as the presence of a guardrail or a pedestrian in such a manner that the camera 591 processes a plurality of images taken in a plurality of imaging directions 592 with the integrated circuit 390 described in the above embodiment and the plurality of images are analyzed together with a host controller 594 and the like through a bus 593 and the like. The integrated circuit 390 can be used for a system for navigation, risk prediction, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Note that although an automobile is described above as an example of a moving vehicle, the moving vehicle is not limited to an automobile. Examples of moving objects also include a train, a monorail train, a ship, and a flying object (a helicopter, an unmanned aircraft (a drone), an airplane, and a rocket), and these moving objects can include a system utilizing artificial intelligence when equipped with a computer of one embodiment of the present invention.

Figure 30A:
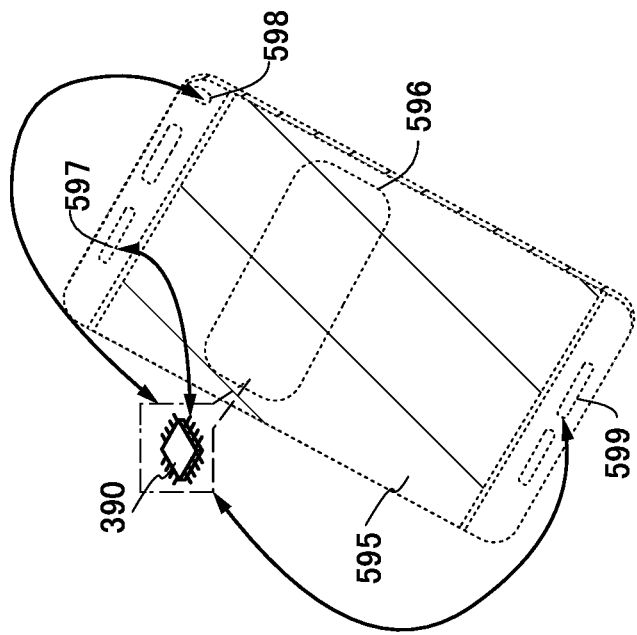
FIG. 30A and FIG. 30B are diagrams illustrating an application example of an integrated circuit.
Figure 30B:
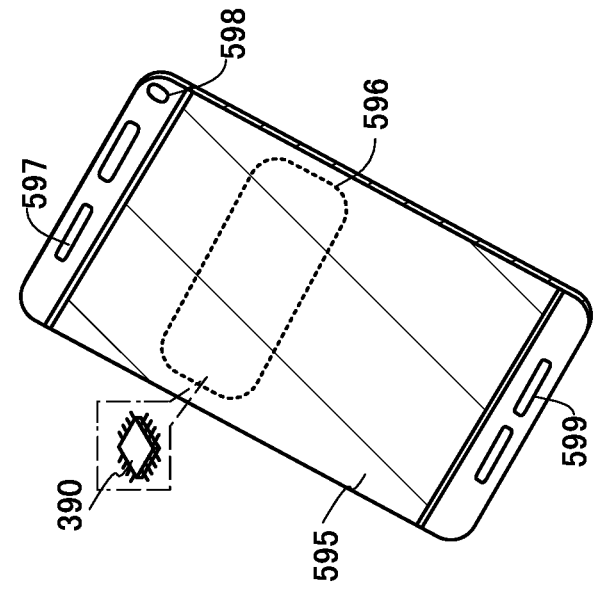

FIG. 30A is an external diagram illustrating an example of a portable electronic device. FIG. 30B is a simplified diagram illustrating data transmission in the portable electronic device. A portable electronic device 595 includes a printed wiring board 596, a speaker 597, a camera 598, a microphone 599, and the like.

In the portable electronic device 595, the printed wiring board 596 can be provided with the above-described integrated circuit 390. The portable electronic device 595 processes and analyzes a plurality of pieces of data obtained from the speaker 597, the camera 598, the microphone 599, and the like with the integrated circuit 390 described in the above embodiment, whereby the user's convenience can be improved. The integrated circuit 390 can be used for a system for voice guidance, image search, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Figure 31A:
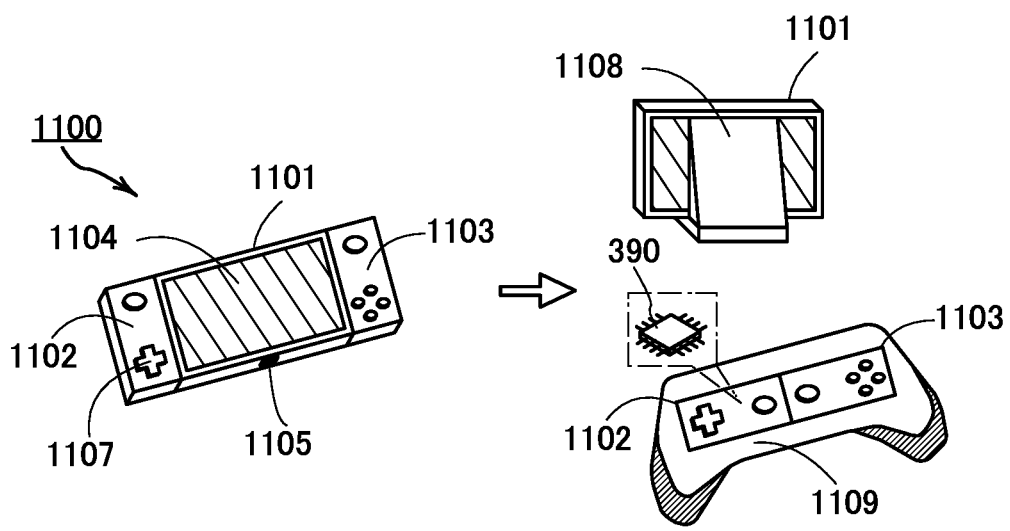
FIG. 31A to FIG. 31C are diagrams each illustrating an application example of an integrated circuit.

A portable game machine 1100 illustrated in FIG. 31A includes a housing 1101, a housing 1102, a housing 1103, a display portion 1104, a connection portion 1105, operation keys 1107, and the like. The housing 1101, the housing 1102, and the housing 1103 can be detached. When the connection portion 1105 provided in the housing 1101 is attached to a housing 1108, an image to be output to the display portion 1104 can be output to another video device. Alternatively, the housing 1102 and the housing 1103 are attached to a housing 1109, whereby the housing 1102 and the housing 1103 are integrated and function as an operation portion. The integrated circuit 390 described in the above embodiment can be incorporated into a chip provided on a substrate in the housing 1102 and the housing 1103, for example.

Figure 31B:
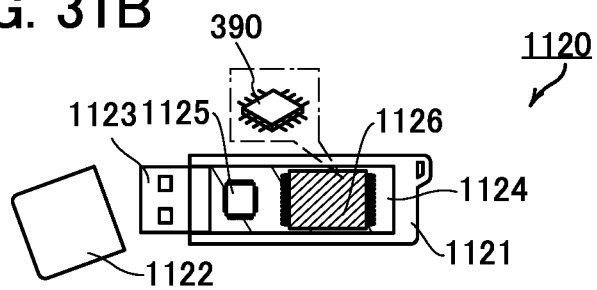

FIG. 31B is a USB connection stick type electronic device 1120. The electronic device 1120 includes a housing 1121, a cap 1122, a USB connector 1123, and a substrate 1124. The substrate 1124 is held in the housing 1121. For example, a memory chip 1125 and a controller chip 1126 are attached to the substrate 1124. The integrated circuit 390 described in the above embodiment can be incorporated into the controller chip 1126 or the like of the substrate 1124.

Figure 31C:
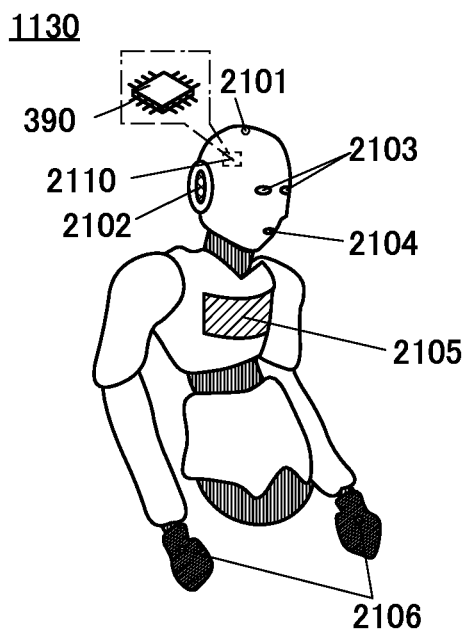

FIG. 31C is a humanoid robot 1130. The robot 1130 includes sensors 2101 to 2106 and a control circuit 2110. For example, the integrated circuit 390 described in the above embodiment can be incorporated into the control circuit 2110.

Figure 32:
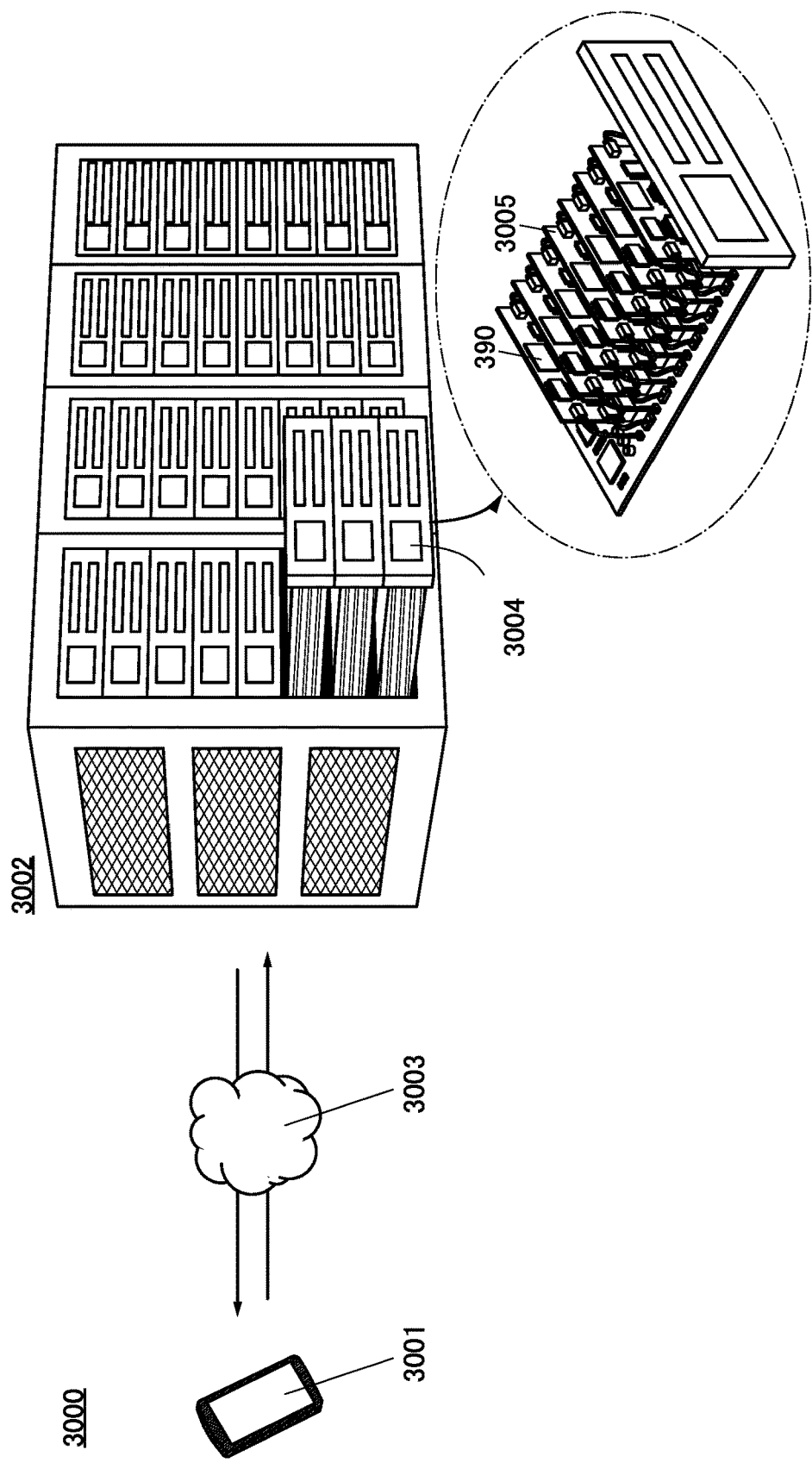
FIG. 32 is a diagram illustrating an application example of an integrated circuit.

The integrated circuit 390 described in the above embodiment can be used for a server that communicates with the electronic devices instead of being incorporated into the electronic devices. In that case, the arithmetic system is configured with the electronic devices and a server. FIG. 32 shows a configuration example of a system 3000.

The system 3000 includes an electronic device 3001 and a server 3002. Communication between the electronic device 3001 and the server 3002 can be performed through Internet connection 3003.

The server 3002 includes a plurality of racks 3004. The plurality of racks are provided with a plurality of substrates 3005, and the integrated circuit 390 described in the above embodiment can be mounted on each of the substrates 3005. Thus, a neural network is configured in the server 3002. The server 3002 can perform arithmetic operation of the neural network using data input from the electronic device 3001 through the Internet connection 3003. The result of the arithmetic operation executed by the server 3002 can be transmitted as needed to the electronic device 3001 through the Internet connection 3003. Accordingly, a burden of the arithmetic operation in the electronic device 3001 can be reduced.

This embodiment can be combined with the description of the other embodiments as appropriate.

(Supplementary Notes on the Description in this Specification and the Like)

The description of the above embodiments and each structure in the embodiments are noted below.

One embodiment of the present invention can be constituted by combining, as appropriate, the structure described in each embodiment with the structures described in the other embodiments and Example. In addition, in the case where a plurality of structure examples are described in one embodiment, the structure examples can be combined as appropriate.

Note that content (or part of the content) described in one embodiment can be applied to, combined with, or replaced with another content (or part of the content) described in the embodiment and/or content (or part of the content) described in another embodiment or other embodiments.

Note that in each embodiment, a content described in the embodiment is a content described with reference to a variety of drawings or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in this specification, and the description can be changed appropriately depending on the situation.

In drawings, the size, the layer thickness, or the region is shown arbitrarily for description convenience. Therefore, they are not limited to the illustrated scale. Note that the drawings are schematically shown for clarity, and embodiments of the present invention are not limited to shapes or values shown in the drawings. For example, variation in signal, voltage, or current due to noise or variation in signal, voltage, or current due to difference in timing can be included.

Furthermore, the positional relationship between components illustrated in the drawings and the like is relative. Therefore, when the components are described with reference to drawings, terms for describing the positional relationship, such as "over" and "under", are sometimes used for convenience. The positional relationship of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate according to circumstances.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, voltage and potential can be replaced with each other as appropriate. The voltage refers to a potential difference from a reference potential, and when the reference potential is a ground voltage, for example, the voltage can be rephrased into the potential. The ground potential does not necessarily mean 0 V. Note that potentials are relative, and the potential supplied to a wiring or the like is changed depending on the reference potential, in some cases.

In this specification and the like, a node can be referred to as a terminal, a wiring, an electrode, a conductive layer, a conductor, an impurity region, or the like depending on a circuit structure, a device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electrical signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electrical signal transmission between A and B through a wiring (or an electrode) or the like, not through the above object. In other words, direct connection refers to connection that can be regarded as the same circuit diagram when indicated as an equivalent circuit.

In this specification and the like, a switch is in a conduction state (on state) or in a non-conduction state (off state) to determine whether current flows or not. Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms "film", "layer", and the like can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

BGL1: wiring, C11: capacitor, CK1: node, D1: node, GCLK1: clock signal, I1: input layer, M1: intermediate layer, M3: intermediate layer, M11: transistor, M12: transistor, M13: transistor, O1: output layer, PSE0: signal, PSE1: signal, PSE2: signal, Q_N: output signal, Q_1: output signal, Q1: node, RBL_N: read bit line, RBL_1: read bit line, RWL_M: read word line, RWL_1: read word line, SLEEP1: signal, SN11: node, SW_N: switch, SW_1: switch, SW1: transistor, t1: time, t2: time, t3: time, t4: time, t5: time, t6: time, t7: time, WBL_1: write bit line, WWL_M: write word line, WWL_1: write word line, 10: CPU, 20: accelerator, 21: arithmetic processing unit, 22: memory unit, 22_N: memory circuit layer, 22_1: memory circuit layer, 22_2: memory circuit layer, 23: arithmetic circuit, 23_N: arithmetic circuit, 23_1: arithmetic circuit, 24: memory circuit, 24_N: memory circuit, 24_P: memory circuit, 24A: memory circuit, 24B: memory circuit, 24C: memory circuit, 24D: memory circuit, 24E: memory circuit, 25: transistor, 25_N: transistor, 25_P: transistor, 25A: transistor, 25B: transistor, 26: transistor, 26_N: transistor, 26_P: transistor, 26B: transistor, 27: transistor, 27_N: transistor, 27_P: transistor, 28: capacitor, 28_N: capacitor, 28_P: capacitor, 28A: capacitor, 28B: capacitor, 29: semiconductor layer, 30: bus, 31: wiring, 32: transistor, 33A: transistor, 33B: transistor, 34: antenna, 35: driver circuit, 36A: insulator, 36B: insulator, 41: readout circuit, 42: bit product-sum operation unit, 43: accumulator, 44: latch circuit, 45: encoding circuit, 46: inverter circuit, 47: logic circuit, 50: neuron, 51: layer, 52: layer, 53: layer, 54: layer, 61: controller, 62: row decoder, 63: word line driver, 64: column decoder, 65: driver, 66: precharge circuit, 67: sense amplifier, 68: selector, 71: input buffer, 72: arithmetic operation control circuit, 76: WA, 100: semiconductor device, 110: driver circuit layer, 111: CPU core, 112: instruction cache, 113: data cache, 114: bus interface circuit, 121: memory circuit, 122: arithmetic circuit, 123: control circuit, 131: on-chip memory, 140A: high-speed bus, 140B: low-speed bus, 141: DMAC, 142: power management unit, 143: memory controller, 144: controller, 145: interface circuit, 146: display interface circuit, 147: security circuit, 150: bridge circuit, 151: control circuit, 152: interface circuit, 153: battery control circuit, 154: interface circuit, 160: power supply circuit, 193: PMU, 200: CPU core, 202: cache memory device, 203: cache memory device, 205: bus interface portion, 210: power switch, 211: power switch, 212: power switch, 214: level shifter, 220: flip-flop, 221: scan flip-flop, 221A: clock buffer circuit, 222: backup circuit, 390: integrated circuit, 390E: integrated circuit, 590: automobile, 591: camera, 592: imaging direction, 593: bus, 594: host controller, 595: portable electronic device, 596: printed wiring board, 597: speaker, 598: camera, 599: microphone, 600: transistor, 605: conductor, 605a: conductor, 605b: conductor, 607: conductor, 611: insulator, 612: insulator, 614: insulator, 615: conductor, 616: insulator, 622: insulator, 624: insulator, 630: oxide, 630a: oxide, 630b: oxide, 630c: oxide, 640: conductor, 640a: conductor, 640b: conductor, 640c: conductor, 640d: conductor, 642: conductor, 642a: conductor, 642b: conductor, 643: oxide, 643a: oxide, 643b: oxide, 646: conductor, 646a: conductor, 646b: conductor, 650: insulator, 655: capacitor, 656: conductor, 657: conductor, 660: conductor, 660a: conductor, 660b: conductor, 672: insulator, 673: insulator, 674: insulator, 680: insulator, 682: insulator, 683: insulator, 684: insulator, 685: insulator, 686:

insulator, 687: insulator, 688: insulator, 689: insulator, 690: transistor, 700: transistor, 705: conductor, 705*a*: conductor, 705*b*: conductor, 715: conductor, 730: oxide, 730*a*: oxide, 730*b*: oxide, 730*c*: oxide, 742: conductor, 742*a*: conductor, 742*b*: conductor, 743: oxide, 743*a*: oxide, 743*b*: oxide, 750: insulator, 760: conductor, 760*a*: conductor, 760*b*: conductor, 790: transistor, 800: transistor, 811: substrate, 813: semiconductor region, 814*a*: low-resistance region, 814*b*: low-resistance region, 815: insulator, 816: conductor, 820: insulator, 822: insulator, 824: insulator, 826: insulator, 828: conductor, 830: conductor, 850: insulator, 852: insulator, 854: insulator, 856: conductor, 857: conductor, 860: memory circuit, 860_1: memory circuit, 860_2: memory circuit, 860_3: memory circuit, 860_4: memory circuit, 860_5: memory circuit, 860_6: memory circuit, 870: memory circuit layer, 870_*n*: memory circuit layer, 870_1: memory circuit layer, 871: silicon layer, 876: conductor, 878: conductor, 1100: portable game machine, 1101: housing, 1102: housing, 1103: housing, 1104: display portion, 1105: connection portion, 1107: operation key, 1108: housing, 1109: housing, 1120: electronic device, 1121: housing, 1122: cap, 1123: USB connector, 1124: substrate, 1125: memory chip, 1126: controller chip, 1130: robot, 2101: sensor, 2106: sensor, 2110: control circuit, 3000: system, 3001: electronic device, 3002: server, 3003: Internet connection, 3004: rack, 3005: substrate, 3210: WA, 7654: WA,

The invention claimed is:

1. A semiconductor device comprising:
a CPU and an accelerator,
wherein the accelerator comprises a first memory circuit, a second memory circuit, and an arithmetic circuit,
wherein the first memory circuit comprises a first transistor,
wherein the second memory circuit comprises a second transistor,
wherein each of the first transistor and the second transistor comprises a semiconductor layer comprising a metal oxide in a channel formation region,
wherein the arithmetic circuit comprises a third transistor,
wherein the third transistor comprises a semiconductor layer comprising silicon in a channel formation region,
wherein the CPU comprises a CPU core comprising a flip-flop provided with a backup circuit,
wherein the backup circuit comprises a fourth transistor,
wherein the fourth transistor comprises a semiconductor layer comprising a metal oxide in a channel formation region,
wherein the first transistor and the second transistor are provided in different layers, and
wherein the layer comprising the first transistor and the layer comprising the second transistor are provided over a layer comprising the third transistor.

2. The semiconductor device according to claim 1, wherein the backup circuit is configured to retain data stored in the flip-flop in a state where supply of a power supply voltage is stopped at the time of power gating of the CPU.

3. The semiconductor device according to claim 1, wherein the first memory circuit and the second memory circuit are configured to retain data input to the arithmetic circuit.

4. The semiconductor device according to claim 1, wherein a circuit configuration of the second memory circuit is different from a circuit configuration of the first memory circuit.

5. A semiconductor device comprising:
a CPU and an accelerator,
wherein the accelerator comprises a first memory circuit, a second memory circuit, and an arithmetic circuit,
wherein the first memory circuit comprises a first transistor,
wherein the second memory circuit comprises a second transistor,
wherein each of the first transistor and the second transistor comprises a semiconductor layer comprising a metal oxide in a channel formation region,
wherein the arithmetic circuit comprises a third transistor,
wherein the third transistor comprises a semiconductor layer comprising silicon in a channel formation region,
wherein the first transistor and the second transistor are provided in different layers,
wherein the layer comprising the first transistor is provided over a layer comprising the third transistor,
wherein the layer comprising the second transistor is provided over the layer comprising the first transistor, and
wherein data retention characteristics of the first memory circuit are different from data retention characteristics of the second memory circuit.

6. The semiconductor device according to claim 5, wherein the first memory circuit is configured to retain data input to the arithmetic circuit or data output from the arithmetic circuit.

7. The semiconductor device according to claim 5, wherein an amplitude voltage for driving the first transistor is lower than an amplitude voltage for driving the second transistor.

8. The semiconductor device according to claim 5, wherein a thickness of a gate insulating film of the first transistor is smaller than a thickness of a gate insulating film of the second transistor.

9. The semiconductor device according to claim 5, wherein a circuit configuration of the second memory circuit is different from a circuit configuration of the first memory circuit.

10. The semiconductor device according to claim 1, wherein the arithmetic circuit is configured to perform product-sum operation.

11. The semiconductor device according to claim 1, wherein the metal oxide comprises In, Ga, and Zn.

12. The semiconductor device according to claim 5, wherein the arithmetic circuit is configured to perform product-sum operation.

13. The semiconductor device according to claim 5, wherein the metal oxide comprises In, Ga, and Zn.

* * * * *